US009372306B1

(12) United States Patent
Nagarajan et al.

(10) Patent No.: US 9,372,306 B1
(45) Date of Patent: Jun. 21, 2016

(54) METHOD OF ACHIEVING ACCEPTABLE PERFORMANCE IN AND FABRICATION OF A MONOLITHIC PHOTONIC INTEGRATED CIRCUIT (PIC) WITH INTEGRATED ARRAYS OF LASER SOURCES AND MODULATORS EMPLOYING AN EXTENDED IDENTICAL ACTIVE LAYER (EIAL)

(75) Inventors: Radhakrishnan L. Nagarajan, Cupertino, CA (US); Fred A. Kish, Jr., Palo Alto, CA (US); Masaki Kato, Sunnyvale, CA (US); Charles H. Joyner, Sunnyvale, CA (US); David F. Welch, Menlo Park, CA (US); Randal A. Salvatore, Mountain View, CA (US); Richard P. Schneider, Mt. View, CA (US); Mehrdad Ziari, Pleasanton, CA (US); Damien Jean Henri Lambert, Sunnyvale, CA (US); Sheila K. Hurtt, Redwood City, CA (US); Andrew G. Dentai, Mountain View, CA (US); Atul Mathur, Santa Clara, CA (US); Vincent G. Dominic, Fremont, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 11/045,827

(22) Filed: Jan. 27, 2005

Related U.S. Application Data

(63) Continuation-in-part of application No. 10/267,331, filed on Oct. 8, 2002, now Pat. No. 7,283,694, and a continuation-in-part of application No. 10/267,330, filed on Oct. 8, 2002, now Pat. No. 7,079,715, and a
(Continued)

(51) Int. Cl.
*G02B 6/12* (2006.01)

(52) U.S. Cl.
CPC .................. *G02B 6/12009* (2013.01)

(58) Field of Classification Search
CPC .................................... G02B 6/12009
USPC ........ 385/14; 372/26, 20, 32, 50; 398/1, 9, 91
See application file for complete search history.

(56) References Cited

U.S. PATENT DOCUMENTS

| 4,722,092 A | 1/1988 | Liau et al. |
| 4,875,216 A | 10/1989 | Thornton et al. |

(Continued)

FOREIGN PATENT DOCUMENTS

| WO | WO 01/88993 A2 | 11/2001 |
| WO | WO 03/085742 A1 | 10/2003 |
| WO | WO 2004/095662 A2 | 11/2004 |

OTHER PUBLICATIONS

Ramdane, A., et al., "Monolithic Integration of InGaAsP-InP Strained-layer Distributed Feedback Laser and External Modulator by Selective Quantum-Well Interdiffusion," IEEE Photonics Technology Letters 7(1995) Sep., No. 9, pp. 1016-1018.*
(Continued)

*Primary Examiner* — Charlie Y Peng
(74) *Attorney, Agent, or Firm* — W. Douglas Carothers, Jr.; Ross M. Carothers; David L. Soltz

(57) ABSTRACT

A method provides acceptable performance from a semiconductor transmitter photonic integrated circuit (TxPIC) that contains a plurality of modulated sources each comprising a laser source and an external modulator where each laser source provides a different emission wavelength and each modulated source forms a separate signal channel, comprising the steps of providing at least some of the signal channels with an extended identical active layer (EIAL) so that the modulated sources each have an identical active region wavelength and detuning the laser emission wavelength in each laser source within the EIAL from the laser active region wavelength.

54 Claims, 15 Drawing Sheets

Related U.S. Application Data continuation-in-part of application No. 10/267,346, filed on Oct. 8, 2002, now Pat. No. 7,058,246, application No. 11/045,827, which is a continuation-in-part of application No. 10/317,935, filed on Dec. 11, 2002, which is a continuation-in-part of application No. 10/267,331, filed on Oct. 8, 2002, now Pat. No. 7,283,694.

(60) Provisional application No. 60/539,443, filed on Jan. 27, 2004, provisional application No. 60/328,207, filed on Oct. 9, 2001, provisional application No. 60/328,332, filed on Oct. 9, 2001, provisional application No. 60/370,345, filed on Apr. 5, 2002, provisional application No. 60/378,010, filed on May 10, 2002, provisional application No. 60/392,494, filed on Jun. 28, 2002, provisional application No. 60/367,595, filed on Mar. 25, 2002.

(56) References Cited

U.S. PATENT DOCUMENTS

| | | | |
|---|---|---|---|
| 5,208,824 A | 5/1993 | Tsang | |
| 5,548,607 A | 8/1996 | Tsang | |
| 5,680,411 A | 10/1997 | Ramdane et al. | |
| 5,805,755 A | 9/1998 | Amersfoort et al. | |
| 5,936,994 A | 8/1999 | Hong et al. | |
| 5,953,361 A | 9/1999 | Borchert et al. | |
| 5,960,257 A | 9/1999 | Ishino et al. | |
| 5,982,804 A | 11/1999 | Chen et al. | |
| 6,066,859 A | 5/2000 | Stegmueller | |
| 6,075,802 A | 6/2000 | Stolz et al. | |
| 6,101,204 A | 8/2000 | Johnston, Jr. | |
| 6,122,306 A * | 9/2000 | Sartorius et al. | 372/96 |
| 6,148,017 A | 11/2000 | Borchert et al. | |
| 6,151,351 A | 11/2000 | Kito et al. | |
| 6,252,895 B1 | 6/2001 | Nitta et al. | |
| 6,256,330 B1 | 7/2001 | LaComb | |
| 6,282,361 B1 | 8/2001 | Nishimura et al. | |
| 6,288,410 B1 * | 9/2001 | Miyazawa | 257/14 |
| 6,291,256 B1 | 9/2001 | Chen et al. | |
| 6,301,283 B1 | 10/2001 | Chen et al. | |
| 6,356,692 B1 * | 3/2002 | Ido et al. | 385/129 |
| 6,365,428 B1 | 4/2002 | Zubrzycki et al. | |
| 6,459,716 B1 | 10/2002 | Lo et al. | |
| 6,477,194 B1 | 11/2002 | Eng et al. | |
| 6,500,687 B2 | 12/2002 | Takei et al. | |
| 6,542,286 B2 | 4/2003 | Kuwatsuka | |
| 6,560,260 B1 | 5/2003 | Ohkubo et al. | |
| 6,573,116 B2 | 6/2003 | Watanabe et al. | |
| 6,574,260 B2 | 6/2003 | Salvatore et al. | |
| 6,606,443 B2 | 8/2003 | Sato et al. | |
| 6,611,007 B2 | 8/2003 | Thompson et al. | |
| 6,614,819 B1 | 9/2003 | Fish et al. | |
| 6,617,188 B2 | 9/2003 | Ooi et al. | |
| 6,624,000 B1 | 9/2003 | Coldren | |
| 6,628,690 B1 | 9/2003 | Fish et al. | |
| 6,646,775 B2 | 11/2003 | Ishizaka | |
| 6,650,266 B1 | 11/2003 | Tester | |
| 6,678,479 B1 | 1/2004 | Naoe et al. | |
| 6,743,648 B2 | 6/2004 | Kise et al. | |
| 7,035,305 B2 * | 4/2006 | Adams et al. | 372/50.1 |
| 2002/0131466 A1 | 9/2002 | Salvatore et al. | |
| 2002/0158266 A1 | 10/2002 | Sato et al. | |
| 2002/0176144 A1 | 11/2002 | Bergano et al. | |
| 2003/0002557 A1 | 1/2003 | Eng et al. | |
| 2003/0035449 A1 | 2/2003 | Tomlinson et al. | |
| 2003/0047738 A1 | 3/2003 | Funabashi et al. | |
| 2003/0198451 A1 | 10/2003 | Akulova et al. | |
| 2004/0264516 A1 | 12/2004 | Mallecot et al. | |

OTHER PUBLICATIONS

U.S. Appl. No. 10/045,462, filed Jan. 27, 2005, Nagarajan et al.
Salavatore et al., "Reduction in Reflection-Induced Chirp From Photonic Integrated Sources", IEEE Photonics Technology Letters, vol. 14(12), pp. 1662-1664, Dec. 2002.
Ramdane et al., "Monolithic Integration of InGaAsP-InP Strained-. . . Quantum Well Interdiffusion", IEEE Photonics Technology Letters, vol. 7(9), pp. 1016-1018, Sep. 1995.
Young et al., "A 16 X 1 Wavelength . . . Electroabsorption Modulators", IEEE Photonics Technology Letters, vol. 5(8), pp. 908-910, Aug. 1993.
den Besten et al., "An Integrated Coupled-Cavity 16-Wavelength Digitally Tunable Laser", IEEE Photonics Technology Letters, vol. 14(12), Dec. 2002.
M. G. Young et al., "Six Wavelength Laser Array With Integrated Amplifier and Modulator", Electronic Letters, vol. 32(21), pp. 1835-1836, Oct. 12, 1995.
Joyner et al., "An 8-Channel Digitally Tunable Transmitter . . . Output by Selective-Area Epitaxy", IEEE Photonics Technology Letters, vol. 7(9), pp. 1013-1015, Sep. 1995.
Doerr et al., "Wavelength Selctable Laser with . . . Single-Mode Stability", IEEE Photonics Technology Letters, vol. 9(11), pp. 1430-1432, Nov. 1997.
Ryu et al., "Asymmetric Sampled . . . Multiwavelength WDM Source", IEEE Photonics Technology Letters, vol. 14(12), pp. 1656-1658, Dec. 2002.
Soole et al., "Wavelength-Selectable Laser . . . Cavity Laser", Applied Physics Letters, vol. 61(23), pp. 2750-2752, Dec. 7, 1992.
Ishizaka et al., "The Transmission Capability of . . . Chirp Reduction Technique", IEEE Photonics Technology Letters, vol. 9(12), pp. 1628-1630, Dec. 1997.
Lee et al., "Multiwavelength DFB Laser . . . Network Testbed", Journal of Lightwave Technology, vol. 14(6), pp. 967-976, Jun. 1996.
Steinmann et al., Improved Behavior of Monolithically . . . Layer Structure, IEEE Photonics Technology Letters, vol. 9(12), pp. 1561-1563, Dec. 1997.
Suzaki et al., "Multi-Channel Modulation . . . Circuit", 14th Indium Phosphide and Related Materials Conference, Conference Proceedings, May 12-16, 2002 Stockholm, Sweden.
Moerman et al., "A Review on Fabrication . . . Semiconductor Devices", IEEE Journal of Selected Topics in Quantum Electronics, vol. 3(6), pp. 1308-1320, Dec. 1997.
Yoshikuni, "Semiconductor Arrayed Waveguide . . . Integrated Devices", Selected Topics in Quantum Electronics, vol. 8(6), pp. 1102-1114, Nov./Dec. 2002.
Watanabe et al., "Transmission Performance . . . Optical Amplifier", Journal of Lightwave Technology, vol. 18(8), pp. 1069-1077, Aug. 2000.
Sun et al., "Influence of Wavelength Detuning . . . Epitaxial Layer Approach", IEICE Trans. Electron., vol. E84-C(5), pp. 656-659, May 2001.
Skogen et al., "A Quantum-Well-Intermixing . . . Integrated Circuits", IEEE Journal of Selected Tpoics in Quantum Elelctronics, vol. 8(4), pp. 863-869, Jul./Aug. 2002.
Ketelsen et al., "Multiwavelength DFB Laser Array..Spot Size Converters", Selected Topics in Quantum Electronics, vol. 36(6), pp. 641-648, Jun. 2000.
Kudo et al., "The Optical Gain Coupling Saturation . . . DFB Lasers", IEEE Photonics Technology Letters, vol. 6(4), pp. 482-485, Apr. 1994.
Kudo et al., "Reduction of Effective..Coupling Coefficients", IEEE Photonics Technology Letters, vol. 4(6), pp. 531-534, Jun. 1992.
Wang et al., "Low-Chirp . . . DFB Laser", IEEE Photonics Technology Letters, vol. 8(3), pp. 331-333, Mar. 1996.
Ramdane et al., "Integrated MQW Laser-Modulator . . . Negative Chirp", Proceedings of 21ST Eur. Conf. on Opt. Comm. (ECOC '95 Brussels), Th.B.2.2, pp. 893-896, 1995.
Miyazawa et al., "Integrated External-Cavity . . . Disordering", IEEE Photonics Technology Letters, vol. 3(5), pp. 421-423, May 1991.
Zah et al., "1.5 µm Compressive-Strained . . . Laser Arrays", Electronics Letters, vol. 28(9), pp. 824-826, Apr. 23, 1992.
Ramdane et al., "Monolithic Integration . . . High-Speed Transmission", IEEE Journal of Selected Topics in Quantum Electronics, vol. 2(2), pp. 326-335, Jun. 1996.

(56) References Cited

OTHER PUBLICATIONS

Kuindersma et al., "Packaged, Integrated DFB/EA-MOD . . . Standard Fibre", Electronics Letters, vol. 29(21), pp. 1876-1878, Oct. 14, 1993.

Aoki et al., "Noval Structure . . . Selective Arae MOCVD Growth", Electronics Letters, vol. 27(23), pp. 2138-2140, Nov. 7, 1991.

Kudo et al., "1.5 µm Waveelngth-Selectable . . . EA-Modulator", IEEE Photonics Technology Letters, vol. 12(3), pp. 242-244, Mar. 2000.

Fells et al., "Controlling the Chirp in Electroabsorption Modulators Under Digital Modulation", Electronics Letters, vol. 30(24), pp. 2066-2067, Nov. 24, 1994.

Whalen et al., "Variation of Frequency Chirp with Wavelength . . . Modulator", IEEE Photonics Technology Letters, vol. 3(5), pp. 451-452, May 1991.

LePallec et al., "New Integrated Buried Laser-Ridge . . . Identical Active Layer", IEEE Photonics Technology Letters, vol. 15(3), pp. 362-364.

Stegmueller et al., "1.55 µm and 1.3 µm DFB Lasers . . . Transmission Systems", Digest SODC 2002, Stuttgart, Germany, pp. 95-99, Mar. 10-16, 2002.

Steinmann et al., "Asymmetric Quantum Wells . . . Integrated Laser/Modulator", IEEE Photonics Technology Letters, vol. 9(2), pp. 191-193, Feb. 1997.

Zah et al., "High Power . . . Optical Amplifier", Proceedings of the 15TH International Semiconductor Laser Conference, Haifa, Iarael, 1996, pp. 131-132, Oct. 13-18, 1996.

Zah et al., "Multiwavelength DFB Laser Arrays for Optical Network Testbeds", Processing of 22ND European Conference on Optical Communication—ECOC '96, Oslo, Norway, 1996.

Amersfoot et al., "Performance Study of a 10-Wavelength . . . Modulators", IEEE Annual Meeting of Lasers and Electro-Optics Society 1996, (LEOS '96), pp. 335-336, Nov. 18-21, 1996.

Debregeas-Sillard et., "Low-Cost Coolerless . . . Transmission at 1.55 mm", Electronic letters, vol. 40(21), pp. , Oct. 14, 2004.

Office Actions dated Sep. 6, 2013, Apr. 10, 2014, and Apr. 20, 2015 in U.S. Appl. No. 11/045,464.

\* cited by examiner

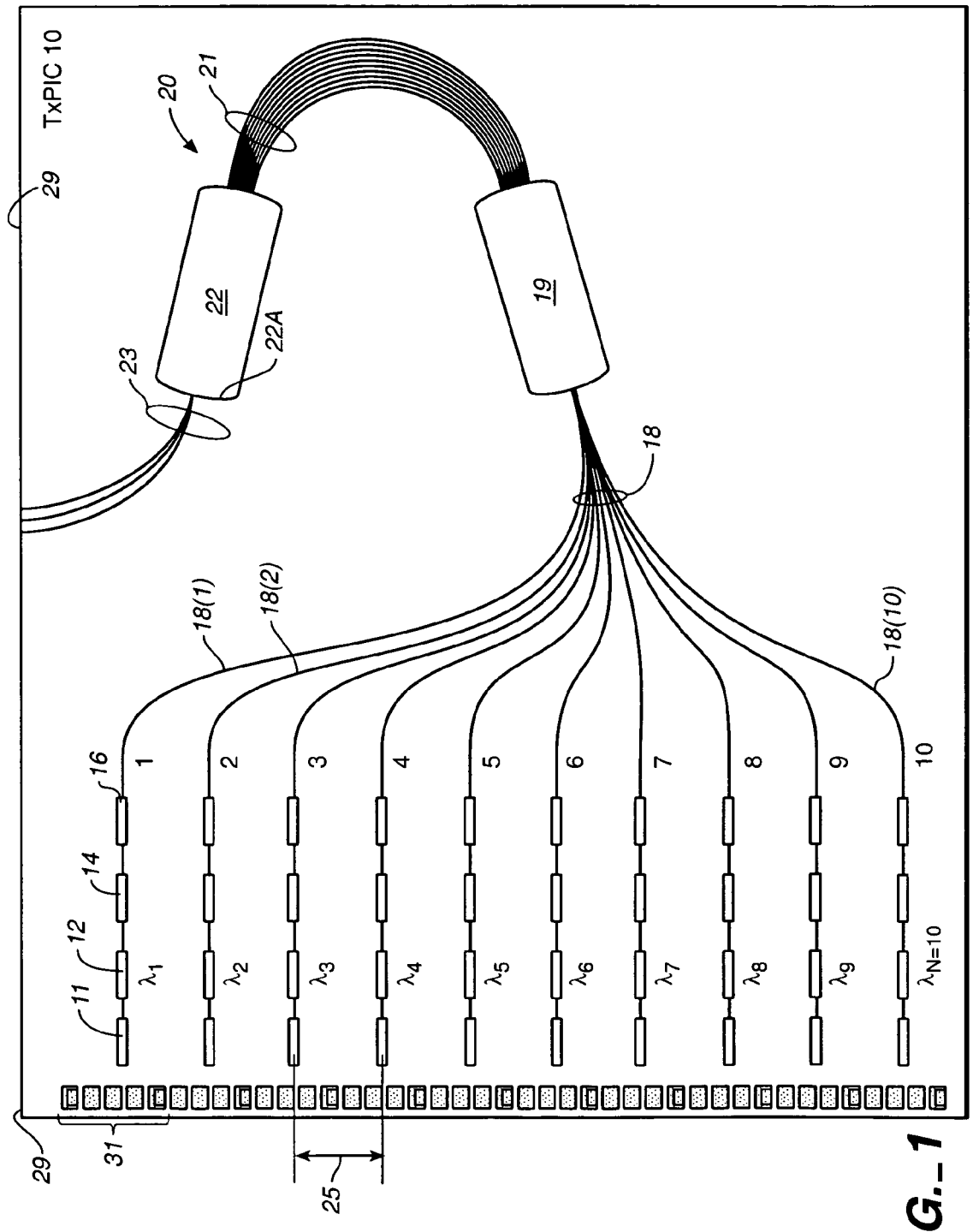
FIG._1

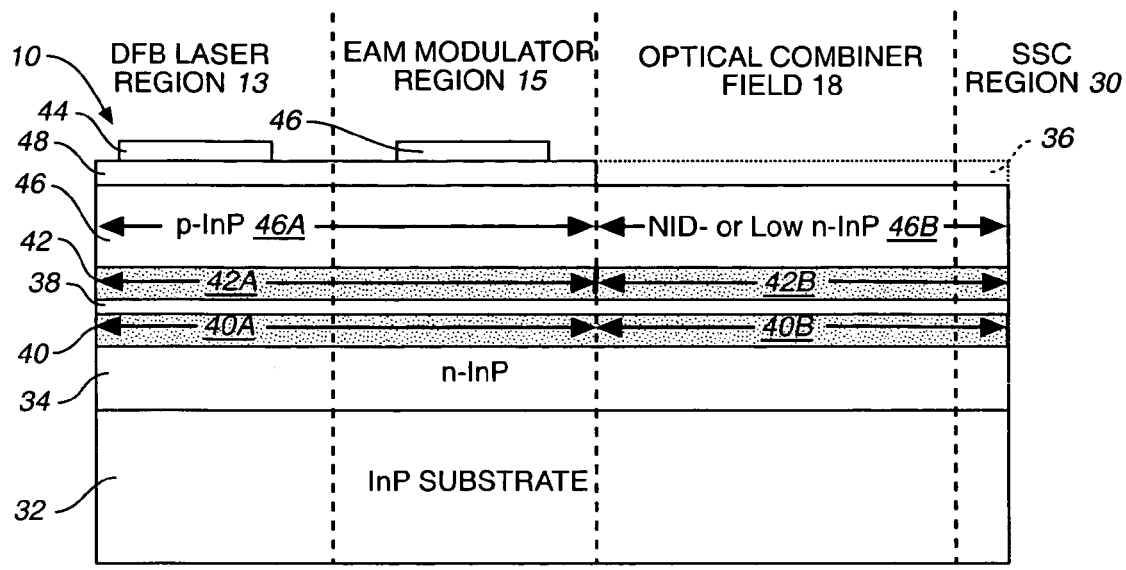
*FIG._2A*
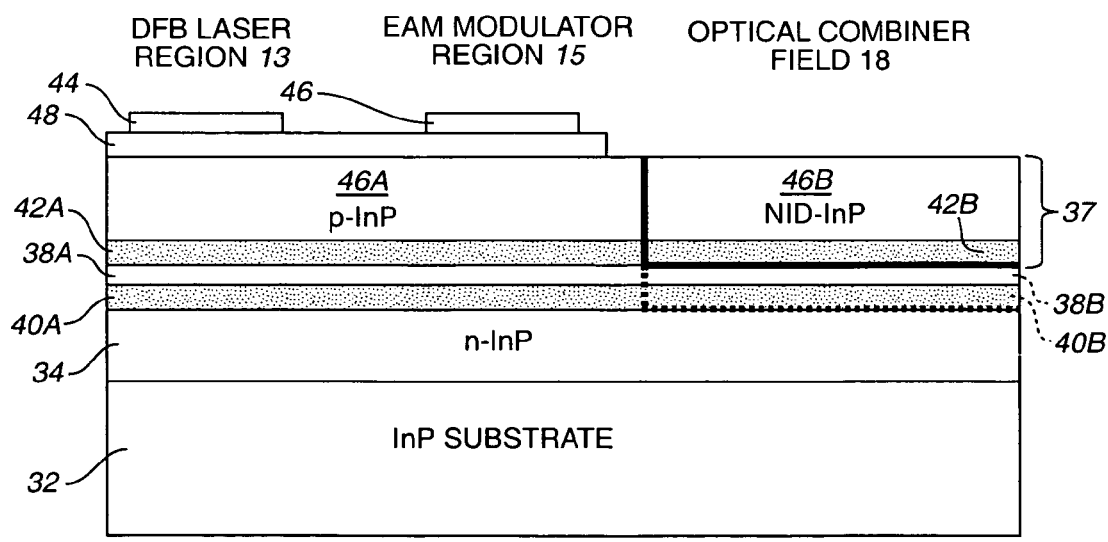
*FIG._2B*

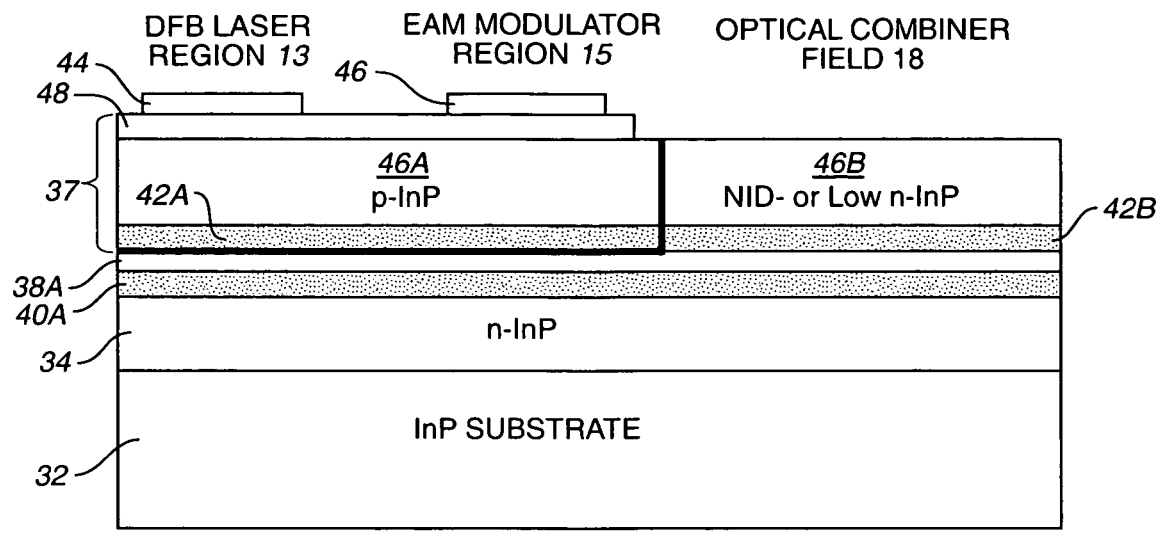
FIG._2C
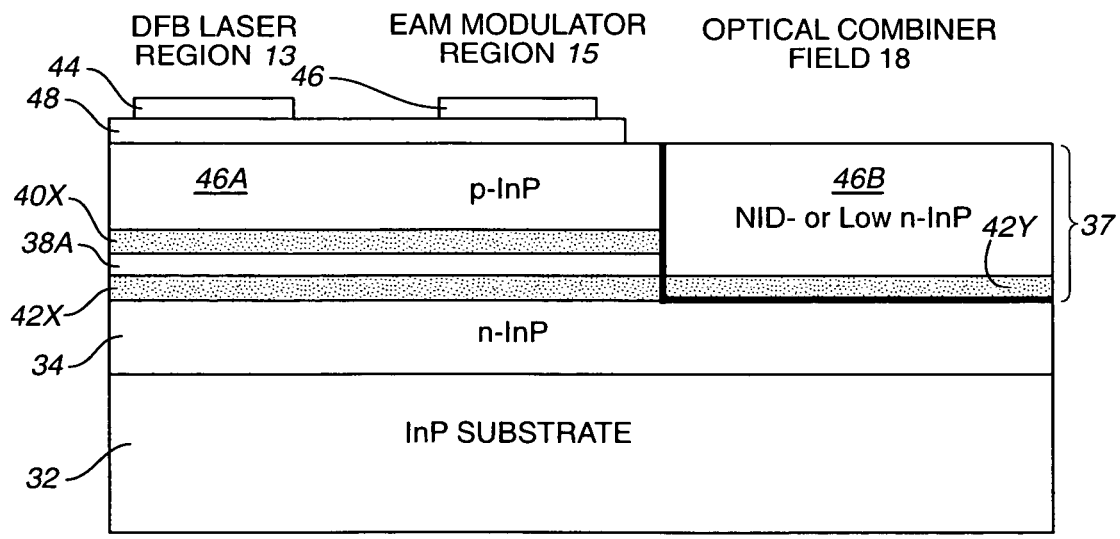
FIG._2D

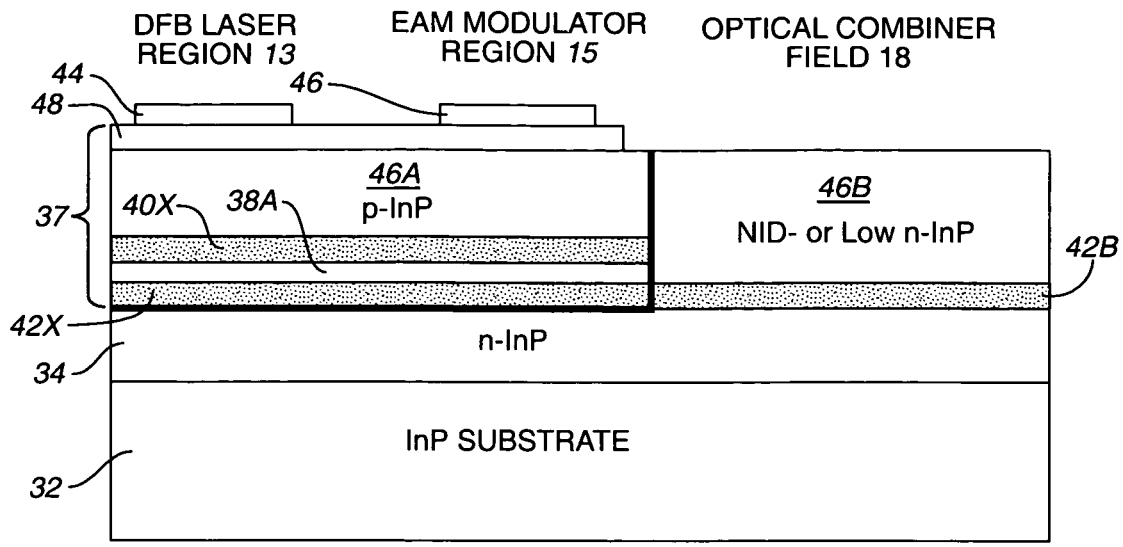
FIG.–2E
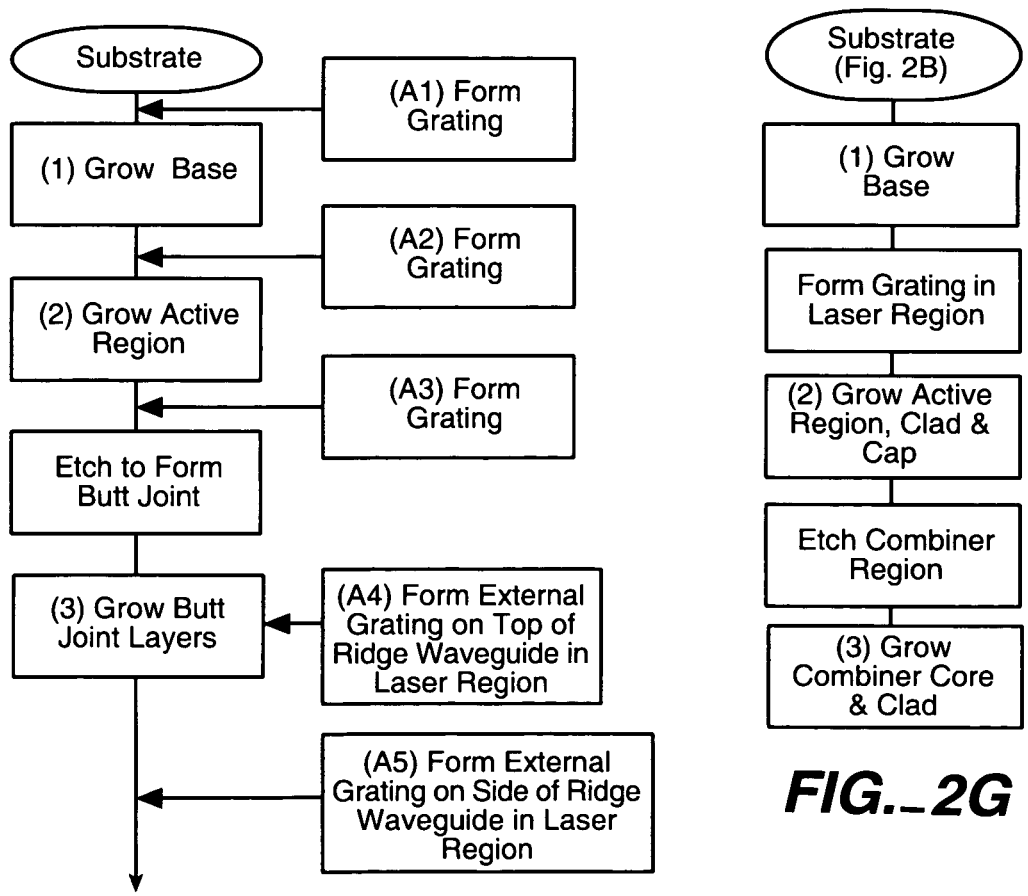
FIG.–2F
FIG.–2G

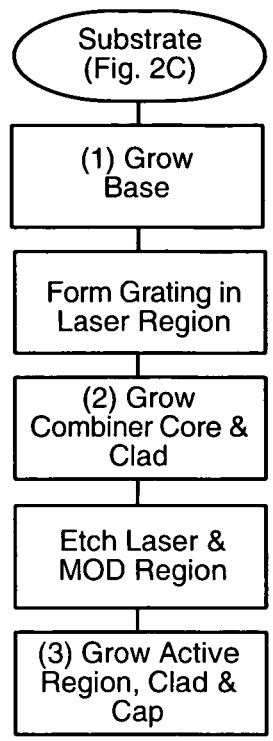
*FIG._2H*
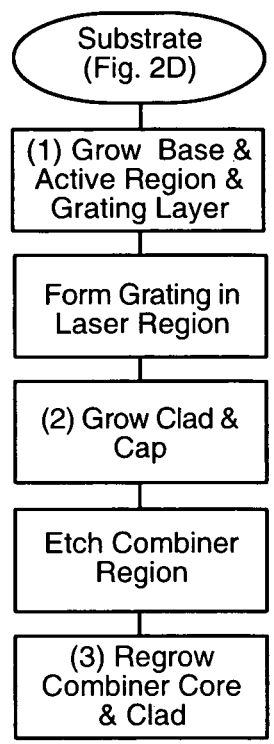
*FIG._2I*
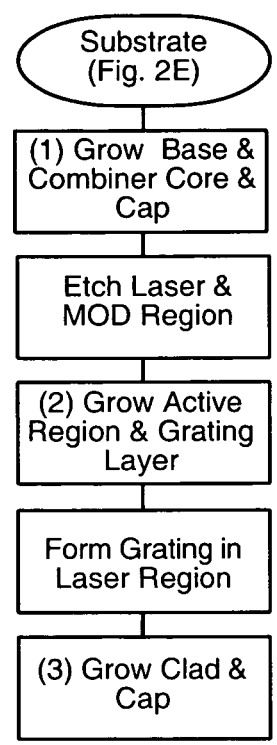
*FIG._2J*
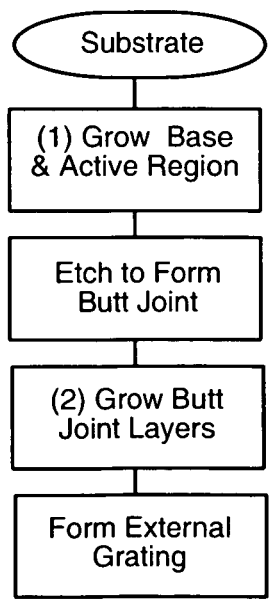
*FIG._2K*
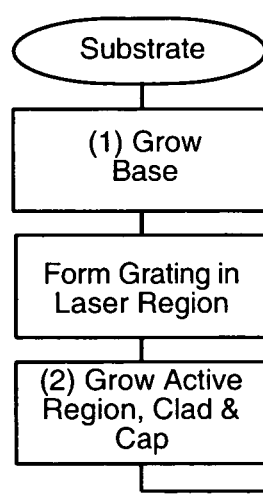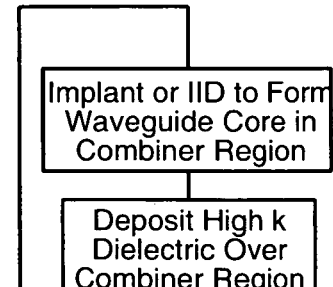
*FIG._2L*

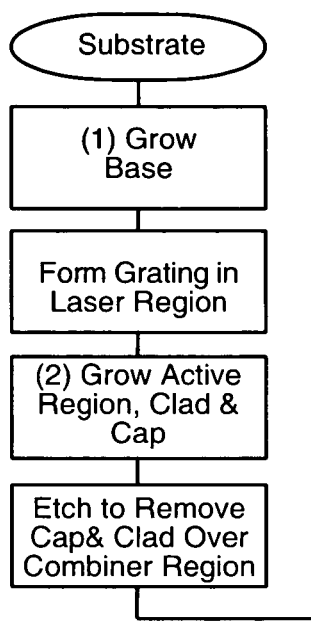
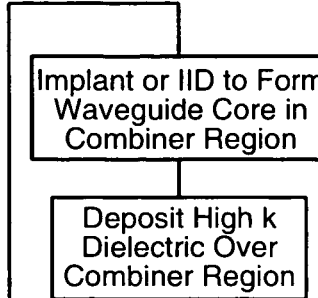
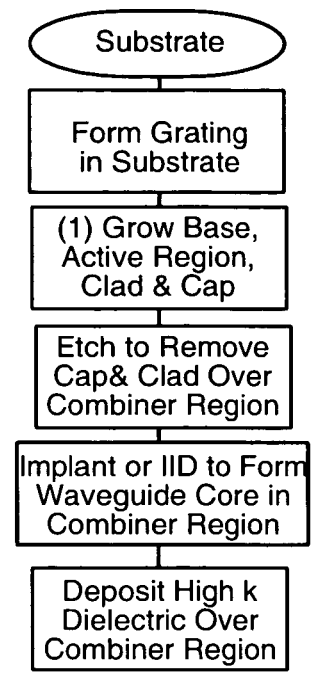
FIG._2M
FIG._2N
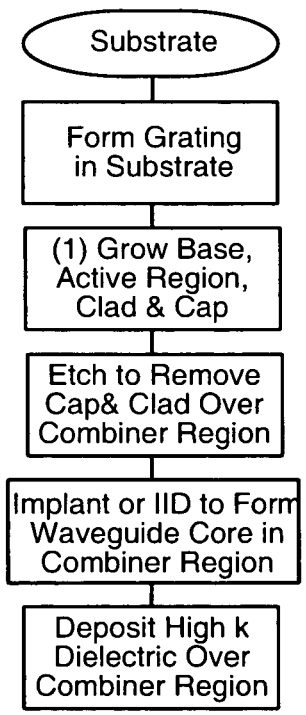
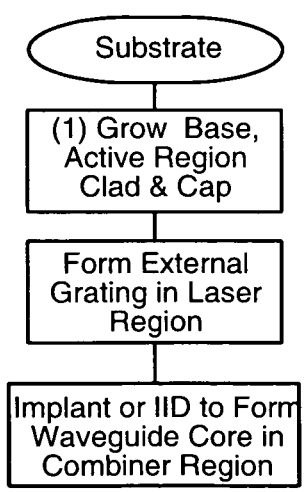
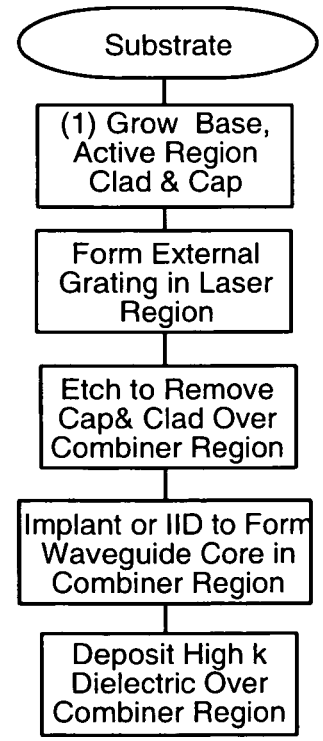
FIG._2O
FIG._2P
FIG._2Q

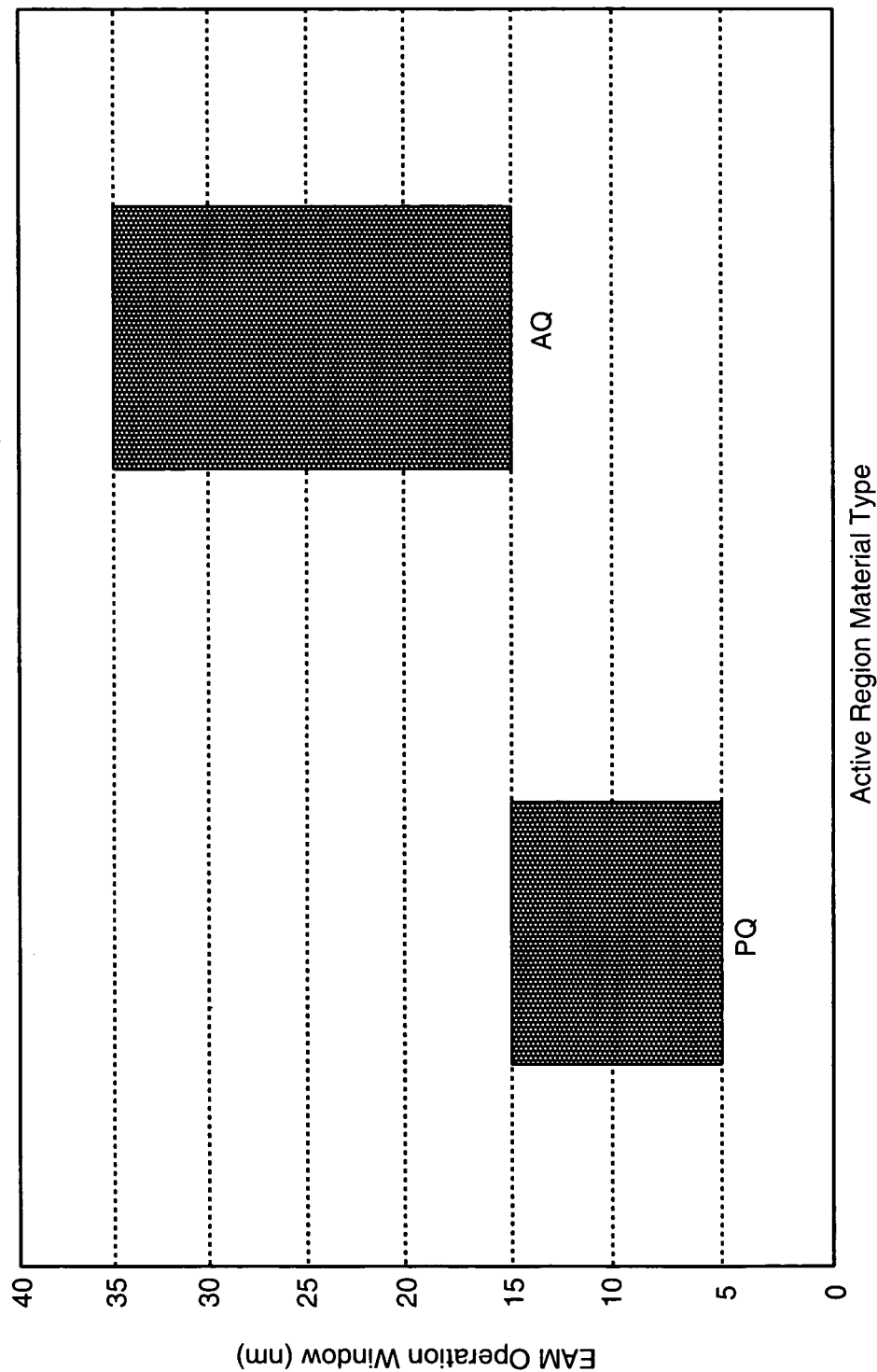
FIG._3

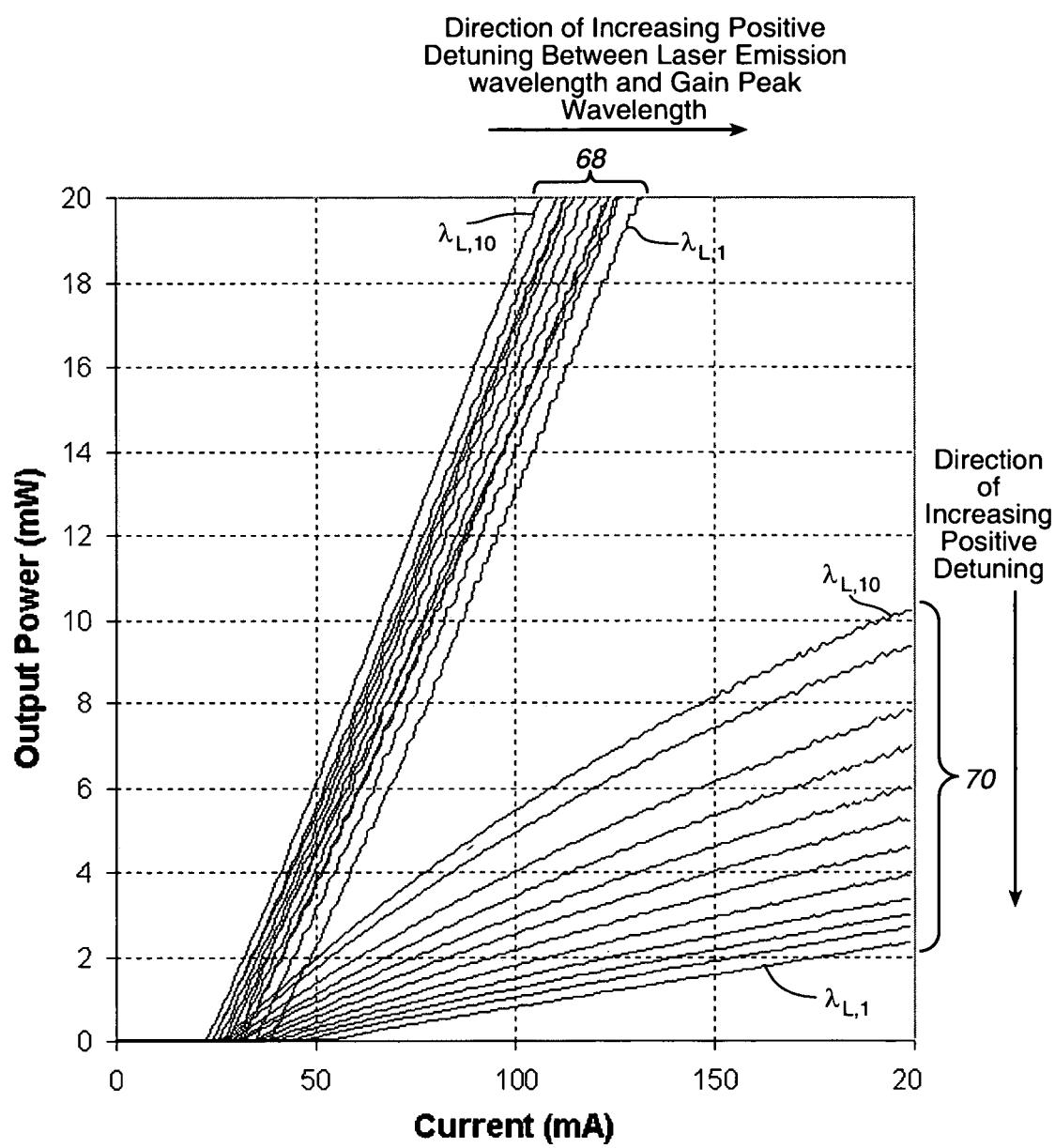
FIG._4

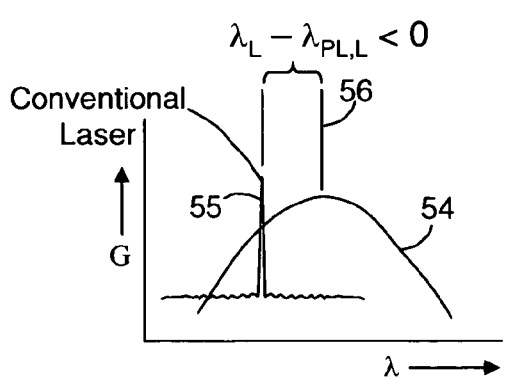
**FIG._5
PRIOR ART**
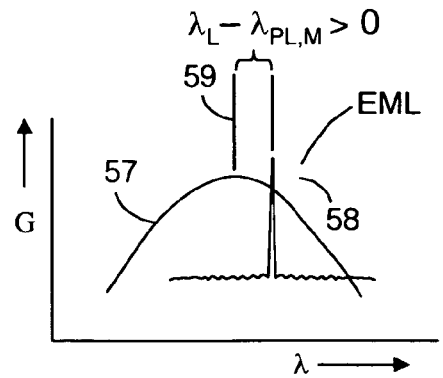
**FIG._6
PRIOR ART**
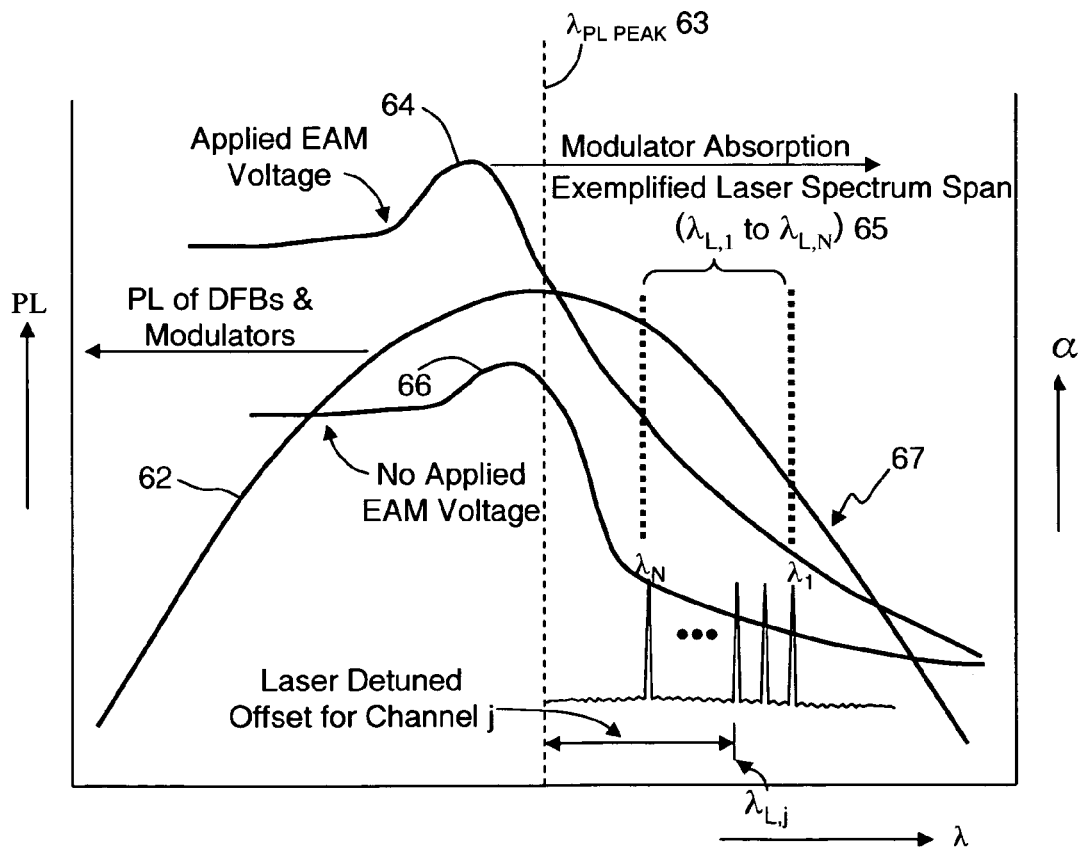
FIG.-7

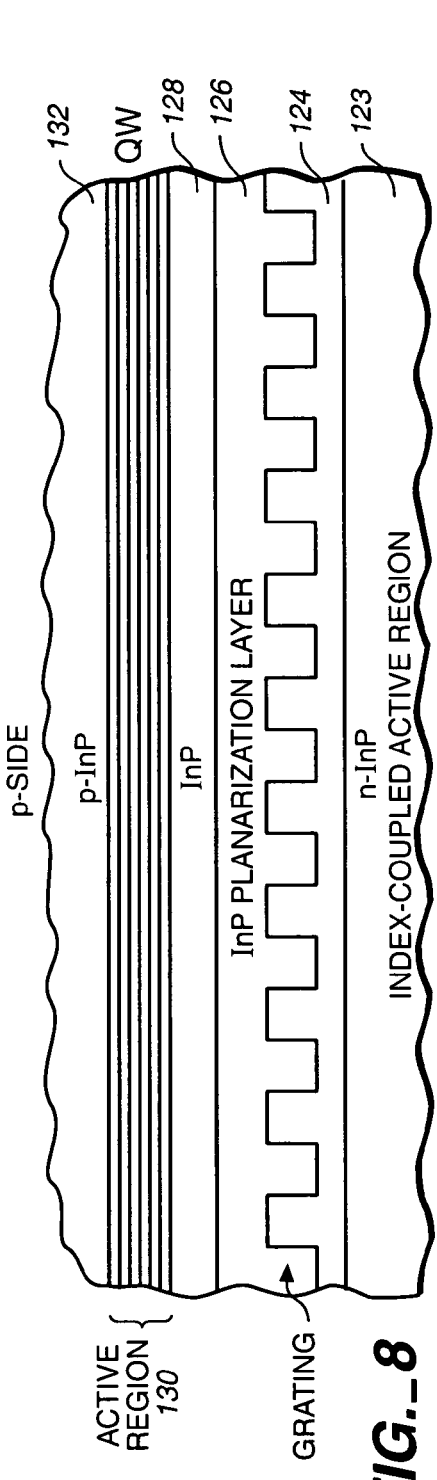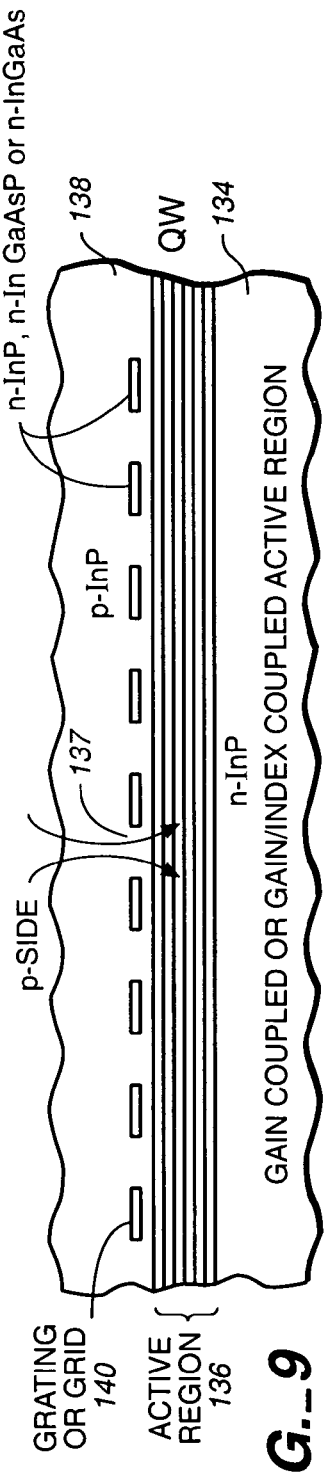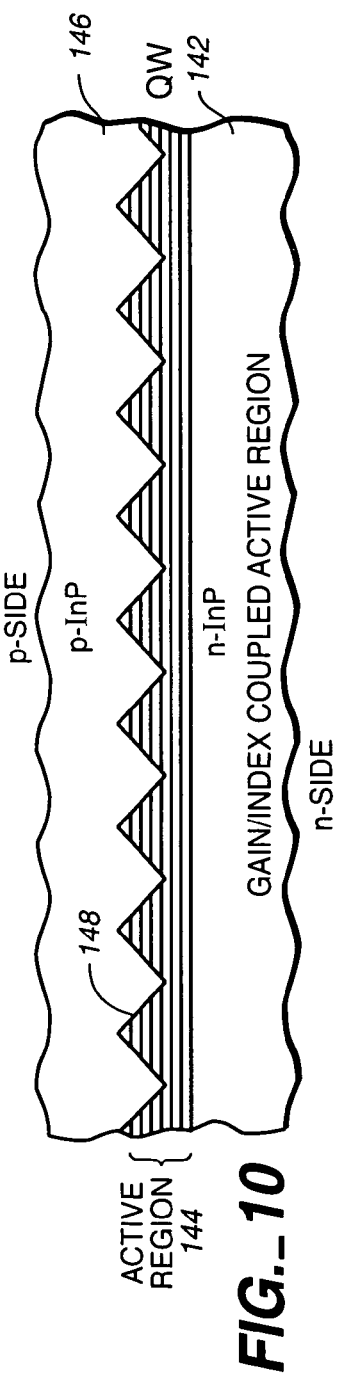

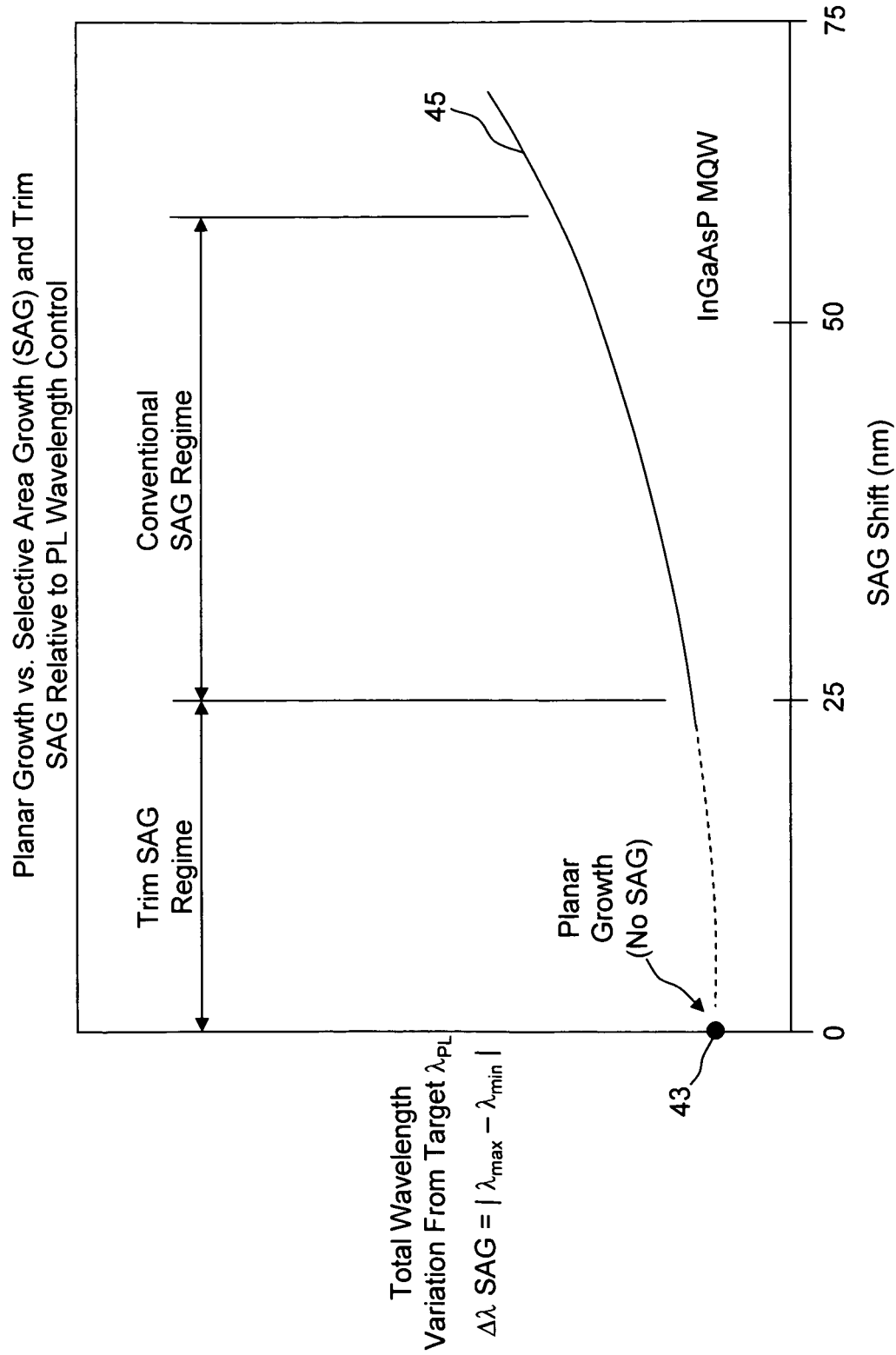
FIG._11

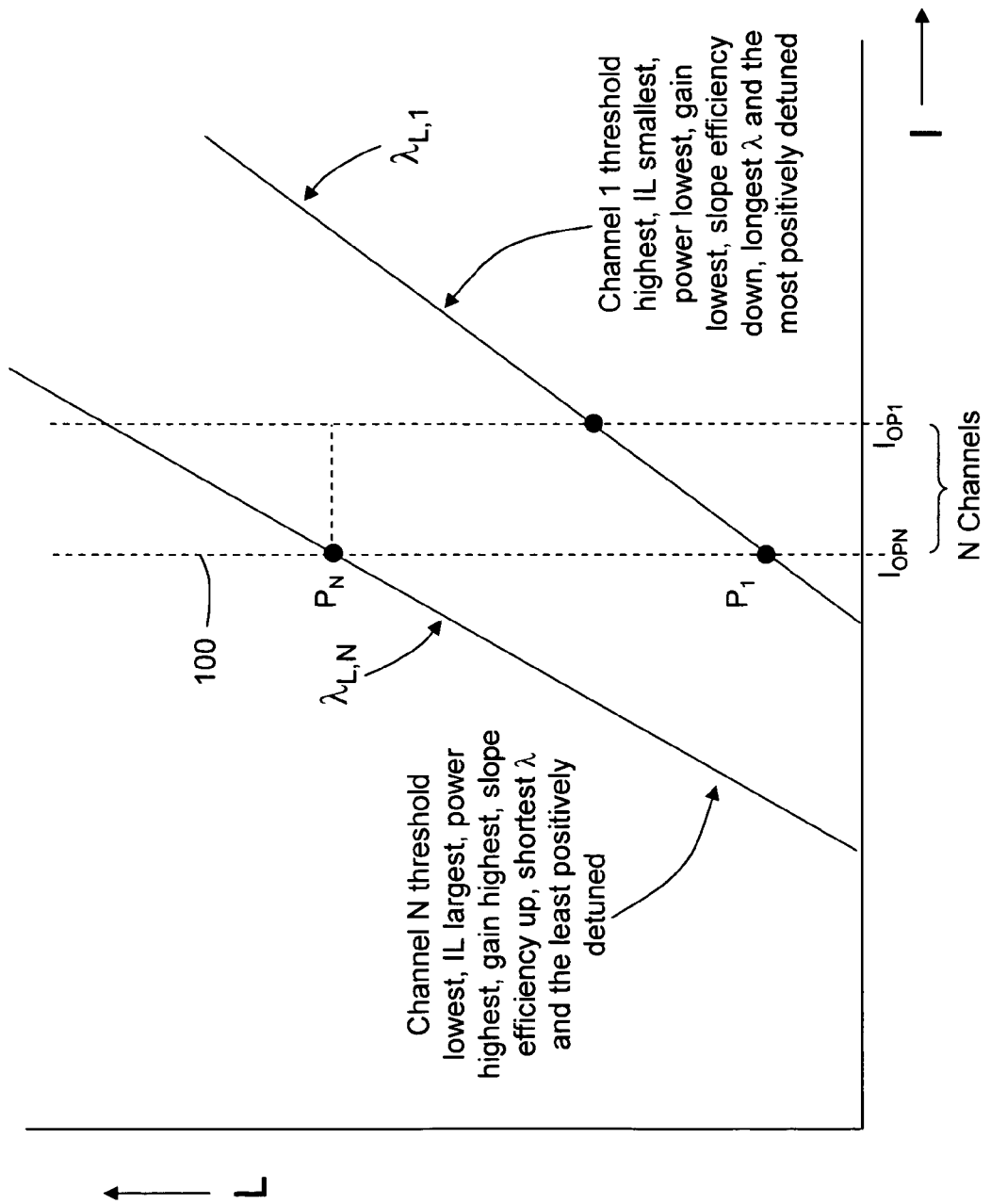
FIG._12

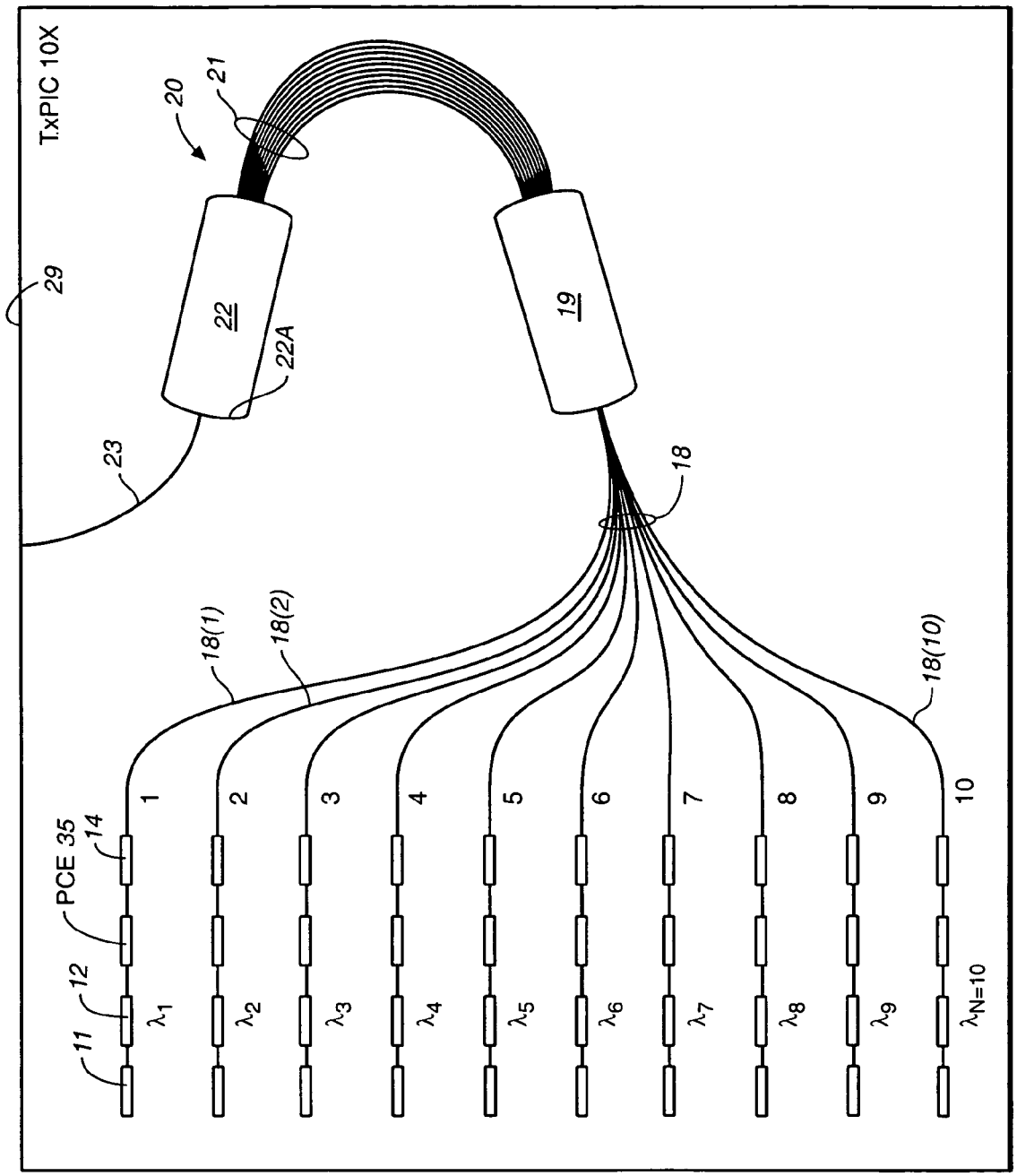
FIG._13

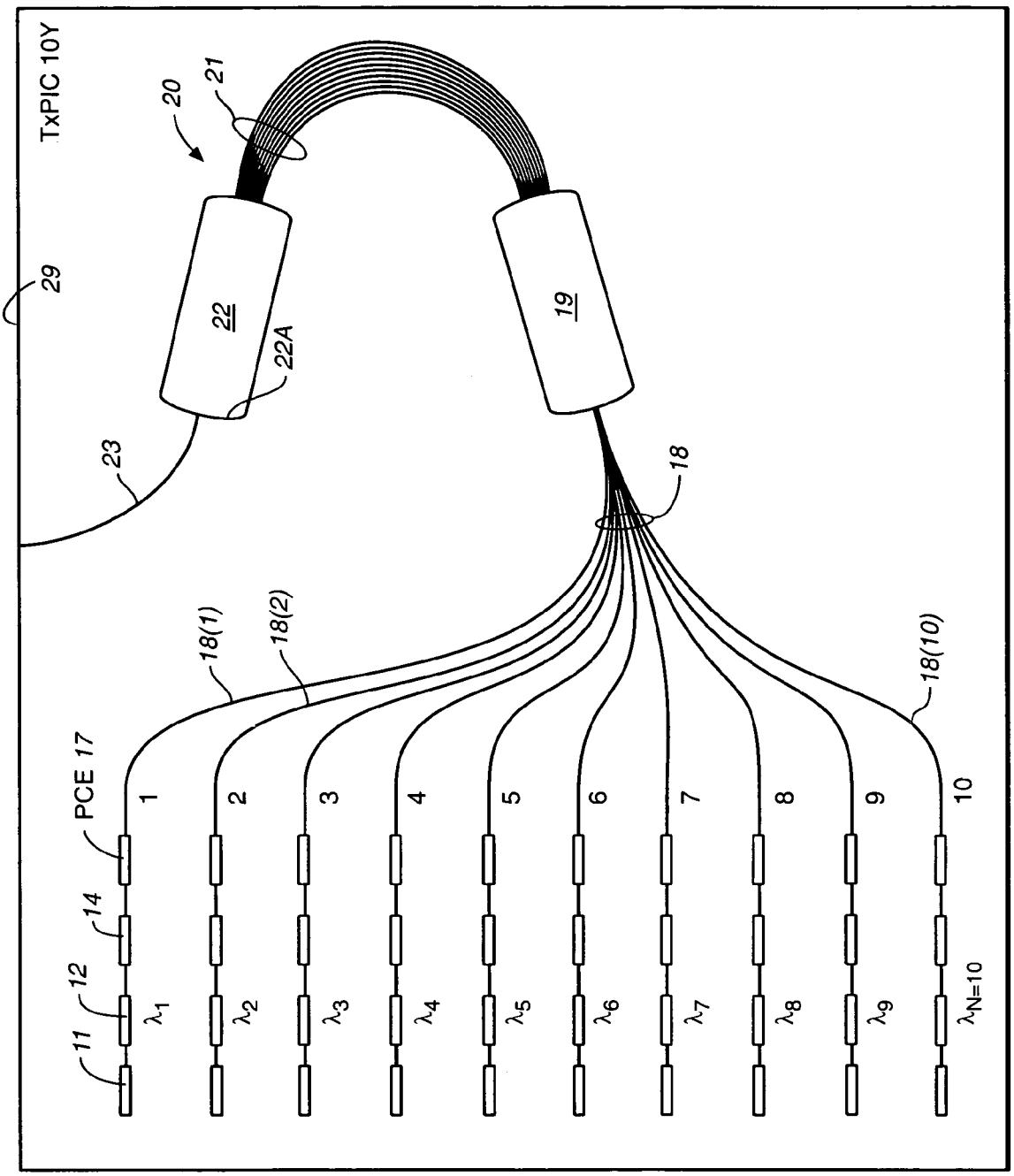
FIG._14

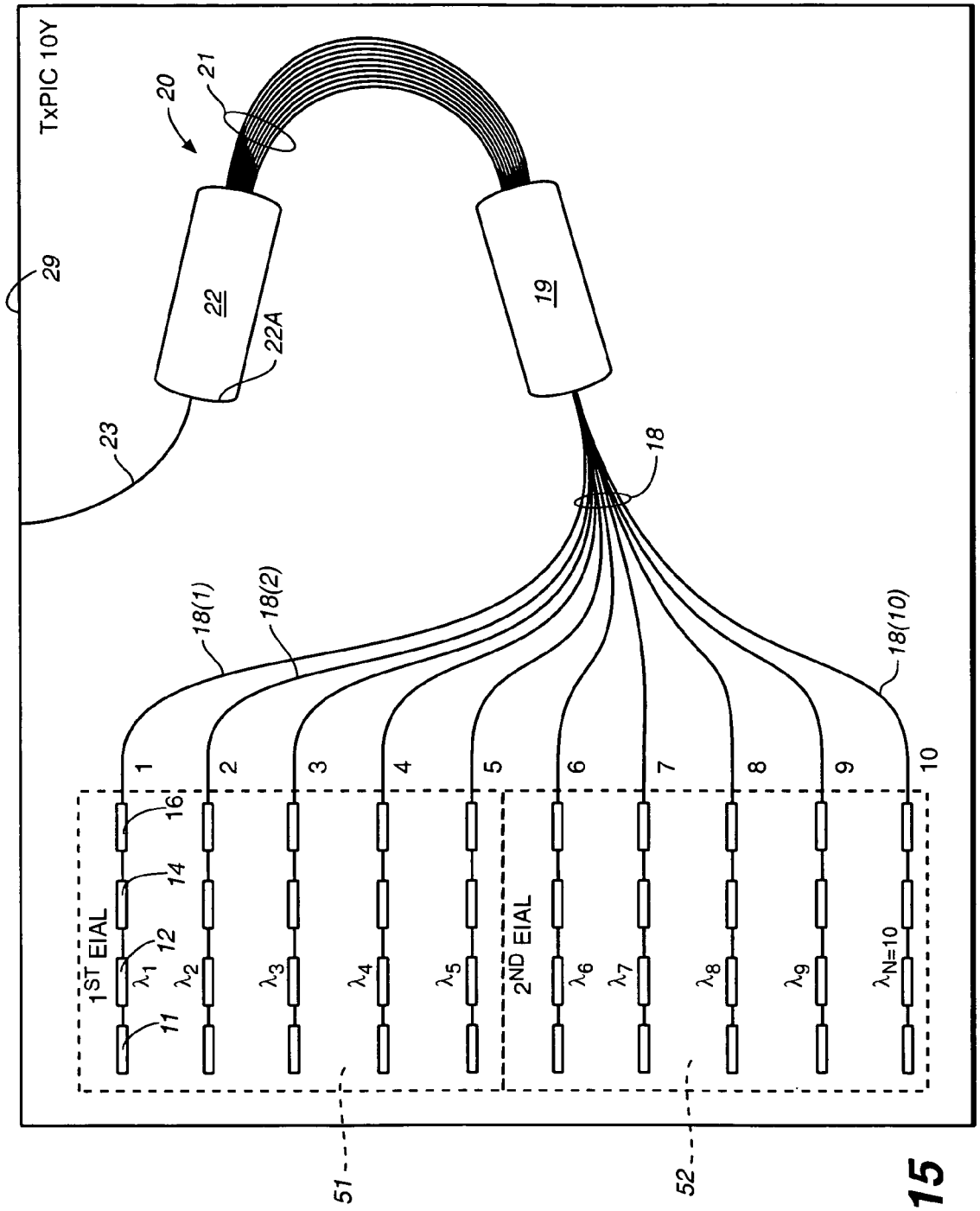
FIG._15

METHOD OF ACHIEVING ACCEPTABLE PERFORMANCE IN AND FABRICATION OF A MONOLITHIC PHOTONIC INTEGRATED CIRCUIT (PIC) WITH INTEGRATED ARRAYS OF LASER SOURCES AND MODULATORS EMPLOYING AN EXTENDED IDENTICAL ACTIVE LAYER (EIAL)

REFERENCE TO RELATED APPLICATIONS

This application claims priority of U.S. provisional patent application Ser. No. 60/539,443, filed Jan. 27, 2004, and is a continuation-in-part of U.S. patent application Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs, also published on May 22, 2003 as U.S. Pub. No. 2003/0095737A1; Ser. No. 10/267,330, filed Oct. 8, 2002 and entitled, TRANSMITTER PHOTONIC INTEGRATED CIRCUIT (TxPIC) CHIP ARCHITECTURES AND DRIVE SYSTEMS AND WAVELENGTH STABILIZATION FOR TxPICs, also published on May 22, 2033 as U.S. Pub. No. 2003/0095736A1; Ser. No. 10/267,346, filed Oct. 8, 2002 and entitled, TRANSMITTER PHOTONIC INTEGRATED CIRCUIT (TxPIC) CHIP WITH ENHANCED POWER AND YIELD WITHOUT ON-CHIP AMPLIFICATION, also published on May 1, 2003 as U.S. Pub. No. 2003/0081878A1; and Ser. No. 10/317,935, filed Dec. 11, 2002 and entitled, TRANSMITTER PHOTONIC INTEGRATED CIRCUIT (TxPIC) CHIPS, also published on Apr. 8, 2004 as U.S. Pub. No. 2004/0067006A1, all assigned to the assignee herein and all of which are incorporated herein in their entirety by their reference.

BACKGROUND OF THE INVENTION

Field of Invention

This invention relates generally to photonic integrated circuits (PICs) and more particularly to monolithic transmitter PIC (TxPIC) chips that have integrated arrays of laser sources and modulators having an extended identical active layer (EIAL), and forming a plurality of signal channels with each channel operating at a different wavelength of light and optionally with modulated channel signal outputs from each channel optically coupled to an integrated optical combiner.

DEFINITIONS

In order to better understand the disclosure, the following definitions are employed relative to certain terminology that is used throughout this disclosure:

"Electronic signal processing" or ESP means pre-emphasis, equalization, electronic dispersion compensation (EDC) and forward error correction (FEC) to expand the effective operation window of an EIAL PIC or TxPIC.

"Laser emission wavelength" means emission output wavelength, $\lambda_{L,j}$, of the laser source, in channel j.

"Active region wavelength" means the wavelength, $\lambda_{PL,I,j}$, of the photoluminescence peak or the gain peak in the active region of element, (i), of channel j formed in a photonic integrated circuit (PIC) such as an active region of a laser source (i=L or $\lambda_{PL,L,j}$), modulator (i=M or $\lambda_{PL,M,j}$), monitoring element such as a photodetector (i=PD), a power changing element (i=PCE), or a multifunctional element (i=MFE). For a modulated source sharing an identical active layer (IAL), $\lambda_{PL,M,j} = \lambda_{PL,L,j}$. For purposes of brevity in this invention, PL peak and gain peak are used interchangeably although they are slightly different as is known in the art.

"Laser-modulator detuning" means the difference between the laser emission wavelength, $\lambda_{L,j}$, of a given channel j and the modulator active region wavelength, $\lambda_{PL,M,j}$ of the modulator in the same given channel, j. This is also commonly referred to as "detuning".

"Laser detuned offset" means the difference between laser emission wavelength, $\lambda_{L,j}$, and the laser active region wavelength, $\lambda_{PL,L,j}$ for channel, j.

"Laser spectrum span" means the difference between the laser emission wavelength, $\lambda_L$, 1 and the laser emission wavelength, $\lambda_{L,N}$ where N is the number of laser channels in the photonic integrated circuit (PIC) laser spectrum span.

"Array spectrum spacing, ($\Delta\lambda$)" means the difference in laser emission wavelengths between adjacent channels in an array in a photonic integrated circuit (PIC), or equivalently the magnitude of the laser emission wavelength, $\lambda_{L,j}$, minus the laser emission wavelength, $\lambda_{L,j+1}$ or $|\lambda_{L,j} - \lambda_{L,j+1}|$.

"Positive wavelength detuning" or "positively detuned wavelengths" means the laser detuned offset that is greater than zero.

"Operation window" means the range of laser source channel emission wavelengths over which there is acceptable loss and acceptable bit error rate (BER) performance of the modulated sources for a particular specified application of the TxPIC.

"Systematic bias" means nonuniformity or tilt in power or BER variation or both in modulated sources across a plurality of channels formed in a photonic integrated circuit caused by the deployment of an extended identical active layer (EIAL) across the channels resulting from a variation in one or both of laser detuned offset and laser-modulator detuning.

"Identical active layer (IAL)" (also to include a stack of multiple active layers and such layer or layers may be collectively referred as an "identical active region") means an optically coupled integrated laser source and modulator as in an electro-absorption modulator/laser (EML) sharing the same active layer having the same composition, strain and thickness. Mathematically, this can be expressed, for example, as $\lambda_{PL,L} = \lambda_{PL,M}$ for one channel, j. Note that "identical" means that the thickness, strain and composition are not intentionally varied but undoubtedly have some slight variation due to finite manufacturing capabilities.

"Extended identical active layer (EIAL)" means extending the IAL in a given channel of a PIC to one or more elements in addition to the channel modulated source or extending the IAL to additional channels, j, with channel elements including, but not limited to, laser or modulator active regions or to modulated source active regions.

"Modulated source(s)" means an integrated laser source and external modulator in one or more channels. The term, "external", as used in the art in this context means "independent or separate from" the laser and the modulator is an integrated device on the same substrate with the laser.

"Power setting" as used in the context of this description means a predetermined setting of the power within a given tolerance across the channels in a photonic integrated circuit (PIC) to provide for either power output leveling (equalization) across an array of PIC channels, or tilting (skewing) the power output across an array of PIC channels. The tiling of power may be either monotonic or non-monotonic across the channel array. One application of power tilting is to compensate for the gain tilt across the wavelength spectrum output of an optical fiber amplifier, such as an EDFA.

"SAG" means "regular" Selective Area Growth as known in the art which is the employment of masking techniques to increase the deposition growth of one or epitaxial constituents in one or more selected areas of a growth surface of a wafer subjected to epitaxial growth such as in MOCVD.

"Trim SAG" means a SAG technique employing a small amount of such growth, as distinguished from regular SAG, for performing slight variations in selected areas of an EIAL photonic integrated circuit (PIC) which are designated active regions of optical elements in the PIC for changing the photoluminescence peak wavelength of such elements to properly perform a function. The comparative amount of trim SAG is approximately less than or equal to the laser spectrum span on the photonic integrated circuit (PIC).

A "channel", or "j", as used in the context of a photonic integrated circuit (PIC), means an integrated, optical signal channel waveguide path that minimally includes a modulated source for providing an optical signal output and wherein in the photonic integrated circuit (PIC), there are N signal channels formed in an array across the PIC where N is two or greater. Thus, a channel may include in its waveguide path other elements in addition to a modulated source.

An "element", or "i", which is synonymous with "component", means any active or passive optical device integrated on a photonic integrated circuit (PIC) that performs a function on the PIC. Examples include, but not limited to, a laser, modulator, PCE, MFE, an element with a fixed insertion loss which can be fixed or set at a bias, a waveguide, a combiner or decombiner, a coupler, or splitter.

"PCE" means a power changing element (a power varying element or a fixed loss element) integrated in one or more of the channels of a photonic integrated circuit (PIC) that changes the power level of the light propagating through the element. Examples of PCEs are photodetectors, semiconductor optical amplifiers (SOAs), variable optical attenuators (VOAs), or combination SOAs/VOAs which may also be referred to as ZOAs, Δ-β coupler, a Mach-Zehnder interferometer that changes the phase of light split between the interferometer arms, or the deployment of an absorption region of a predetermined length formed in the signal channel.

"MFE" means a multifunctional element (MFE) integrated in a photonic integrated circuit (PIC) that performs more than one function. Examples of MFEs are photodetectors employed for monitoring the output of a channel as well as function as a variable optical attenuator (VOA), a semiconductor optical amplifier (SOA) which may be utilized as a PCE and a phase changing element, and a combination VOA/SOA (VOA/SOA) functioning to add gain to or attenuate the power in a PIC channel.

A "combiner or decombiner" means a wavelength selective combiner or decombiner and a free space combiner or decombiner. A "wavelength selective combiner or decombiner" is a wavelength discriminating combiner or multiplexer of wavelength channel signals. A "free space combiner/decombiner" is a wavelength indiscriminate combiner with respect to combining different wavelength channel signals. More particularly, the output power from a wavelength selective combiner may be defined as $$\sum_{i}^{N} P_i - IL,$$

where $P_i$ is the optical input power into the combiner, N is the number of outputs and IL is the insertion loss. For the free space combiner, it is typically defined as $$\sum_{i}^{N} \frac{P_i}{N - IL},$$

where $P_i$ is the optical input power to the combiner and N is the number of inputs and IL is the insertion loss. It can readily be seen that the difference power output is the prime difference. Examples of wavelength selective combiners/decombiners are, but not limited to, an arrayed waveguide grating (AWG), an Echelle grating, a cascaded Mach-Zehnder interferometers, a quasi-wavelength selective star coupler or an elliptical supergrating. Examples of free space combiners/decombiners are, but are not limited to, a multimode interference (MMI) coupler, free space coupler, star coupler or any such optical coupler with a multimodal coupled region.

2. Description of the Related Art

For long haul optical telecommunications in the past, the optical transmitter has primarily been comprised of optically fiber-coupled discrete semiconductor laser sources and discrete external modulators. In most cases, the laser source of choice has been the DFB laser and the modulator of choice has been the Mach-Zehnder lithium niobate modulator. More recently, the integration of these two components have come into common commercial reality comprising a monolithic DBR or DFB laser/electro-absorption (EA) modulator integrated on the same substrate. The combination, single laser integrated with a single modulator have been referred to as a semiconductor modulator/laser (SML) and are also referred to in the art as an EML (electro-absorption modulator/laser) where the modulator is of the electro-absorption type. It is highly desirable to monolithically integrate an electro-absorption (EA) modulator with a single-frequency laser, such as a DFB or DBR laser. Such externally modulated laser sources, such as an EA modulator, are more attractive than direct modulated laser sources (DMLs) because of their low chirp. These EMLs have the advantage over previous discrete laser/modulator devices in that (1) coupling or insertion losses between the laser and modulator are reduced or negligible resulting in stable and reliable modulation sources, (2) laser chirp due to, at least in part, of feedback reflection from the laser/modulator interface or the output facet is reduced, and (3) costs in producing such an integrated device are lower. EMLs generally employ multiple quantum wells (MQWs) in the device's active region. The issue in fabricating these integrated devices, however, is that the MQWs for the modulator section are required to have a shorter active region wavelength than the laser emission wavelength. This can be difficult if the integrated laser section and the modulator section have a common active region, which also has been referred to as an identical active layer (IAL) in the art for these two electro-optic components, because the belief was that in order to achieve the necessary wavelength shift between the laser and the modulator in an EML, the respective active regions of these devices had to be made with effectively different bandgaps to maintain high performance of both devices. In the past, there have been several approaches to accommodate this effective bandgap difference. One approach is the deployment of a butt joint as exemplified in the article of Y. Suzaki et al. entitled, "Multi-Channel Modulation DWDM Monolithic Photonic Integrated Circuit", 14*TH* *Indium Phosphide and Related Materials Conference*, Conference Proceedings, pp. 681-683, May 12-16, 2002, Stockholm, Sweden and butt coupling regrowth as exemplified in the articles of P. I. Kuindersma et al. entitled, "Packaged, Integrated DFB/EA-MOD for Repeaterless Transmission of 10 Gbit/s Over 107 km Standard Fiber", *Electronic Letters*, Vol. 29(21), pp. 1876-1878, Oct. 14, 1993; M. Suzuki et al. entitled, "Monolithic Integration of InGaAsP/InP Distributed Feedback Laser and Electroabsorption Modulator by Vapor Phase Epitaxy", *Journal of Lightwave Technology*, Vol. LT-5(9), pp. 1277-1285, September, 1987; and H. Takeuchi et al. entitled "NRZ at 40 Gb/s of a Compact Module Containing an MQW Electroabsorption Modulator Integrated with a DFB Laser", *IEEE Photonics Technology Letters*, Vol. 9(5), pp. 572-574, May, 1997. Butt coupling involves multiple epitaxial growth steps forming two distinctive active waveguide regions in an integrated EML. This allows independent design of the laser and modulator layers, including their respective active regions or waveguides, although critical etching and regrowth steps are required in order to optimize efficient optical coupling between the two waveguide regions. A significant disadvantage of this approach is the potential inability to sufficiently eliminate back reflections occurring at the butt joint interface between the laser and modulator active region or from the modulator facet. Also, additional disadvantages are the lack of good reproducibility, potential defects included at the butt joint, and more intense manufacturing resource requirements (e.g., additional epitaxial growths which may incur additional yield losses).

Another approach, also employing a butt joint with the use of selective area growth (SAG), is disclosed in the articles of M. G. Young et al. entitled, "A 16×1 Wavelength Division Multiplexer with Integrated Distributed Bragg Reflector Lasers and Electroabsorption Modulators, *IEEE Photonics Technology Letters*, Vol. 5(8), pp. 908-910, August, 1993 and M. Aoki et al. entitled, "Novel Structure MQW Electroabsorption Modulator/Laser Integrated Device Fabrication by Selective Area MOCVD Growth", *Electronic Letters*, Vol. 27(23), pp. 2138-2140, Nov. 7, 1992. The employment of selective area growth (SAG) can be applied to multiple components such as, for example, an array of DFB lasers which are provided with different emission wavelengths through the use of SAG and are optically coupled through a multimode interference (MMI) combiner to a semiconductor optical amplifier (SOA), grown with the employment of selective area growth (SAG), and to a EA modulator, also grown with SAG, as taught and illustrated in the article of K. Kudo et al. entitled, "1.5-µm Wavelength-Selectable Microarray DFB-LD's with Monolithically Integrated MMI Combiner, SOA, and EA-Modulator", *IEEE Photonics Technology Letters*, Vol. 12(3), pp. 242-244, March, 2000. SAG is based on variation of the active MQW region material thickness as well as composition in the same growth plane through a single growth step over a masked substrate where MOCVD source materials will not nucleate on mask areas but rather, in part, move or propagate during epitaxial deposition along the mask surface to a mask opening relating to the active region of either the laser or the modulator or both. As a result of this propagation phenomena, the locally deposited growth rate at these mask openings is increased and the local composition varies from that in the unmasked field. Thus, different mask openings with different widths and/or mask widths will have different growth rates and as-grown material compositions. With these techniques, it is possible to ensure that the modulator active region wavelength will have a blue shift relative to the laser active region wavelength. Thus, the active regions of either the laser or the modulator, or both, can be engineered to have selected bandgap energy shifts depending on mask widths adjacent to the mask openings. However, it is difficult to achieve, on a repeated basis, the desired and precise strain requirements, thicknesses and desired material composition in multiple quantum well (MQW) layers epitaxially grown employing SAG, particularly in the case when integrated, multiple electro-optic components are grown employing SAG such as demonstrated by Kudo et al., supra. Furthermore, there is more variability in composition, strain and thickness in growth using SAG than compared to planar epitaxial growth, especially with respect to the precision that is required to make an even more demandingly integrated device for WDM applications. Thus, SAG is difficult to achieve desired controlled material growth with a continually maintained and predetermined grown material composition, strain and thickness.

A further approach is the so-called vertical mode coupling approach where two spatially separated active regions with different as-grown bandgaps, separated by a thin InP layer, are formed employing MOCVD with a single epitaxial growth step. While this approach has the advantage of independent optimization of the two different active regions in different levels of the as-grown device, it is difficult to provide for non-reflection as well as insure low coupling loss at the laser/modulator interface without degrading the laser and/or modulator performance.

A still further approach is quantum well interdiffusion to achieve a blue shift of the absorption edge at the position of the modulator. For general examples, see the articles of J. H. Marsh entitled, "Quantum Well Intermixing", *Semiconductor Science and Technology*, Vol. 8, pp. 1136-1155, June, 1993 and M. J. Lee et al. entitled, "Intermixing Behavior in InGaAs/InGaAsP Multiple Quantum Wells With Dielectric and InGaAs Capping Layers", *Applied Physics A—Materials Science & Processing*, Vol. 73, pp. 357-360, 2001. A concern here is reproducibility and compatibility with a subsequent regrowth or annealing step which may create further additional interdiffusion resulting in further changes to desired wavelength properties as well as control of the dopants in the structure. Also, the ability to independently tailor the strain, composition and thickness, in the desired or prescribed regions is limited, which limits device design and performance.

More recently, proposals for use of a common active region or identical active layer (IAL) for the integrated electro-absorption modulator/laser or EML have been made as first set forth by A. Ramdane and his co-workers, which is well described in one of their articles entitled, "Monolithic Integration of Multiple-Quantum-Well Lasers and Modulators for High-Speed Transmission", *IEEE Journal of Selected Topics in Quantum Electronics*, Vol. 2(2), pp. 326-335, May, 2002 and where the approach is referred to as "identical active layer" approach. In order to avoid strong absorption in the EA modulator of the DFB laser emission wavelength, the active region ($\lambda_{PL, L \, or \, M}$) is positively detuned from the laser emission wavelength ($\lambda_L - \lambda_{PL, \, L \, or \, M} > 0$) so that its lasing wavelength becomes sufficiently transparent to the active region of the modulator. The advantages of IAL in an EML are first, only a single epitaxial step is necessary for the growth of the laser and modulator active regions providing epitaxial process simplicity. Second, optical coupling losses between the integrated laser and modulator become negligible.

In an IAL EML, as taught in the art, the DFB laser grating is designed to have a grating whose resonant Bragg wavelength is longer (positive) wavelength than the laser active region wavelength, resulting in a positive detuned offset. Positive detuning is utilized to provide an offset between the laser emission wavelength and the modulator active region wavelength. Thus, the epitaxial layers of an integrated laser source, such as a DFB laser, and an integrated electro-optic modulator, such as a EA modulator, that is an EML comprising a single laser/modulator combination can be formed in a single epitaxial growth step.

In positive wavelength detuning, as related to an IAL electro-absorption modulator/laser (EML) device, the active region for the laser and the modulator is an identical active layer, but the grating formed in the laser region of the EML is designed to have a longer laser emission wavelength as determined by the grating period than the wavelength of the photoluminescence or exciton peak of active region material composition. Since the lasing wavelength of the laser source is primarily determined by its grating period, the wavelength that is longer than the natural lasing wavelength matches the modulation wavelength of the optical modulator, i.e., it is sufficiently transparent to the unbiased operation of the modulator. Lasers with laser emission wavelengths longer than the laser active region wavelength are positively detuned and lasers with laser emission wavelengths shorter than laser active region wavelength are negatively detuned. The amount of detuning is called the laser detuned offset, as previously defined, a positively detuned offset in an IAL EML allows the modulator is to be sufficiently, but not necessarily completely, transparent to the laser emission wavelength.

Since the lasing wavelength of the DFB laser is largely determined by the period of the DFB laser grating, the active region can be, in part, optimized for the performance of the modulator. Too much positive detuning results in degradation of laser characteristics (e.g. threshold, slope efficiency, single mode yield, RIN and linewidth). In Ramdane et al., supra, it is explained that by positive detuning to longer laser emission wavelengths relative to the laser active region wavelength, as seen at FIG. 2(a) of the Ramdane article, the emission wavelength of the laser can be made to be optimized for the desired wavelength for the modulator. A predetermined amount of detuning ensures optimal wavelength compatibility between the laser and the modulator due to the width of the gain spectrum exhibited by specifically designed strained MQW layers and also likely due to carrier-induced energy bandgap shrinkage. The typical optimal positive detuning for the laser/modulator may be, for example, an offset in the range of about 30 nm to about 60 nm. This offset depends on the details of the modulator design. As a specific example of offset, the exciton peak may be, for example, 1490 nm and the emission peak of the semiconductor laser may be 1540 nm providing a positive detuning of 50 nm. See also the article of Chang-Zheng Sun et al. entitled, "Influence of Wavelength Detuning on Device performance of Electroabsorption Modulator Integrated Distributed Feedback Lasers Based on Identical Epitaxial Layer Approach", *IEICE Trans. Electon.*, Vol. E84-C(5), pp. 656-659, May, 2001.

It should be noted that the performance of electroabsorption modulators (EAMs) are highly sensitive to the laser-modulator detuning. For EAMs to have low-optical losses in their unbiased state, the active region wavelength of the modulator has to be blue-shifted with respect to the laser emission wavelength. However, it is desirable to have an identical active layer (IAL) for both the laser and the modulator because, as previously indicated, it simplifies the semiconductor processing and greatly enhances the reproducibility for commercial manufacture of such devices. In order to achieve the desired operating properties of an IAL EML, the DFB laser must be fabricated to operate at a positively detuned wavelength and with its detuned emission wavelength close to the absorption edge of the modulator active region ensuring optimal compatibility between the laser and modulator without significantly degrading laser or modulator performance. In other words, the laser emission wavelength is red-shifted with respect to the active region wavelength of the EA modulator and the active region wavelength of the laser region. A sufficient width of the gain spectrum in the operation of the DFB laser is achieved due to the employment of certain multiple quantum well laser designs of the active region. This spectrum may be further enhanced by the incorporating strain in the multiple quantum well layers.

Later "offshoots" of the IAL approach have included coupled asymmetric multiple quantum wells (MQWs) providing a blue-shift of the absorption edge of the modulator under applied bias allowing the bandgap to be less blue-shifted as grown. See, for example, the article of Steinmann et al. entitled, "Asymmetric Quantum Wells With Enhanced QCSE: Modulation Behavior and Application for Integrated Laser/Modulator", *IEEE Photonics Technology Letters*, Vol. 9(2), pp. 191-193, February, 1997 and U.S. Pat. No. 6,148,017. Another offshoot is the employment of two different types of MQWs in the same active region where one set of MQW layers have, for example, narrow wells and the other set of QW layers have wide wells. Alternatively, one set of MQWs in the active region may have a different thickness and composition from the other set of MQWs in the active region. See, for example, the articles of Steinmann et al. entitled, "Improved behavior of Monolithically Integrated Laser/Modulator by Modified Identical Active Layer Structure", *IEEE Photonics Technology Letters*, Vol. 9(12), pp. 1561-1563, December, 1997; B. Stegmueller et al. entitled, "15-GHz Modulation Performance of Integrated DFB Laser Diode EA Modulator with Identical Multiple-Quantum-Well Double-Stack Active Layer", *IEEE Photonics Technology Letters*, Vol. 14(12), pp. 1647-1649, December, 2002; and U.S. Pat. No. 6,066,859. Both such MQW sets are pumped in the laser section with the smaller bandgap wells providing increased gain at a longer wavelength. In the modulator section, there is a shift in the absorption edge due to the quantum-confined Stark effect (QCSE) which strongly depends on the wider wells and, as a result, the MQWs in both sections are rendered compatible. Said another way, a tradeoff is created between laser performance (such as threshold and efficiency) on one hand, and EA modulator performance (such as chirp, extinction ratio and insertion loss) on the other hand. The problem is that in the modulator section, the narrower bandgap quantum wells present in the modulator section are parasitic in that they induce loss which compromises EAM performance, and in the DFB laser section, the wider bandgap wells reduce both the gain and optical overlap and confinement of the mode, which compromises DFB laser performance.

With reference now to the above identified and incorporated U.S. Patent Applications owned by the assignee herein, a new optical transmitter solution has come of age—the optical transmitter semiconductor chip with multiple, integrated signal channels with WDM signal output from the chip. The InP-based, optical transmitter photonic integrated circuit (TxPIC) formed in these chips comprises an array of modulated sources at least two or more of such integrated modulated sources, which may be an integrated array of direct modulated lasers (DMLs) or may be an integrated array of laser sources, each integrated to an electro-optic modulator (EOM). In either case, they include an array of laser sources equal to or greater than two such devices. The respective laser sources operate at different wavelengths which are respectively set to wavelengths on a standardized wavelength grid, such as the ITU (International Telecommunications Union) grid. By "standardized or predetermined grid", it is meant an approximation of such a grid. It should be appreciated by those skilled in the art that an array of several semiconductor laser sources, while fabricated to respectively operate at a wavelength on a predetermined or standardized grid, such as the ITU grid, for generation of plural optical channel signals in an optical telecommunication system, the resulting emission wavelengths for at least some of the laser sources in the array, if not all of them, will be offset by some $\Delta\lambda$ from their intended and designated grid wavelength. However, their operation wavelengths with such $\Delta\lambda$ differences will be within system level tolerances that remain acceptable for performance in the optical telecommunication system. Thus, when mention or reference is made herein to laser wavelengths of a laser array on a "predetermined" or "known" or "standardized" grid, it should be recognized that the array laser wavelengths on such a wavelength grid are within an acceptable manufacturing tolerance. The wavelength of the respective laser sources may be designed to target the desired emission wavelength by changing the effective refractive index of the laser optical cavity. Such changes can be accomplished by changing the lateral (transverse) waveguide width of the laser cavity, by changing the angle of the waveguide relative to the grating grooves, by changing the angle of the waveguide relative to the grating grooves, by placing a lower or higher k dielectric over or beside the laser source in a region of optical field overlap, by ion implanting the region of the active layer or an area immediately adjoining the region, by impurity induced disordering the active region or an area immediately adjacent region to the laser active region, by locally inducing stress by means of a dielectric cladding layer in proximity to the laser active region, by locally inducing a temperature difference by means of a heater or a current through the active region, by changing the thickness of any of the epitaxial layers within the optical field of the laser source, by changing the composition or strain of any of the epitaxial layers within the optical field of the laser source, or by changing the duty cycle of the grating independently of its grating pitch, or by changing the grating pitch.

If any integrated laser source after fabrication is operating outside an acceptable tolerance for performance, a wavelength tuning element, associated with each laser source, is employed to tune the laser source back into an accepted tolerance window, $\Delta\lambda$. Such wavelength tuning elements may be a heater in proximity to a laser source, a change in laser bias current to change the refractive index of the active region, adding multiple sections to the structure of the laser source and varying the bias current in one or sections, providing a phase tuning section in the laser source, use of coolers, substrate TECs or micro-TECs to tune the wavelength grid or individual laser sources on the PIC, and stress wavelength tuning such as through the use of bi-metals associated with the photonic integrated circuit (PIC). Thus, wavelength tuning can be accomplished and controlled by changes in laser source temperature, voltage and current, or bandgap.

Thus, as taught in these above identified applications of the common assignee herein, each of the modulated signals from each laser source/modulator combination or modulated laser source comprises a signal channel with a frequency different from other signal channels—all integrated on the same chip. The channel signals are provided as inputs to an integrated optical combiner which may be a wavelength selective combiner, such as, an arrayed waveguide grating (AWG), an Echelle grating, a cascaded Mach-Zehnder interferometer, a quasi-wavelength selective star coupler or an elliptical supergrating. A free space combiner/decombiner is, but not limited to, a free space coupler, a star coupler, a MMI coupler or any such optical coupler with a multimodal coupled region. Some examples of the foregoing can be seen in the above identified incorporated applications, in particular, U.S. application Ser. No. 10/267,331. The TxPICs in the foregoing application are InP-based circuit chips which have a common active layer throughout at least some of the modulated sources forming a plurality of signal channels on the chip where the common active layer herein is defined as an extended identical active layer (EIAL). The use of the IAL approach as applied to multiple signal channels comprising modulated sources all on the same integrated chip with an extended identical active layer (EIAL) becomes a much more complex issue than in the case of a single EML.

In the fabrication of a dense WDM system on a PIC chip, very precise wavelength control across the laser array integrated on the chip is important. In present conventional systems employing discrete laser sources or EMLs, this is not an issue because individual laser or EMLs can be binned and later mixed and matched at the system level according to their peak lasing wavelength. However, in the case of integrated arrays of lasers on a single chip, there is no luxury to mix and match, as the performance of all the lasers in the array must be initially fabricated to desired specifications so that all devices on a PIC respectively meet the requisite grid wavelength if desirable yields of such photonic integrated circuits or PICs are to be achieved. Thus, what is required is to initially achieve a sufficient in-wafer wavelength control across an as-grown laser array comprising two or more modulated sources in order to achieve a dense WDM system on a semiconductor chip, such as an InP-based semiconductor PIC. In addition, after the demanding wavelength requirements are met, the other transmission properties (e.g., power, BER, etc.) must be sufficient across all channels for the intended application. While the PIC carries many different active and passive integrated components, by far, the laser sources, such as a DFB laser array, have the tightest wavelength specification requirements, compared with the EA modulator array, which may have a wider wavelength operation window. So, said another way, the TxPIC yield will be a strong function of DFB wavelength yield, i.e., where the array of DFB lasers for each PIC die are substantially operating at desired on-chip transmission wavelengths.

While laser-modulator detuning with discrete IAL EMLs is known and discussed, as outlined above, there has been no disclosure known to the inventors dealing with IAL relative to photonic integrated circuits (PICs) which have multiple or a plurality of integrated arrays of lasers/modulators formed in a single semiconductor chip. It is much simpler to determine acceptable detuning of the lasing wavelength in a single EML compared to situation where there are multiple integrated EMLs sharing the same identical active layer (IAL). In such a case, for example, there has to be a recognition, as taught in this application, of the provision of a sufficiently large operation window across the entire array of modulators and lasers within which successful operation of N positively detuned lasers and N corresponding modulators can be achieved; otherwise, the success of being able to operate plural integrated N laser/modulator signal channels on a standardized wavelength grid with an accepted operation window will not be realized. This invention overcomes this difficulty and provides an approach to apply IAL to a plurality of integrated laser/modulator signal channels in a monolithic photonic integrated circuit (PIC).

OBJECTS OF THE INVENTION

It is one of the primary objects of this invention to provide an EIAL method to photonic integrated circuits (PICs) that comprise an array or plurality of integrated laser/modulator signal channels, which is more than one integrated laser/ modulator (EML) formed on a single substrate, that successfully achieves acceptable PIC performance. Other objectives appear throughout the remaining application description.

SUMMARY OF THE INVENTION

According to this invention, a method provides acceptable performance from a semiconductor transmitter photonic integrated circuit (TxPIC) that contains a plurality of modulated sources each comprising a laser source and an external modulator where each laser source provides a different emission wavelength and each modulated source forms a separate signal channel, comprising the steps of providing at least some of the signal channels with an extended identical active layer (EIAL) so that the modulated sources each have an identical active region wavelength and detuning the laser emission wavelength in each laser source within the EIAL from the laser active region wavelength.

A semiconductor monolithic transmitter photonic integrated circuit (TxPIC) comprises two different situations, either at least one signal channel in the PIC having a modulated source with the channel also extended to include at least one additional element or a plurality of modulated sources comprising N signal channels in the PIC of different transmission wavelengths, where N is equal to or greater than two (2), which may also approximate emission wavelengths along a standardized wavelength grid. In these two different situations, a common active region for such modulated sources and additional channel elements is identified as an extended identical active layer (EIAL), as it extends from a single modulated source to such additional channel elements in the same channel or extends to additional modulated sources in separate channels where the number of such channels is N equal to two or greater. The emission wavelength of laser sources in the modulated sources have different positively detuned offsets of the laser emission wavelength relative to the laser active region wavelength, i.e., $(\lambda_{L,j} - \lambda_{PL,L,j} > 0)$, and their emission wavelengths form a wavelength grid which may substantially conform to a standardized wavelength grid, such as the ITU grid. These laser sources in the modulated sources with an EIAL are preferentially detuned in the range, for example, of about 20 nm to about 70 nm, preferentially from about 25 nm to about 50 nm, from the active region wavelength of the modulated sources.

Importantly, the operation window of EIAL modulators in the modulated sources is within the detuned emission wavelength window of the EIAL laser sources of the modulated sources along the long wavelength side of the gain peak of the common active region. In general, as used herein, "operation window" is the range of laser source channel emission wavelengths over which there is acceptable power and acceptable bit error rate (BER) performance of the modulated sources. Thus, there is sufficient transparency of all the emission wavelengths propagating through their corresponding modulator but for some laser wavelengths at the edges of the operation window, there will be more insertion loss than compared to others and, therefore, not fully transparent to the modulator active region wavelength. This is a compromise made between the laser sources and their corresponding modulators of respective PIC channels sharing an extended identical active layer (EIAL). A finer definition of the "operation window" may be described as the transparency of the modulators to the range of possible detuned offset wavelengths of the laser sources that result in sufficiently low loss at the modulator and sufficiently lower bit error rate (BER) at an optical receiver to achieve or realize a desired optical link between a transmitter PIC and the optical receiver. One example may be an established optical link having a power of −25 dBm to 5 dBm or higher with a BER in the range of $10^{-3}$ to $10^{-15}$ or better.

Preferably, the EIAL of the PIC comprises a plurality of quantum wells (QWs) containing in at least one part of thereof, an Al-containing composition, such as AlInGaAs (aluminum quaternary or "AQ") or AlInGaAsP (aluminum phosphide pentenary or "APP"), or AlInGaAsN (aluminum nitride pentenary or APN). The quantum well barriers (QBs) may also be comprised of an Al-containing layer, such as AlInGaAs (AQ), AlInGaAsP (APP) or AlInGaAsN (APN). However, it is within the scope of this invention to employ other active regions known in the art including, but not limited to, single active layers having an Al-containing composition as well as phosphorus-containing layer or layers such as InGaAsP (phosphor quaternary or "PQ"), InAsP, InGaAsN, InAlAsN, InGaP, InGaAs or InGaAsNSb in the active region QWs, in the active region QBs, or in the confinement layers. Reference in this description to "Q" as related to Group III-V compounds means both AQ and PQ.

Another feature of this invention is a semiconductor monolithic transmitter photonic integrated circuit (TxPIC) comprising an integrated array of laser sources, which are light generators for a plurality of N signal channels of different transmission wavelengths approximating a standardized wavelength grid, at least some of the laser sources being positively detuned within boundary conditions that N minus one (N−1) times array spectrum spacing (Δλ) in the PIC is in the range of about 0 nm to about 30 nm ($0 \leq (N-1)\Delta\lambda \leq 30$ nm), preferably in the range of about 0 nm to about 15 nm (from $\lambda_1$ to $\lambda_N$) for all modulated sources having the same EIAL.

Another feature of this invention is employing multiple EIALs in a single photonic integrated circuit (PIC) where the multiple EIALs are greater than one.

Another feature of this invention is a semiconductor monolithic optical transmitter photonic integrated circuit (TxPIC) chip comprising an array of integrated semiconductor laser sources with different wavelength outputs, an array of integrated modulators, at least some of the laser sources having their outputs coupled to a modulator to provide a plurality of N channel signal outputs each of a different wavelength. The coupled laser source/modulators comprise N signal channels in the TxPIC of different transmission wavelengths approximating a predetermined or standardized wavelength grid. The active region in the laser source section is identical to an active region in the modulator section in the TxPIC. The active region for the laser sources each have a different positively detuned offset of the laser emission wavelength relative to the laser active region wavelength within a desired range of positively detuned offsets. A plurality of modulated channel signal outputs from the modulators are coupled to the input of a PIC-integrated wavelength selective combiner or free space combiner for combining the channel signals to form a WDM signal on a circuit output waveguide from the optical combiner to a circuit output from the PIC chip. The PIC chip in an optical transmitter module provides for transmission of the WDM signal to an optical receiver over an optical transmission network. An electronic signal processing (e.g., pre-emphasis and/or equalization and/or electronic dispersion compensation (EDC) and/or forward error correction (FEC)) circuit can be utilized at least at one of the optical transmitter and/or the optical receiver or receivers to permit an effective expansion or range of the modulator array operation window and, correspondingly, an expansion of the effective range of positively detuned offsets that can be utilized for the PIC laser sources. This, in turn, means that more signal channels can be integrated on the same EIAL PIC chip.

It is a further feature of this invention to provide for wavelength stabilization and compensation, optically and, in some cases in conjunction with electronic compensation, in a photonic integrated circuit (PIC) that includes an array of integrated semiconductor modulator/lasers (SMLs), in general, such as a plurality of integrated electro-absorption modulator/lasers (EMLs). An additional feature is the employment of a complex-coupled grating or a phase shifted grating employed in the laser sources of the EIAL PIC to stabilize and expand the wavelength range within which the individual, multiple laser sources are operated with characteristics sufficient for transmission at desired different wavelengths. In another approach, the laser sources in an EIAL PIC have laser sources of different lengths or different κLs (grating coupling coefficients as known in the art) to improve threshold, power and operating point uniformity. Another feature of this invention is the deployment of AlInGaAs (AQ) in the active region of the PIC in lieu of InGaAsP (PQ). The use of Al-containing waveguide cores is initially taught in nonprovisional patent application Ser. No. 10/327,362, filed Dec. 20, 2002, and published on Sep. 4, 2003 as U.S. Pub. No. 2003/0165314A1, and is assigned to the assignee herein and is incorporated herein by its reference. It is also within the scope of this invention to employ an Al-containing pentemary, InAlGaAsP (APP) or AlInGaAsN (APN), as a preferred active region material. It is known that PQs will often result in blue wavelength shift after growth of overlying layers due, in part, to active region intermixing during high temperature growth and circuit fabrication or burn-in. AQ active regions tend to exhibit far less blue shift and also offers improved wavelength uniformity across a wafer as well as from wafer to wafer. With the implementation of an EIAL PIC having an array of different wavelength channels with an identical active layer for both laser sources and modulators, the accuracy of emission wavelengths is highly important. Furthermore, in high channel-count PICs, that utilize a majority of the full extent of the operation window, the control of the gain (PL peak) of the EIAL active region is also very important. So, the use of AQ instead of PQ minimizes the problem of blue shifted active regions and wavelength accuracy and layer uniformity during the EIAL growth. The AQ may be deployed in the active region quantum wells or the active region barrier or preferably both, and also the active region confinement layers may be an Al-containing layer, such as, AlInAs or AQ. Further, and just as importantly, the reduced valence band offset provides for improved modulator performance provides and/or enhanced window of wavelengths over which acceptable modulator performance can be achieved. In addition, the AQ material system also exhibits an enhanced conduction band offset which results in improved laser performance over a wider range of positively detuned wavelengths. Thus, the AQ active region enables enhanced windows of operation for the laser and modulator and, thus, enables the realization of an EIAL TxPIC with a maximum number of channels. The AQ active region also provides for array spectrum spacing and/or a greater number of channels so that a majority of the operation window is utilized. In fact, in many embodiments, the reduced operating window provided by a PQ active region EIAL TxPIC makes such a device impractical.

Another feature of this invention is the deployment of SAG or, more particularly the deployment of trim SAG, for the modulators relative to at least some of the signal channels or, alternatively, consider the use of trim SAG for either the DFB laser sources or for the modulators or for both.

The deployment of EIAL in PICs having a plurality of active elements or channels means that the active region is compromised or, said another way, requires tradeoffs. This application illustrates some unique ways of dealing with this compromise. The disadvantage in deploying EIAL to an entire array of DFB laser sources is, first, degradation in laser performance across the array, such as in the case of current threshold, spectral characteristics and operational efficiency, and, second, also performance degradation across the transmission wavelength window of the array of modulators. The EA modulators have a transmission wavelength window within which they preferably operate so that if the DFB laser array provides output signal channel wavelengths within the range of $\lambda_1$ to $\lambda_N$, then, in the presence of EIAL, the modulator array transmission wavelength window needs to cover or include the wavelength range of $\lambda_1$ to $\lambda_N$. It should be understood that placing a practical number of operable wavelengths on a TxPIC to achieve worthwhile integration results in a range of DFB laser wavelengths within a modulator operating window that is inconsistent with techniques and approaches employed in the past and is a monumental task. Further, EIAL coupled with large positive detuning across the laser source array enhances laser sensitivity to back reflection so that the desired linewidth and/or RIN of the DFB sources may be compromised. However, there are several means and ways in which improved and successful performance of a plurality of lasers and modulators in an EIAL PIC may be accomplished.

First, the deployment of complex-coupled gratings and/or a grating phase shift in the DFB grating region provides for successful laser array operation through discouragement of the influence of back reflections from the modulator array as well as enhancement of the single mode stability of the lasers. With respect a phase shift in the DFB gratings, the phase shift can be a single or multiple phase shifts in the grating. As one example, a grating phase shift may nominally be a one-quarter wavelength shift but it may be some other value depending upon achieving optimum results in obtaining strong single mode operation through splitting the degeneracy of the forward propagating and reverse propagating modes in the DFB region. As used herein, complex-coupled gratings means either a loss coupled grating, a gain coupled grating, or a gain or loss plus index coupled grating, all of which are known in the art. The deployment of a complex-coupled grating and/or grating phase shift enhances the range of positively detuned wavelengths in the EIAL approach taught herein which the DFB lasers may operate with sufficient performance and also provides high yield for single mode operation which is required in making integrated arrays of such semiconductor devices versus discrete semiconductor devices. This phenomenon was not previously known as far as the inventors are aware principally because such PIC chips of the type first disclosed in the above identified and incorporated patent applications where such chips have a plurality of semiconductor laser sources each integrated with a corresponding semiconductor modulator as disclosed herein have not been previously disclosed or investigated. The deployment of complex-coupled gratings in discrete EMLs is known for achieving immunity to back reflections as reported, for example, by R. Salvatore et al. in the article entitled, "Electroabsorption Modulated Laser for Long Transmission Spans", *IEEE Journal of Quantum Electronics*, Vol. 38(5), pp. 464-476, May, 2002, but not for the purposes of achieving a wider band of stable operating wavelengths relative to a fixed gain peak in an identical active layer (IAL). Heretofore, it was not known to deploy complex-coupled gratings or grating phase shifts in laser arrays in a PIC for providing, in a stable manner, an extended emission wavelength band for operating N laser sources all on the same chip each operating at a designated positively detuned wavelength.

Second, deployment of different longitudinal lengths or waveguide widths of laser sources along the laser source array to selectively reduce the non-uniformity laser thresholds and operational currents.

Third, render the band of laser emission wavelengths, $\lambda_1$ to $\lambda_N$, of the laser array smaller by decreasing the signal channel spacing between the emission wavelengths of the respective laser sources such as, for example, by reducing the spacing from 400 GHz or 200 GHz to 100 GHz or 50 GHz channel spacing. Reduction of channel spacing on the optical transmitter side renders the issue of channel crosstalk, ASE and other noise on the optical receiver side a larger problem. However, a way of overcoming this issue is to improve the BER performance by employing electronic signal processing, (e.g., pre-emphasis, electronic equalization, electronic dispersion compensation (EDC) or forward error correction (FEC)) to improve the PIC BER over a given operating range which counterbalances the increased crosstalk penalty at the optical receiver.

Fourth, fabricate the active region of the EIAL PICs with AlInGaAs (AQ) instead of InGaAsP (PQ). The deployment of AQ in the active region provides for better uniformity across the laser array in terms of lower current threshold and higher operating efficiency. The AQ active region may be comprised of AQ quantum wells or AQ quantum barriers or Al-containing confinement layers or a combination of any of the foregoing. Employing AQ in the quantum well or quantum barrier active region provides for a better band structure which translates into improved laser characteristics and/or a wider optical operation window for the modulated sources and/or lower BER performance relative to a multiple integrated array on a PIC was not previous known or suggested in the art. Also, the employment of an AQ active region over a PQ active region has the advantage that AQ is more stable performance than PQ during the growth processes. AQ quantum wells also have a lesser tendency to intermix upon the epitaxial growth of subsequent semiconductor layers. Also, AQ active layers tend to exhibit better in-wafer, as well as wafer-to-wafer and epitaxial run-to-epitaxial run, active region wavelength uniformity. In this connection, when dealing with multiple integrated laser sources on a PIC, it is important that the gain peak of the active region remains the same as well as the targeted laser emission wavelength or the operation window does not change. Also, as mentioned previously, the enhanced band structure (larger conduction band offset) of the AQ active region of the laser provides enhanced laser performance (threshold, efficiency, spectral) over an extended operating window of positively detuned wavelengths thus enabling a practical EIAL TxPIC for many applications that would not be feasible for a PQ-IAL TxPIC. Also, lower valance band offset ($\Delta E_V$) provides enhanced modulator performance (lower BER and a wider operation window).

Fifth, provide for electronic signal processing (ESP) either at the optical transmitter comprising the TxPIC or at the optical receiver. Such electronic signal processing at the optical receiver is taught, in part, in U.S. nonprovisional application Ser. No. 10/888,329, filed Jul. 9, 2004, filed May 20, 2003, and Ser. No. 10/267,304, filed Oct. 8, 2002, also published on Feb. 19, 2004 as U.S. Pub. No. 2004/0033004A1, which patent applications are incorporated herein by their reference. ESP allows for a more lower quality transmission to be realized and corrected at the optical receiver, the operation window at the modulator can be effectively wider which, in turn, allows the range of positive detuning at the laser array to be of a larger extent as equalization expands the acceptable operation window and/or the range of laser emission wavelengths. The latter is due to the ability of ESP to compensate for numerous transmission penalties including penalties that arise from RIN, linewidth or SMSR degradation or dispersion penalties, all of which may increase as the span of emission wavelengths, $\lambda_1, \ldots, \lambda_N$, increases in an EIAL PIC.

Sixth, employ trim SAG to orchestrate the detuned wavelengths of the laser array within the operating wavelength window of the modulator array. Trim SAG is a small amount of SAG bandgap shift, due to changes in layer thickness and/or material composition, formed in the as-grown bandgap of the active region of the DFB array or the MOD array or both. The amount of trim SAG is approximately less than or equal to the array element wavelength spacing and is a much smaller amount, e.g., about 1 nm to about 20 nm, compared to typical SAG employed in EMLs, which is typically as much as about 25 nm to about 60 nm to facilitate a blue shift between the DFB laser and the EAM. The change in wavelength due to the use of trim SAG ($\Delta\lambda_{Trim\ SAG}$ may be defined as equal to or less than $(N-1)\Delta\lambda_{channel\ spacing}$ where N is the number of laser sources/modulators and $\Delta\lambda$ is the array spectrum span. The inventors have found that small SAG shifts described as trim SAG have significantly improved material uniformity compared to conventionally employ larger SAG shifts. From a yield/reproducibility perspective, it is preferable to use trim SAG for the modulator array prior to any employment of trim SAG of the DFB laser array, if possible, as SAG may still affect the accuracy of attaining targeted operating wavelengths of the DFB lasers fabricated in the PIC. The DFB lasers are much more sensitive to performance variations, including their set emission wavelengths, than the modulators. In either case, trim SAG can be applied in many different ways across the array, such as, the application of trim SAG to every electro-optic element in the array except the first array component; the application of trim SAG to every other electro-optic element in the array, the application to trim SAG to every $j^{TH}$ electro-optic element out of a total of N electro-optic elements in the array, or the application of trim SAG to a portion or group of electro-optic elements of the array. The easiest approach in adopting trim SAG, from the processing and yield point of view, is to employ trim SAG across several elements of the EAM array. The more variations of the application of trim SAG to the modulator array, the DFB array or both, increase the amount of time that must be devoted to measuring the SAG shifts as well as decrease the amount of yield that will be achieved. Ultimately, the use of trim SAG helps compensate for the finite width of the modulator operating window and/or range of laser positively wavelength detuning that can be achieved through EIAL PIC.

In summary, then, the operating conditions of compromised DFB lasers due to the deployment of an EIAL in a TxPIC chip can be improved through the use of complex-coupled gratings and/or phase shift gratings, controlling the laser array spectrum span, use of AQ in the active region, the use of electronic signal processing (e.g., pre-emphasis, equalization, electronic dispersion compensation (EDC) or FEC), the deployment of trim SAG, or any combination of the foregoing. Also, the use of AQ in the active region of the TxPIC, providing a phase shifted and/or complex-coupled grating in the laser sources, providing for PIC electronic signal processing, and reducing the laser array spectrum span to less than 30 nm will all contribute toward better performance of the modulator array and/or widening the emission wavelength window of acceptable performance for a positively detuned DFB laser array.

Other objects and attainments together with a fuller understanding of the invention will become apparent and appreciated by referring to the following description and claims taken in conjunction with the accompanying drawings. The drawings are not necessarily to scale so that emphasis instead is placed on the principals and features of the invention.

It should be importantly noted that the novel application of systematic bias compensation applied in this disclosure to a plurality of channels sharing an EIAL in a transmitter photonic integrated circuit (TxPIC) can be easily applied in other applications such as, but not limited to, the application of inexpensive and short distance multimode fibers (MMFs), such as plastic optical fibers, for transport of digital or analog signals or other communication between devices, or free space transmitting applications such as between satellites in space, from chip-to-to chip in an electronic circuit, and in other applications using other wavelengths or wavelength bands where the laser sources on the PIC would be fabricated with other materials such as, but not limited to, AlGaAs 850 nm modulated emitters or to other wavelength band emitters and elements sharing the same EIAL. Also, the TxPIC discussed in this disclosure is directed to an Indium (In)-based regime for the TxPIC chip. However, as it will be evident to those skilled in the art, the material regime could be a non-In-based regime for other applications as indicated above, for example, for an 850 nm wavelength band or nitride-based material regimes.

BRIEF DESCRIPTION OF THE DRAWINGS

In the drawings wherein, in the several embodiments, like reference symbols refer to like part in the several embodiments:

FIG. 1 is a schematic plan view of a particular kind of photonic integrated circuit (PIC) comprising an optical transmitter photonic integrated circuit (TxPIC) chip.

FIG. 2A is a schematic longitudinal side sectional view relative to FIG. 1 illustrating one of the signal channels of the TxPIC chip as integrated to an optical combiner.

FIG. 2B is a schematic longitudinal side sectional view of a first embodiment of this invention illustrating one of the signal channels of the TxPIC chip as shown in FIG. 1 as integrated to an optical combiner.

FIG. 2C is a schematic longitudinal side sectional view of a second embodiment of this invention illustrating one of the signal channels of the TxPIC chip as shown in FIG. 1 as integrated to an optical combiner.

FIG. 2D is a schematic longitudinal side sectional view of a third embodiment of this invention illustrating one of the signal channels of the TxPIC chip as shown in FIG. 1 as integrated to an optical combiner.

FIG. 2E is a schematic longitudinal side sectional view of a four embodiment of this invention illustrating one of the signal channels of the TxPIC chip as shown in FIG. 1 as integrated to an optical combiner.

FIG. 2F is a flow chart illustrating in the structure of the TxPIC chip shown in FIG. 1 the different points, (A1), (A2), (A3), (A4) and (A5), in TxPIC fabrication where a periodic grating for each the laser sources may be formed.

FIG. 2G is a flow chart illustrating the principal fabrication steps for the first TxPIC embodiment shown in FIG. 2B that requires three epitaxial steps.

FIG. 2H is a flow chart illustrating the principal fabrication steps for the second TxPIC embodiment shown in FIG. 2C that requires three epitaxial steps.

FIG. 2I is a flow chart illustrating the principal fabrication steps for the third TxPIC embodiment shown in FIG. 2D that requires three epitaxial steps.

FIG. 2J is a flow chart illustrating the principal fabrication steps for the fourth TxPIC embodiment shown in FIG. 2E that requires three epitaxial steps.

FIG. 2K is a first flow chart illustrating the principal fabrication steps for a TxPIC that requires two epitaxial steps of growth.

FIG. 2L is a second flow chart illustrating the principal fabrication steps for a TxPIC that requires only two epitaxial steps of growth.

FIG. 2M is a third flow chart illustrating the principal fabrication steps for a TxPIC that requires only two epitaxial steps of growth.

FIG. 2N is a fourth flow chart illustrating the principal fabrication steps for a TxPIC that requires only one epitaxial step of growth.

FIG. 2O is a fifth flow chart illustrating the principal fabrication steps for a TxPIC that requires only one epitaxial step of growth.

FIG. 2P is a sixth flow chart illustrating the principal fabrication steps for a TxPIC that requires only one epitaxial step of growth.

FIG. 2Q is a seventh flow chart illustrating the principal fabrication steps for a TxPIC that requires only one epitaxial step of growth.

FIG. 3 is a graphic bar chart illustration which shows typical ranges of the operation window for an optimized AQ EIAL active region as compared to the operation window with an optimized PQ EIAL active region with equivalent modulator specifications for the modulator operation window.

FIG. 4 is a graphic illustration of a series LI curves for one set of PIC array lasers having an EIAL AQ active region and another set of PIC array lasers having a EIAL PQ active region where all laser sources in a given PIC share the same active region.

FIG. 5 is a graphic illustration of the gain or PL curve versus wavelength for a conventional laser emission wavelength offset from the laser active region wavelength, i.e., negatively detuned from the photoluminescence (PL) peak of its active region.

FIG. 6 is a graphic illustration of the gain or PL curve versus wavelength for any EML with its laser emission wavelength offset from the modulator active region wavelength photoluminescence (PL) peak, i.e., positively detuned from the PL peak of the modulator active region.

FIG. 7 is a graphic illustration of the gain or PL curve for an EIAL PIC with a group of integrated laser sources on a PIC which have a band of emission linewidths all with positively detuned offsets from a single EIAL active region photoluminescence (PL) peak as taught in this invention.

FIG. 8 is a schematic side view of a first embodiment of an index-coupled active region that may be utilized in the fabrication of the DFB lasers of FIGS. 1 and 2.

FIG. 9 is a schematic side view of a second embodiment of a gain/index-coupled active region that may be utilized in the fabrication of the DFB lasers of FIGS. 1 and 2.

FIG. 10 is a schematic side view of a third embodiment of a gain (loss)/index-coupled active region that may be utilized in the fabrication of the DFB lasers of FIGS. 1 and 2.

FIG. 11 is a graphic illustration of a comparison between employments of SAG versus trim SAG relative to the amount of total wavelength error variation from the target wavelength versus the total SAG shift (nm) for deposited active region material.

FIG. 12 is a graphic representation of power versus current curves for N channels of laser sources on an EIAL PIC wherein all laser sources share the same active region.

FIG. 13 is a schematic plan view of another embodiment of an optical transmitter photonic integrated circuit (TxPIC) where each signal channel also includes a power equalizing element comprising VOA to reduce the power output from the laser sources so as not to drive the modulators into saturation and also, in addition, to adjust for power setting across the laser source array by varying only the insertion loss across the array.

FIG. 14 is a schematic plan view of another embodiment of an optical transmitter photonic integrated circuit (TxPIC) where each channel includes a power setting element after the modulator to adjust for power leveling or tilting across the modulated source array by varying the gain, loss or insertion loss, respectively, in each channel.

FIG. 15 is a schematic plan view of another embodiment of an optical transmitter photonic integrated circuit (TxPIC) utilizing a plurality of extended identical active layers (EIAL).

DETAILED DESCRIPTION OF THE INVENTION

Before detailed explanation of embodiments comprising this invention, further reference is made to the meaning of certain words or terms employed in this description. The terms, "laser(s)" and "laser source(s)" are used synonymously. As used herein, "modulated sources" means laser sources having an external modulator. Reference in this description to an integrated laser source/modulator signal channels is nominally a laser source and its associated modulator forming a modulated source and providing a modulated signal output. In this context, such a channel is also an optical waveguide with accompanying integrated elements, such as a laser source, a modulator and photodetector.

Further, it is within the scope of this invention that some channels may be "dummy" channels for the purpose of redundancy or for PIC chip testing purposes. It should be noted that other signal channels may also be integrated in a PIC, such as, for example, an integrated modulated source or a directly modulated laser source on the same transmitter chip that functions as an optical service channel or OSC. For example, in a TxPIC, the multiple channel laser sources/modulators may at least partially contain an EIAL or all contain an EIAL where the OSC modulated source may be fabricated in the same active region (EIAL) or with a separate active region from the on-chip common active region, for example, through an epitaxial regrowth. Further, the active region of the OSC may be part of the laser source/modulator EIAL but subjected to selective area growth (SAG) so that, in either case, the active region of the OSC modulated source on a TxPIC has a different signal wavelength, such as, but not limited to, a service channel wavelength outside of the wavelength signal band (such as outside of the C band, L band and S band) of PIC assigned channel signals.

Also, the PIC signal channels may also include other elements in each signal channels on a PIC, such as, but not limited to, PCEs and MFEs. The electro-optic components in PIC signal channels that have EIAL modulated sources may or may not share or contain the same identical active layer. Also, in the signal channels, the lateral extent of the channel waveguide structure (lateral as opposed to the longitudinal), as well as perpendicular to the as-grown layers, may be a buried waveguide, or a ridge waveguide, such as a shallow ridge or deep ridge waveguide, which types of waveguides are known in the art. The lateral waveguide structure for the laser sources may be the same as the lateral waveguide structure for the modulators or may be different from the lateral waveguide structure for the modulators. Also, it should be noted that the lateral waveguide extent for channel modulated sources may be different for lasers and modulators in each PIC channel. For example, as previously indicated, the laser sources may be geometrically configured to have buried waveguides while their associated modulators may be geometrically configured to have a ridge waveguide or vice versa.

Further, "active region" as employed in the description in this application means the region in a semiconductor device where carrier recombination and/or light absorption occurs which may be comprised of a single semiconductor active layer or multiple semiconductor layers with any associated optical confinement layers, as is well known to those skilled in the art. An active layer, for example, may be a single high refractive index active layer or may be multiple active layers such as in the case of multiple quantum well layers and barrier layers which are, together, commonly referred to as an active region.

Reference is now made to FIG. 1 which illustrates a TxPIC chip 10 to which the features of this invention may be applied. It should be noted that some of the attributes of this invention are equally applicable to any other PICs, such as optical receiver photonic integrated circuit (RxPIC) chips which are disclosed in detail U.S. patent application Ser. No. 10/267,304, filed Oct. 8, 2002, also incorporated herein by its reference, and any other such PICs containing integrated active or electro-optic components as well as passive optical components.

TxPIC chip 10 is an In-based chip, the details of which are disclosed in U.S. patent application Ser. No. 10/267,331, supra. As shown in FIG. 1, monolithic PIC chip 10 comprises groups of integrated and optically coupled active and passive components including an integrated array of laser sources 12, such as DFB semiconductor lasers or DBR semiconductor lasers. Each laser source 12 operates at a different wavelength, $\lambda_1, \ldots, \lambda_N$, from one another where the group of wavelengths provides a wavelength grid commensurate with a standardized wavelength grid, such as the ITU wavelength grid. At the rear extent of laser sources 12 are rear photodetectors 11 (RPDs), which are optional. Photodetectors 11 may be, for example, PIN, MSM or avalanche photodiodes (APDs). Laser sources 12 are provided with an associated modulator 14 as shown in the example here. Thus, the CW outputs of laser sources 12 are shown optically coupled to respective modulators 14. Modulators 14 may be electro-absorption modulators (EAMs), Mach-Zehnder modulators (MZMs) or bandedge Mach-Zehnder modulators as detailed in patent application Ser. No. 10/267,331, supra, but EAMs are preferred modulators for the embodiments herein. EAMs 14 each apply an electrical modulated signal to the cw light from laser sources 12 producing an optical modulated signal for transmission on an optical link of an optical transmission network. The modulated outputs from modulators 14 are optically coupled to a signal channel, front end element 16 which may be an integrated channel photodetector or front photodetector (FPD), a variable optical attenuator (VOA), a semiconductor optical amplifier (SOA), a combination VOA/SOA, a tone applicator for channel tagging or an appropriate combination of one or more of the foregoing elements. Elements 16 may also be a passive element too. Such components and their possible geometries are discussed in length in U.S. provisional application Ser. No. 60/625,322, filed Oct. 28, 2004, which application is incorporated herein by its reference. These components are referred to in that application as amplitude varying elements (AVEs) rather power changing elements (PCEs), the latter of which is defined somewhat broader in scope in this disclosure, and electro optic multi-functional elements (MFEs). The on-chip deployment of elements 16 is optional. Elements 16 may also be fabricated off-axis of the laser source output by means of an on-chip optical tap to provide a small portion of the modulated output to the photodetector. Front elements 16 comprising photodetectors may be PIN photodiodes, MSMs, or avalanche photodiodes (APDs). Photodetectors 11 and 16 may be employed to monitor the output power from the respective laser sources 12 while being subjected to in-wafer testing (prior to any wafer singulation), during die testing, in-package module testing, or during PIC operation as a monitoring device. Alternatively, elements 16 may also function as variable optical attenuators (VOAs) under negative bias in order to achieve a desired power setting (substantially the same or tilted) across all of the PIC channels. In such a case, element 16 can functionally be both a photodetector for monitoring and at other times a VOA for power setting thereby comprising a multifunctional element (MFE). Further, alternatively, elements 16 may be on-chip semiconductor optical amplifiers (SOAs) under positive bias to enhance the power of individual modulated laser sources and/or provide power setting across the array of modulated sources. Also, a different frequency tone may be applied to each element 16 to provide for tagging or device identification of any active element or component as described in some extent in U.S. patent application Ser. No. 10/267,330, filed Oct. 8, 2002, supra. It should be noted that any of the foregoing functions relating to monitoring, VOA, SOA and tone modulation can implemented in any desired combination hereof including the case of performing together all of those functions.

The modulated optical signal outputs of modulators 14, via front end elements 16, are respectively coupled to an on-chip wavelength selective combiner, shown here as an arrayed waveguide grating or AWG 20 via optical input waveguides 18. It is within the scope of this invention to include other wavelength-selective combiners or decombiners, as the case may be, such as Echelle gratings, cascaded Mach-Zehnder interferometers (MZIs), broadband multiplexers of the type shown, for example, in U.S. Pat. No. 6,580,844 (which is also incorporated herein by its reference), so-called free-space diffraction gratings (FSDGs) or quasi wavelength selective star couplers having a multimode coupling region comprised of waveguides as disclosed in U.S. patent application, U.S. Pub. No. 2003/0012510 (which is also incorporated herein by its reference). Such wavelength-selective combiners or multiplexers are more conducive to high channel signal counts on TxPIC chips. However, it is within the scope of this invention to practice the invention in connection with free space combiners, such as power couplers, star couplers or MMI couplers which can be employed in particular circumstances. Each of the laser source/modulator combinations or, for example, semiconductor modulator/lasers (SMLs) is, therefore, representative of a single optical signal channel on TxPIC chip 10 such as, for example, as many as forty signal channels or more. There is a plurality of N channels on each TxPIC chip 10 and, in the case of FIG. 1, ten such channels are shown as numbered one through ten. There may be less than 10 channels or more than 10 channels formed on chip 10. In FIG. 1, the output of each signal channel from a respective SML is coupled to a respective waveguide 18(1) to 18(10) to the zero order Brillouin zone input of AWG 20.

Each signal channel is typically assigned a minimum channel spacing or bandwidth to avoid crosstalk with other adjacent optical channels. Currently, for example, 50 GHz, 100 GHz, 200 GHz or 400 GHz are common channel spacings between channels.

Metal interconnects between bondpads (not shown) and electro-optic components are at least partly formed on a surface of an isolation or passivation medium deposited over PIC chip 10. A dielectric medium is often employed to passivate and permit uniform planarization of the surface of chip 10. Such a medium may be, for example, SiO, $SiO_2$, SiN, SiON, polyimide, BCB, ZnS, ZnSe or SOG. High k dielectric mediums where k is a refractive index equal to or greater than 1.4, such as BCB, ZnS, ZnSe, SiO, SiN, or SiON may be also employed as a cladding layer over passive components such as over the region of AWG 20.

As indicated above, the respective modulated outputs from modulators 14 are coupled into optical waveguides 18(1) to 18(10), via other electro-optic components such as photodetectors 16 to the input of AWG 20 as shown in FIG. 1. AWG 20 comprises an input free space region 19 coupled to a plurality of diffraction grating waveguides 21 which are coupled to an output free space region 22. The multiplexed optical signal output from AWG 20 is shown as provided to a plurality of output waveguides 23 are output verniers along the zero order Brillouin zone at output face 22A of free space region 22 of AWG 20. However, the deployment of verniers is optional and, therefore, the output may be a single waveguide. Output waveguides 23 extend to output facet 29 of TxPIC chip 10 where a selected vernier output 23 may be optically coupled to an output fiber (not shown). Vernier outputs 23 may also be disposed at a small angle relative to a line normal to the plane of output facet 29 to prevent internal reflections from facet 29 back into vernier outputs 23 that may affect stabilized laser wavelength operation of laser source 12. The deployment of multiple vernier outputs 23 provides a means by which the best or optimum output from AWG 20 can be selected having the best match of the wavelength grid passband of AWG 20 with the established wavelength grid of the group of channel signal outputs from the array of laser sources 12. Three vernier outputs 23 are shown in FIG. 1. It should be realized that any number of such vernier outputs may be utilized beginning with the provision of two such vernier outputs. Also, the number of such vernier outputs may be an odd or even number.

In operation, AWG 20 receives N optical signals, $\lambda_1, \ldots, \lambda_N$, from coupled input waveguides 18 which signals propagate through input free space region 19 where the wavelengths are distributed into the diffraction grating waveguides 21. The diffraction grating waveguides 21 are plurality of grating arms of different lengths, $\Delta L$, relative to adjacent waveguide, so that a predetermined phase difference is established in waveguides 21 according to the wavelengths $\lambda_1, \ldots, \lambda_N$. Due to the predetermined phase difference among the wavelengths in grating arms 21, the focusing position of each of the signals in grating arms 21 in output free space region 22 are substantially the same so that the respective signal wavelengths, $\lambda_1, \ldots, \lambda_N$, are focused predominately at the center portion or the zero order Brillouin zone of output face 22A. Verniers 23 receive various passband representations of the multiplexed signal output from AWG 20. Higher order Brillouin zones along output face 22A receive repeated passband representations of the multiplexed signal output but at lower intensities. The focus of the grating arm outputs to the zero order Brillouin zone may not be uniform along face 22A, comprising this zero order, due to inaccuracies inherent in fabrication techniques employed in the manufacture of chip 10 and AWG 20. However, with multiple output verniers, an output vernier can be selected having the best or optimum combined signal output in terms of power and power setting.

Reference is now made to FIG. 2A illustrating a typical side elevation of a TxPIC chip 10. TxPIC chip 10A comprises three integrated regions: laser array region 13 comprising laser sources 12, modulator array region 15 comprising modulators 14, and optical combiner field 18 containing an optical combiner 20. Laser region 13 in this and subsequent embodiments is shown as a DFB array laser which is preferred although the array may, instead, comprise DBR lasers. Also, the modulator array region 14 may be comprised of an electroabsorption modulator array or a Mach-Zehnder modulator array or other such modulators as previously indicated, although an electroabsorption modulator array is preferred. The optical combiner 20 in optical combiner field 18 may be any of the previously indicated combiners or multiplexers although the arrayed waveguide grating (AWG) is preferred. Also, TxPIC chip 10 in FIG. 2A may optionally include a spot size converter (SSC) region 30 to shape the output beam from combiner 20 for higher off-chip optical coupling efficiency, such as with optical coupling to a single mode fiber. For purposes of simplicity to illustrate inventive features, reference to PIN photodiodes or elements 11 and 16 or other electro-optical or passive optical components that may be integrated on TxPIC chip 10, described elsewhere herein, are omitted.

The epitaxial growth method for the embodiments to be now explained may be MOCVD or MBE and their commonly known derivative epitaxial processes. The semiconductor structure for TxPIC chip 10 may be three or more epitaxial growths initiated on a substrate. As seen in FIG. 2A, these growth steps provide for epitaxial layers to be formed on a substrate (wafer), as such as an InP:Fe or n-InP substrate 32, followed by, for example, base layers which are commonly an n-InP buffer layer and confinement layer 34, a grating layer 40, such as, for example, AlInGaAs (AQ), InGaAsP (PQ) or InAlGaAsP (APP), followed by the formation of periodic gratings in laser region 13 of grating layer 40, where each grating principally sets the emission wavelength of a laser source. This is followed by the growth of a planarization/spacer layer 38, which may be a number of different III-V compounds but nominally InP. This is then followed by growth of the active region 42 comprising multiple quantum wells and barriers of InGaAsP ("PQ"), AlInGaAs ("AQ"), InAlGaAsP ("APP"), InGaAs, InGaAsN, InAsP, InGaAsNSb or InAlGaAsN (including confinement layers that are not shown), but preferably an Al-containing active region where at least one layer in the active region contains an Al-containing Group III-V compound. This is, then, followed by the growth of a cladding layer 46, here shown as a p-InP layer 46A in laser region 13 and modulator region 15 and a cap layer 48 which may be P++-InGaAs. In the combiner region 18, the layers 42B and 46B are fabricated differently than the laser and modulator regions. Layer 46B may be comprised of non-intentionally doped (NID) or low doped n-InP layer in combiner field 18, such as for example, NID-InP or NID-AlInAs, or n-InP or n-AlInAs, respectively. This different fabrication may be carried out by an etchback and regrowth as will be discussed later below. A cap layer 48 is non-existent in the combiner field 18 and, instead, an optional passivation layer 36, such as, for example, BCB, may be provided in combiner field 18. Thus, should be noted that the portions of the active layer 42A formed in the laser and modulator regions 13 and 15 are not the same as the active waveguide core 42B in combiner field 18, the latter being formed with a higher bandgap and low refractive index compound compared to active region 42A comprised of, for example, 1.5 nm Q (1.5Q) and waveguide core 42B may be, for example, may be in the range of about 1.1 nm Q to about 1.4 nm Q, e.g., 1.3 nm Q (1.3Q). Also, the portion 40B of the grating layer 40 in combiner field 18 is optional, i.e., it may be omitted during fabrication either by etching or masking. Electrodes 44 and 46 are then deposited for laser sources 13 and modulators 15, such as by evaporation. Other semiconductor layers may be incorporated into this structure but are not necessary to illustrate the embodiments of this invention.

Reference is now made to FIGS. 2B-2E and their respective companion flow charts FIGS. 2G-2J which illustrate various epitaxial approaches in the manufacture of TxPIC 10, in particular, the epitaxial growth of regions 13 and 15 as opposed to combiner field 18 or vice versa. In FIGS. 2B to 2E, the passive region, waveguide core 42B or 42Y in these embodiments may be, for example, 1.3 AQ or PQ or APP, while active region active layer(s) may be, for example, 1.5 AQ, PQ, APP, InGaAs, InGaAsN, InAsP, InGaAsNSb or InAlGaAsN, preferably an Al-containing active region where at least one layer in the active region contains an Al-containing Group III-V compound. Relative to the flowcharts of FIGS. 2G-2J, as well as subsequent flow charts of FIGS. 2F and 2K, the steps of forming butt joints is the etch back of either regions 13 and 15 or field 18, respectively, and the regrowth in these etched regions to form a butt joint with the adjacent, previously grown layers.

In the several embodiment of FIGS. 2B-2E, the epitaxial growth is accomplished in three growth steps as seen in their accompanying flowcharts of FIGS. 2G-2J. In FIG. 2B and its accompanying flow chart of FIG. 2G, the first epitaxial growth (See (1) in FIG. 2G) is the growth on the base usually comprising a buffer layer and lower cladding layer 34 followed by grating layer 40A. The "Grow Base" in the figures generally indicates the growth of these three layers in subsequent figures, yet to be explained, except where the grating layer is positioned above the active region. At this point, the first epitaxial growth step is complete and a DFB periodic grating is formed in region 13 across chip 10 for each of the laser sources 12 with respectively different grating periods to provide a series of detuned transmission wavelengths (within a defined limit for EIAL active regions) and where the resultant laser emission wavelengths approximate a series of emission wavelengths on a predetermined wavelength grid. The formation of DFB gratings is well established in the art. This is followed by a second epitaxial step comprising the growth of planarization/spacer layer 38A, active region 42A, upper cladding layer 46A and cap layer 48 (See (2) in FIG. 2G). As seen in FIG. 2G, this growth is followed by an etchback 37 only in the optical combiner field 18 comprising layers 48, 46A and 42A in region 18. Optionally, etchback 37 may be extended through to include layers 38A and optimally 40A as indicated by the dotted line in FIG. 2B. Next, a third epitaxial growth (See (3) in FIG. 2G) is accomplished comprising the regrowth a waveguide core 42B and cladding layer 46B of NID- or low doped n-InP. Waveguide core 40B is a higher bandgap and low refractive index layer of, for example, 1.1-1.4 AQ, PQ, ATT, APP or APN. If layers 38A and 40A are also removed, then optionally these layers may be replaced in this third regrowth step either by cladding layer 38B or by a waveguide layer 40B and cladding layer 38B.

It should be noted, as it will be aware of those skilled in the art, in the foregoing embodiment as well as subsequent embodiments, that instead of the step of etchback 37, a masking step(s) in the optical combiner region before a first epitaxial growth step of growing the grating layer or before the second epitaxial step of growing the active region for the laser/modulator array regions while masking the optical combiner region, followed by removing the optical combiner region mask and growing the layers for the combiner, including its waveguide core layer during a third epitaxial growth step. During this third growth step, the first growth in the laser/modulator array regions may be either masked and later removed or these epitaxial layers from the third growth step may be permitted to grow over those regions and subsequently removed by etching.

The formation of the lateral waveguide structures for either region 13 and 15, or both, may be accomplished through the employment of a buried heterostructure or ridge waveguide as is known in the art for any of the embodiments shown. The ridge waveguides are formed by a selective etchback as known in the art.

It should be further noted that, in the embodiment of FIG. 2B, the order or sequence of the second and third growth steps may be essentially reversed as is illustrated in the embodiment of FIG. 2C and the accompanying flow chart of FIG. 2H. This has the advantage of placing the growth of p-type doped layers in the last epitaxial growth step minimizing incidental or non-intentional diffusion of the p-type dopant, particularly into adjacent non-doped regions or low-doped regions of opposite conductivity type. In FIG. 2C, after the completion of the first epitaxial growth (See (1) in FIG. 2H), and the formation of the laser source gratings in grating layer 40A in laser region 13, the second epitaxial growth (See (2) in FIG. 2H) comprises growth of spacer layer 38A, waveguide core 42B and cladding layer 46B. Then, as indicated in FIG. 2H, an etchback 37 is performed in laser and modulator regions 13 and 15 of layers 46B and 42B. This is followed by a third epitaxial regrowth step (See (3) in FIG. 2H) of active region 42A, cladding layer 46A and cap layer 48.

In the previous embodiments, it will be noted that the formation of grating layer 40A is below active region 42A. In the embodiment in FIG. 2D and the accompanying flow chart of FIG. 2I, grating layer 40X is formed above active region 42X so that the sequence of the layer growths relative to these two particular layers is reversed in the first and second epitaxial growth steps compared to the growth sequence in the embodiments of FIGS. 2B and 2C. Except for the change in placement of grating layer 40X, this embodiment of FIG. 2D is essentially the same as the embodiment in FIG. 2B. The first epitaxial step (See (1) in FIG. 2I) is the growth of the base layers 34, active region 42X, spacer layer 38A followed lastly by grating layer 40X. After formation of the gratings in laser region 13, the second epitaxial step (See (2) in FIG. 2I) entails the growth of upper clad layer 46A and cap layer 48. Then, as indicated in flowchart of FIG. 2I, an etchback 37 is formed in optical combiner field 18 removing the field portions of layers 46A, 40X, 38A and 42X. This is followed by the third epitaxial step (See (3) in FIG. 2I), comprising the regrowth of a waveguide core 42Y and cladding layer 46B in combiner field 18.

The embodiment shown in FIG. 2E is similar to the embodiment of FIG. 2C except that the growth of active region 42X is in the first epitaxial growth step rather than in the second epitaxial growth step, which latter growth step includes the growth of grating layer 40X. The first epitaxial growth step includes layers 34, waveguide core 42B and cladding layer 46B. As indicated in the accompanying flowchart of FIG. 2J for the structure of FIG. 2E, the first epitaxial growth (See (1) in FIG. 2J) is followed by an etchback of layers 46B and 42B in the laser and modulator regions 13 and 15. Thence, the second growth step (See (2) in FIG. 2J) comprises growth of active region 42X, spacer region 38A and grating layer 40X. This is followed be formation of the grating in laser region 13 of grating layer 40X. Thence, the third epitaxial growth step (See (3) in FIG. 2J) is performed comprising the growth of cladding layer 46A and cap layer 48. A planarization layer may precede the growth of layer 46A to bring about planarization over the formed grating in grating layer 40X as known in the art.

In all of the foregoing embodiments, etchback in many cases may slightly extend into an adjacent lower layer, for example, where the etching depth is to be terminated. After such etchbacks, initiation of the next growth step can be commenced with a small regrowth replacement of such a layer, such as, for example, layer 34 in FIGS. 2B and 2D, prior to the growth of the next succeeding layer, such as, optional waveguide core layer 40B or waveguide core 42Y.

Variations on the above embodiments as to the exact placement of the regrown interfaces and the order of the growth steps as known to those skilled in the art may also be employed to realize a TxPIC with an EIAL structure. This includes the utilization of SAG to provide for the application of trim SAG across the laser array region 13 and/or the modulator array regions 15. In this case, the embodiments to that do not include the simultaneous epitaxial growth of a thick upper confining layer over the active elements (lasers and modulators) as well as other permutations known to those skilled in the art.

Further, it should be realized that the signal channels may minimally comprise a pair of modulated sources in the same PIC where each modulated source is formed with a separate active region. Thus, for example, one or more modulated sources have a first IAL and one or more other modulated sources have a second IAL. Alternatively, one modulated source in a PIC may have a separate IAL forming one signal channel from at least one other modulated source that has an EIAL, i.e., additional elements, in addition to the modulated source of the same other channel, sharing the same IAL, or multiple modulated sources sharing the same EIAL. Further, there may be a plurality of EIALs, at least one modulated source sharing a first EIAL and at least a second modulated source sharing a second EIAL. The latter example with more than one EIAL of the three alternatives is illustrated in FIG. 15 wherein a first extended identical active layer ($1^{ST}$ EIAL), is illustrated with dashed box 51 which includes a first group of modulated sources 12, 14 comprising a first set of channels 1-5 with a first set of emission wavelengths $\lambda_1$ to $\lambda_5$, and a second extended identical active layer ($2^{ND}$ EIAL), is illustrated with dashed box 52 which includes a second group of modulated sources 12, 14 comprising a second set of channels 6-10 with a second set of emission wavelengths $\lambda_6$ to $\lambda_{10}$. The second group of laser sources at the $2^{ND}$ EIAL 52 may, for example, have a slightly higher bandgap active region compared to the first group of laser sources at the $1^{ST}$ EIAL 51. An alternative (more minimal) configuration for the second mentioned alternative above is where a modulated source with a first IAL is formed in the same PIC with a second modulated source formed in an EIAL in the same PIC, where the second modulated source includes additional elements in it's channel sharing the same extend identical active layer (EIAL) or additional modulated sources sharing the same extended identical active layer (EIAL).

Relative to FIG. 15 as well as other alternatives mentioned above, changes in active region wavelength relative to one or more elements in the different EIAL regions 51 and 52 can be accomplished with the use of trim SAG, which is explained later in greater detail, or through the formation of a butt-joint between adjacent elements in some or all of the channels by a selective etchback through the active region followed by a regrowth forming a new active region having a different bandgap and, therefore, active region wavelength. Also, the active region wavelength can be changed by impurity induced disordering (IID) for at least some of the TxPIC elements to selectively vary their active region wavelength. In addition, it should be noted that other elements outside of the EIAL region or regions in a TxPIC may have channel cores and/or channels within active regions that are not identical, including, for example, where a laser and a corresponding modulator are not in identical active regions.

In the foregoing embodiments, it will be realized that the placement of the grating layer 40A and 40X may, respectively, be either below or above the active region 42A and 42X. In this connection, reference is made to the flowchart of FIG. 2F which illustrates this at (A2) and (A3), respectively. However, as shown in FIG. 2F, it is within the scope of this invention to place the grating for laser region 13 external of the last epitaxial growth step, as illustrated at (A4) in FIG. 2F, either directly above the active region waveguide, which is illustrated in U.S. Pat. No. 4,722,092, or adjacent to either side of the active region waveguide, which is illustrated in U.S. Pat. Nos. 5,982,804, 6,291,256, 6,301,283, 6,573,116 and 6,500,687, all of which patents are incorporated herein by their reference. Further, it is with in the scope of this invention to place the grating for laser region 13 directly on the top surface of substrate 32, as illustrated at (A4) in FIG. 2F which is also disclosed in U.S. Pat. Nos. 5,960,257, 5,953,361, and 6,151,351, all of which patents are incorporated herein by their reference. Also, when the multiple channels on the PIC are etched to form ridge waveguides, the grating may be formed on the side of the channel ridge waveguide as indicated in FIG. 2F at (A5).

In all of the foregoing embodiments, in order to achieve an EIAL PIC with an optical combiner, there are at a minimum three epitaxial grow steps required to form TxPIC 10 and additional epitaxial steps may be necessary to extend PIC functionality or the number of channels on a PIC. However, the number of necessary or required epitaxial growth steps can be reduced two epitaxial growth steps as seen in the flowcharts of FIGS. 2K-2M. As seen in FIG. 2K, there is no grating layer, such as, for example, a grating layer 40A as seen in previous figures. Thus, the first epitaxial growth step comprises the base (such as, for example, cladding layer 34 in previous figures) and active region (such as active region 42A in previous figures) followed by an etchback (the identified step, "Etch to Form Butt Joint", in FIG. 2K) as shown relative to FIGS. 2B and 2C, either in field 18 or in array regions 13 and 15, respectively. Then, the last or second epitaxial growth step (See (2) in FIG. 2K) is the growth of the overlayers or cladding layers 46B and 42A or 46A, 42A and 48, respectively. This is followed by the formation of an external grating as taught in the previously mentioned U.S. patents and as seen at (A4) in FIG. 2F.

In the flowchart of FIG. 2L, the grating in layer 40A is formed after the first epitaxial growth step (See (1) in FIG. 2L) of base 34. This is then followed by the second epitaxial growth step (See (2) in FIG. 2L) of planarization/spacer layer 38A, active region 42A, cladding layer 46A and cap layer 48. Next, a selective implant or impurity induced disordering (IID), i.e., meaning confined to optical combiner field 18, is performed to convert active region 42A as-grown in field 18 into a higher index and lower bandgap waveguide core 46B through such an implant or disordering step as seen in FIG. 2L. Such an implant or disordering is well known in the art. After this step, the cap layer 48A overlying field 18 may be removed and optionally followed by the deposition of a high k dielectric layer where k is a refractive index equal to or greater than 1.4. The dielectric layer may be, for example, BCB, ZnS, SiO, $SiO_2$, SiN, SiON or ZnSe.

The two step epitaxial growth process of FIG. 2M is the same as that shown in FIG. 2L except for an addition of an etchback step in the optical combiner field 18 to remove the deposited cap layer 48 and cladding layer 46A in that field. This is followed by an implant or disordering to form the waveguide core 46A through either implant or disordering, as taught and known in the art, and may be followed with the deposition of a high k dielectric layer as cladding layer or additional cladding layer for waveguide core 42B, which may be, for example, BCB, ZnS, SiO, $SiO_2$, SiN, SiON or ZnSe.

In the foregoing examples of two-step epitaxial growth of FIGS. 2L and 2M, a masking step approach may be employed over the combiner field 18 in lieu of an etchback during the second epitaxial growth step (2) in FIGS. 2L and 2M, as previous explained.

Reference is now made to the flowcharts in FIGS. 2N-2Q which illustrate the employment of a single epitaxial growth step in processes related to the fabrication of TxPIC 10 instead of two or three epitaxial growth steps discussed in previous embodiments. In FIG. 2N, a grating is first formed directly in substrate 32 (as illustrated at (A1) in FIG. 2F) followed by a single epitaxial growth step of base 34, active region 42A, cladding layer 46A and cap layer 48. After this single epitaxial step, the cap layer 48A overlying field 18 may be removed, such as, by etching, followed by an implant or disordering to form the waveguide core 46A, as taught and known in the art, followed by the optional deposition of a high k dielectric layer. The dielectric layer may be, for example, BCB, ZnS, ZnSe, SiO, SiN or SiON.

The one step epitaxial growth process of FIG. 2O is the same as that shown in FIG. 2M except for an addition of an etchback step in the optical combiner field 18 to remove both the deposited cap layer 48 and cladding layer 46A in that field. This is followed by an implant or disordering to form the waveguide core 46A, as taught and known in the art, followed with the deposition of a high k dielectric layer as a cladding layer for waveguide core 42B, which may be, for example, BCB, ZnS, ZnSe, SiO, SiN or SiON.

In FIG. 2P, the grating for laser region 13 is grown as an external grating (illustrated at (A4) in FIG. 2F) as taught in the previously referenced patents. Thus, a single epitaxial step comprises the growth of base 34, active region 42A, cladding layer 46A and cap 48. The, grating is then formed by the formation of an external grating in region 13 which is followed by an implant or disordering step in optical combiner field 18 to render layer 24A in that field of lower refractive index and higher bandgap waveguide core 24B in field 18.

The single step epitaxial growth process of FIG. 2Q is the same as that shown in FIG. 2P except for an addition of an etchback step in the optical combiner field 18 to remove the deposited cap layer 48 and cladding layer 46A in that field. This is followed by an implant or disordering to form the waveguide core 46A, as taught and known in the art, followed with the deposition of a high k dielectric layer as a cladding layer for waveguide core 42B, which may be, for example, BCB, ZnS, SiO, $SiO_2$, SiN, SiON or ZnSe.

A major premise that drives the utilization of EIAL in TxPICs is the accuracy and reproducibility in transmission channel wavelengths and the achievable yields of PICs having a plurality of modulated source output wavelengths approximating a standardized or predetermined wavelength grid and achieving acceptable power levels and transmitted BER across the array. If the EIAL approach is extended to arrays of electro-optical components formed on a single semiconductor chip, the following advantages can be realized. First, less processing and regrowth steps are required with EIAL as compared to the employment of a SAG approach or a butt joint approach in the case where the butt joint is formed at the laser/modulator interface. Thus, the EIAL process is inherently a less complicated process and facilitates higher yields and increased capacity. Second, there are less chip yield losses due to integration such as might be caused by signal channel feedback reflections, "run-away" regrowth issues that cause greater insertion losses, reliability issues, etc. Third, there is greater complexity in employing the butt joint or SAG approaches to fabricate the modulated sources in a TxPIC because different epitaxial composition and different layer thicknesses (as well as different mask widths and heights) are required to achieve proper compositional and thickness control for both the laser and the modulator active regions as well as those regions from channel to channel.

The primary issue with the EIAL approach relative to a PIC is that the active region of the laser sources and modulators, being identical, there has to be some compromise or tradeoff with their required transmission performance and yet achieve the desired transmission wavelengths for the respective wavelengths of the laser sources that are fairly matched to a standardized wavelength grid. In the case of the laser sources, this compromise is in the form of positive detuning of each of the laser sources. This means that each of the transmission wavelengths of the laser sources must be positively detuned to a longer wavelength, i.e., red shifted, relative to the active region wavelength of the EIAL active region material. The positive detuning from the gain or PL peak may compromise the laser performance characteristics, such as, for example, current threshold, laser efficiency, laser linewidth, laser RIN, SMSR, etc.

One of the disadvantages in deploying EIAL in connection with a plurality of DFB laser sources and EA modulators in a TxPIC 10 is that there is a potential degradation of both laser and modulator performance across the channels. This is because the compromise or tradeoff that has to be made, as previously discussed above, must be applied to an array of lasers as well as an array of modulators which operate over a significantly wide wavelength range as integrated on the same substrate utilizing the same active region. As for some initial background and understanding relative to the performance issue, reference is made to FIGS. 5 and 6. When a conventional DFB laser or a DFB in a conventional EML is fabricated, it has an active region gain spectrum 54 with a laser emission wavelength 55 approximate to the gain peak 56 as illustrated in FIG. 5 such that $\lambda_L - \lambda_{PL,L} < 0$. However, in an IAL EML device, the laser emission wavelength is red-shifted relative to the gain or PL peak, $\lambda_L - \lambda_{PL,L} > 0$. As shown in FIG. 6, the EML modulator has an active region bandgap and corresponding PL emission as shown at curve 57 so that the laser emission wavelength 58 is blue-shifted relative to the PL peak 59 of the modulator active material so that $\lambda_L - \lambda_{PL,M} > 0$. In other words, as a specific example seen in the article of Salvatore et al., infra, for the described active region, the active region PL peak may be around 1.49 μm and the DFB laser emission wavelength, detuned from this peak, may be about 1.54 μm so that the detuned offset for the laser emission wavelength is around 50 nm. With this red shift of the laser emission wavelength, the longer transmission wavelength 58 of the integrated laser source is within a narrow operation window of integrated modulator active region.

However, in the present invention, multiple laser emission wavelengths 64 are integrated on the same TxPIC chip 10 having a wide spectrum of transmission wavelengths, $\lambda_{L,1} \ldots \lambda_{L,j} \ldots, \lambda_N$, which are each positively detuned at a different value from the peak 63 of the photoluminescence (PL) spectrum 62 of the laser active region as illustrated in FIG. 7. Also, shown in FIG. 7, is a absorption curve 64 for the modulator region under bias conditions and the absorption curve 66 under non-bias conditions. The group 65 of laser emission wavelengths is the laser spectra for the N laser sources in TxPIC 10. It should be noted that the potential spectral window is larger than that shown. Thus, the group 65 of wavelengths, $\lambda_{L1} \ldots \lambda_N$, is red-shifted to be detuned from the PL peak wavelength 63 of the EIAL and designed such that all the wavelengths, $\lambda_{L1} \ldots \lambda_N$, approximate wavelengths on a standardized wavelength grid within a modulator window, which is acceptable for all of the EA modulators 14 on PIC chip 10. The active region for the coupled laser sources each have a different positively detuned offset relative to the gain peak of the active region within boundary conditions that N minus one (N−1) times laser source wavelength spacing (Δλ) in the PIC is in the range of about 0 nm to about 30 nm, preferably in the range of about 0 nm to about 15 nm (from $\lambda_{L,1}$ to $\lambda_{L,N}$) or 0≤(N−1)Δλ≤30 nm, preferably 0≤(N−1)Δλ≤15 nm.

A preferred embodiment of the present invention is the provision of an EIAL TxPIC wherein the $\Delta(\lambda_{L,j} - \lambda_{PL,L,M,j})$, where j=1 ... N, provides sufficient laser performance while simultaneously providing sufficient modulator performance across all the channels of the TxPIC. In addition to the conventional requirements imposed by a discrete or single channel EML, a TxPIC 10 places additional constraints on the performance of the integrated EIAL elements. Specifically, the power uniformity of DFB lasers 12 combined with transmission through the optical signal channel that includes the modulator, isolation regions, monitoring photodiode, and possibly a VOA, SOA or combined VOA/SOA, must provide sufficient power flatness uniformity or predetermined power tilt across the channels. In addition, the total operating current of the laser array must be sufficiently low so as to allow sufficient thermal management when the TxPIC is packaged. Furthermore, the variation in threshold currents across the array must be sufficiently small so as to minimize variations in degradation of the lasers across the array. In addition, the BER of all modulated sources must meet the requirements of the optical link in which it is to be deployed. A teaching of the present invention is that those requirements many be simultaneously met by satisfying the following expression, $$\lambda_{minimum} \leq \lambda_{L,j} - \lambda_{PL,L,M,j} \leq \lambda_{maximum},$$

for an EIAL active layer over all channels j=1 ... N.

For EIAL PICs, $\lambda_{minimum}$ is about 20 nm to about 25 nm and $\lambda_{maximum}$ is about 50 nm to about 70 nm. In addition, InAlGaAs (AQ) material provides superior properties as both a laser active region, due to its large conduction band offset, and as a modulator active region, due to its reduced valance band offset. As the EIAL TxPIC requires compromises in both the laser and the modulator design as well as other unique requirements imposed by the TxPIC, as compared to single-channel EMLs, as described previously, the improved laser and modulator performance facilitated by the utilization of an AQ material system enables an EIAL TxPIC to meet the multitude of these requirements and, hence, is one of the important features of this invention. Furthermore, and important to this invention is that the AQ system, such as in the waveguide core of integrated optical components, provides superior composition control for in-wafer uniformity across the wafer during epitaxy growth as well as repeated growth from wafer to wafer thereby improving the yields and accuracy of TxPIC fabrication on a repeated basis. This is best illustrated in FIG. 10 of U.S. Pub. No. 2003/0165314A1, supra. Also, it is easier to tailor band structures employing AQ material compared to PQ material. The AQ material system also offers distinct advantages for the modulator performance as illustrated in FIG. 3. In this figure, the width of operation window for an optimize PQ modulator and AQ modulator are shown in bar chart form where the operation window is defined by meeting the same BER consistent with the requirements of a long-haul transmission system such as the type shown and described in U.S. patent application Ser. No. 10/267,212, filed Oct. 8, 2002, also published on May 29, 2003 as U.S. Pub. No. 2003/0099018A1 and incorporated herein by its reference. As shown in FIG. 3, the acceptable operation window of EAMs 14 is approximately two times greater for AQ active region devices compared to PQ active region devices. This is enabled by the superior band structure characteristics, e.g., the reduced valance band offset, for AQ materials versus PQ materials. Note that the relative width of the AQ window versus the PQ window varies depending on the precise transmission specification of the system. However, AQ EAMs exhibit equivalent and most often improved by approximately 1.5 to 2 times wavelength operation window widths compared to the same operation window widths for PQ EAMs. Only in the least demanding applications with modest transmission performance requirement does a PQ EAM operation window approach that of an AQ EAM operation window. Thus, the superior laser and modulator performance enabled by AQ materials are preferred for an EIAL TxPIC as they minimize any performance degradation that occurs due to compromises present in adopting the EIAL approach and provide superior levels of performance (power and transmission performance) and/or levels of integration (number of PIC signal channels) and/or laser spectrum span verses a PQ EIAL TxPIC.

Reference is now made to FIG. 4 which further illustrates the impact of deploying AQ active regions in lieu of PQ active regions. In FIG. 4, there is shown the power versus threshold current curves at 68 for positively detuned channels for a ten channel TxPIC 10 employing an AQ active region and the power versus threshold current curves at 70 for positively detuned channels for a ten channel TxPIC 10 employing a PQ active region, where both PICs have nominally equivalent positive detuning. It can readily be seen that the performance of source channels 68 with an AQ active regions are superior to source channels 70 with a PQ active region. In general, laser source channels 68 have lower current thresholds than laser source channels 70. In particular, the lowest detuned channels 68 have comparable thresholds. The threshold current distribution is tighter for the case of AQ active regions. Also, significantly more output power for drive currents above threshold (better slope efficiency) is much greater for AQ channels 68 than compared to PQ channels 70. The substantially higher thresholds and lower output powers, especially for the more positively detuned channels of a PQ TxPIC make the utilization of such a device marginal or unacceptable except in the cases of small channel counts are involved or in applications wherein the power performance requirements of the TxPIC are modest.

It should be further noted that APP and APN have also been previously indicated as preferred active region compound for electro-optic elements even through it contains phosphorus or nitrogen. However, as it is readily understood by those familiar with this art, the preference for AQ and its accompanying wafer uniformity growth is easily achieved with APP or APN where the content of P or N in the respective compound is present but with a relatively low content or amount.

One aspect of degraded laser/modulator performance is that the range of plausible positive detuning spectra must be broadened to accommodate an operation window for all the EA modulators with a band of grid wavelengths, $\lambda_{L,1}$ to $\lambda_{L,N}$, generated across the PIC laser array. The deployment of EIAL coupled lasers/modulators with large positive detuning across the laser source array enhances the sensitivity of the laser sources to back reflections so that the desired linewidth of the sources may be compromised. A way of reducing this back reflection sensitivity is through (1) increased DFB grating strength, κL, and/or (2) the deployment of complex-coupled gratings or a phase shift in the DFB grating regions. The enhanced grating "strength" offered by either of these techniques reduces the influence of such back reflections. With respect to phase shifts in DFB gratings, the phase shift can be a single phase shift, multiple phase shifts in the grating or multiple phase-shift sections formed along the grating in the laser region of the TxPIC. As one example, the grating shift can be nominally a one-quarter wavelength shift but it may be some other wavelength shift value depending upon achieving optimum results with strong single mode operation through splitting the degeneracy of the forward propagating mode, for example, relative to the reverse propagating mode in the DFB active region so that one mode remains independently dominate over the other mode. As used herein, complex-coupled gratings means either a loss coupled grating, a gain coupled grating or a gain or loss plus index coupled grating, all of which are known in the art. The deployment of a complex-coupled grating and/or grating phase shift may enhance the span of wavelengths over which DFB laser sources with positively detuned wavelengths can be achieved with sufficient transmission performance. This phenomenon was not previously contemplated as far as the inventors are aware principally because such PIC chips as disclosed herein where not known or investigated by others in the art. The deployment of complex-coupled gratings in discrete EMLs is known for achieving immunity to back reflections as reported for example, by R. Salvatore et al. in the article entitled, "Electroabsorption Modulated Laser for Long Transmission Spans", *IEEE Journal of Quantum Electronics*, Vol. 38(5), pp. 464-476, May, 2002, but not for the purposes of providing a wider band of stable transmission wavelengths with a fixed gain peak of the material bandgap gain profile for an extended identical active layer (EIAL) or region. Over multiple channels simultaneously, it is not known to deploy complex-coupled gratings or grating phase shifts in laser arrays in a PIC for providing in a stable manner an extended transmission wavelength band for operating N laser sources all on the same chip each at different designated wavelengths or detuned wavelengths within the extended band.

Examples of gratings are illustrated in FIGS. 8-10. These figures were incorporated from U.S. patent application Ser. No. 10/267,346, supra. An In-based TxPIC chip 10 may include DFB laser sources having an index-coupled active region, such as illustrated in FIG. 8, comprising an-InP confinement layer 123, a grating layer 124 comprising, for example, a PQ or AQ grating layer 124, preferably AQ, followed by an InP planarization layer 126, which is followed by an active region 130 comprising a plurality of quantum well and barrier layers of semiconductor compounds such as PQ, AQ or APP, preferably AQ, APP or APN. After the epitaxial growth active region 130, there is epitaxially deposited confinement layer 132 of p-InP. It should be noted that the distal thickness between quantum well (QW) active region 130 and grating layer 124 in FIG. 8 should be sufficiently large so that the grating is only index coupled to the active region. The thickness may, for example, be approximately in the range of about 1,000 Å to about 3,000 Å or a little smaller or greater than this amount.

A gain coupled active region is shown in FIG. 9 and an index/gain coupled region is FIG. 10, which may be utilized instead of an index coupled active region of FIG. 8. In FIG. 9, the semiconductor structure for the active region includes, as an example, an n-InP confinement layer 134, a Q active region 136 comprising multiple quantum wells and barriers, and a p-InP layer 138 which has an embedded grating or grid 140 of n-InP or, for example, n- or p-InGaAsP, or p- or n- or NID-InAlGaAs or InGaAsP. Grid 140 has an opposite conductivity or is non-intentionally doped (NID) relative to embedding layer 138, which may be comprised of p-InP, together forming a gain-coupled grating or grid so that current flows between the n-InP grid regions into active region 136 as illustrated by the arrows in FIG. 7. The periodic current flow regions 137 between grids 140 induce a periodic index change along the length of active region 136. If these periodic grid or gratings 140 are, instead, a higher index compound material, e.g., n- or p-InGaAsP, or p- or n- or NID-InGaAsP or InAlGaAs, then the current flow in the flow through regions 137 between grids 140 into active region 136 induces a periodic index change (lower index) along the length of active region 136 as well as an effective periodic index change (higher index) in the refractive index in active region 136 between the current flow regions 137 thereby forming a gain/index coupled region.

An alternate embodiment is the index/gain coupled structure shown in FIG. 10 comprising n-InP confinement layer 142, Q active region 144 formed with a saw-tooth grating 148 and p-InP polarization and confinement layer 146. Saw-tooth grating 148 is formed in the higher index active regions (e.g., InGaAsP or AlInGaAs quantum wells and barriers) includes a planarization layer 146 of p-InP to bury grating 148 so that a periodic gain and index coupled active region is formed. See, as an example, the active region structure illustrated in U.S. Pat. No. 5,536,085 which is incorporated herein by its reference. In either case of the gain coupled or gain/index coupled active regions shown in FIGS. 9 and 10, reduced back reflection sensitivity is achieved as well as improved performance. As the EIAL TxPIC compromises the performance of an entire DFB array, complex coupling gratings are advantageous to improve the laser performance. Also, note that the enhanced laser stability provided by gain coupling (or gain/index coupling) facilitates the ability to drive the laser to higher powers, facilitating an even higher power TxPIC chip 10 that does not require integrated, on-chip or off-chip amplification sources, such as SOAs or an EDFA. A further advantage of gain-coupled DFB lasers is that they break the mode degeneracy of the Bragg modes in the DFB lasers resulting in enhanced single-mode operation and narrow linewidth without the need to introduce a phase shift in the grating, thereby simplifying grating lithography. However, the use of a phase shift or multiple phase-shift sections in the DFB gratings may be employed separately or in addition to enhanced laser performance. Note that for any of the descriptions above, gain-coupling may be substituted or combined with loss coupling to achieve the same effect as gain coupling.

Also, with respect to the periodic gratings or complex-coupled gratings with grating periods set to the desired detuned wavelength relative to each laser, it may be more advantageous to form the laser grating above the active region of the laser sources than below because better quality material can be epitaxially grown for the active region if it is not grown, in sequence, above an as-grown laser grating since the morphology of the grating layer can cause some composition and quality variations. Also, it is easier to match or tune the grating pitch to the as-grown PL active material if the grating is formed above the active region. Embodiments illustrating a laser grating above the active region were previously discussed in connection with FIGS. 2D and 2E. Lastly, with respect to the formation of these types of gratings, there are other ways to form them so that it is not intended by their description to limit their formation relative to forgoing description and FIGS. 8-10.

Another approach that may be applied relative to this invention to achieve good laser/modulator performance is what is termed, "trim selective area growth or trim SAG". Trim SAG is a relatively small amount of selective area growth (SAG) that may be performed on a portion of the total array of laser sources 12 in TxPIC 10 or on a portion of the total array of modulators or both. The amount of trim SAG is approximately less than or equal to the array element wavelength spacing, such as in the range 1 nm up to 30 nm, but is preferably less than 20 nm to maintain the required manufacturing tolerances as described below. It is a smaller amount of bandgap change compared to "regular SAG", which in the past relative to EMLs employing wavelength detuning with SAG, has been, for example, in an offset range of about 40 nm to about 60 nm, and even as much as a 65 nm wavelength shift or offset between the DFB laser and the EAM. Trim SAG may also be applied to the entire array of either or both of these electro-optic elements. Specifically, a change in bandgap and composition is performed on an electro-optic element relative to a portion of such elements in the array, such as, one quarter, one-third, one-half, two-thirds or three quarters of the elements comprising an array. It may also be applied, for example, to every other element in the array or any multiple thereof, such as every other two or more electro-optic elements in an array.

As indicated above, trim SAG may also be applied to every element of each array, but this is a condition that is not preferred due to the general difficulty in controlling SAG, particularly with respect to achieving identical reproducibility on a repeated basis. In this connection, reference is made to FIG. 11 which illustrates a comparison between the uses of trim SAG and conventional SAG relative to the growth of PQ multiple quantum wells. In FIG. 11, the regime for trim SAG (~1 nm to 20 nm) is shown in comparison with conventional SAG (~25 nm to 65 nm). This figure shows the total variation in active region PL wavelength $|\lambda_{max}-\lambda_{min}|=\Delta\lambda$ SAG for multiple samples across a wafer and from several different wafers as a function of the total wavelength shift induced by SAG. As shown in the FIG. 11 graphic illustration is a point 43 of epitaxial growth where there is no SAG growth. It can be readily seen by curve 45 in FIG. 11 that the magnitude in $\Delta\lambda$ SAG variation of the active region wavelengths is smaller for the trim SAG regime as compared to the convention SAG regime. Thus, the application of trim SAG is useful for active region growth bandgap changes where the changes to be accomplished are relatively small as it allows higher precision in realizing a targeted active region design which translates into improved yield and/or performance.

While EIAL PICs are designed to eliminate problems and issues involved in the use of SAG, a small or limited incorporation of SAG (i.e., trim SAG) at the wafer fabrication level can be helpful in achieving operation goals and performance for both the laser and modulator in a multiple channel PIC. The preferred choice is not to apply trim SAG to the DFB array but only in the modulator array because the DFB lasers are highly sensitive to thickness and composition variations which are difficult to precisely control to achieve desired results and performance. These variations can result in a "hit or miss" operation relative to targeted laser emission wavelengths.

On the other hand, deploying trim SAG, which going forward, permits less required positive detuning offset in the DFB array and/or less laser-modulator detuning, provides the advantage of maintaining desired laser power, laser linewidth, low feedback sensitivity, and high single mode yield across the laser array and improve modulator transmission characteristics. The application of trim SAG is particularly useful where the positive detuning is in an offset range of greater than about 60 nm to about 65 nm of positive detuning. When detuning reaches theses higher limits, DFB power and current threshold significantly drop off and modulator performance is significantly compromised. Good modulator performance is achieved at lower detuning levels, for example, but not limited to, around 40 nm. In the preferred approach, the DFB array of a TxPIC 10 is positively detuned with the boundary conditions such that the number of optical signal channels minus one times the array spacing is on the order of about 15 nm to about 30 nm or less.

Thus, the beauty of trim SAG in a positively detuned laser array or any other array of elements is that if the detuned range becomes too excessive so that the TxPIC power/threshold requirements are not within required design specifications, trim SAG can be employed where some of the laser, modulator or other element active regions are fabricated using the SAG technique to permit a red shift wavelength shift of the PIC element active region wavelength relative to unmasked region. Thus, as the designed laser wavelength detuning between the laser emission wavelength and its gain peak becomes too large, the active region material can be selected, through trim SAG deployment, to maintain a sufficient level of power and threshold for at least a remaining portion of lasers in the laser array. Therefore, it would be beneficial in certain cases to employ trim SAG in an EIAL PIC where trim SAG on the order of about 15 nm to about 30 nm is employed to reduce the laser detuned offset and/or laser modulator detuning making the performance of the longest laser emission wavelength channel close to that of the shortest laser emission wavelength channel in the EIAL channels of a TxPIC. This is stated in terms of "on an order of because there is no "hard walkoff" of required power/current threshold conditions, which conditions depend significantly on designed system specifications.

As previously indicated, the DFB lasers are the most sensitive electro-optic elements on a DWDM PIC for wavelength yield so that the goal is to minimize the extent to which they are affected during PIC fabrication and epitaxial growth processes. Thus, as previously indicated, it is preferred that any application of trim SAG to the laser array be only part of the array, particularly one or more laser elements requiring the most positive detuning relative to the PL peak of the PIC active region/core. It also depends upon how big the array is, i.e., the larger the number of channels in an array formed in a TxPIC with a given array spectrum spacing, the larger the laser spectrum span and positive detuning.

The modulator array is sensitive to thickness and compositional variations due to the deployment of trim SAG. Nevertheless, trim SAG may be utilized across the modulator array, or across a portion of the modulator array, to provide for better BER performance (lower BER). Reference in this connection is made to Table 1 below which illustrates the case for a ten channel EIAL TxPIC, such as PIC 10 as seen in FIG. 1, with 100 GHz array spectrum spacing. Table 1, below, shows for each PIC channel, the targeted laser emission wavelengths (which values have been rounded off); modulator active region wavelength, which is identical for each channel; laser-modulator detuning; and laser detuned offset. Note that both the laser and modulator active region wavelength are identical in the example because trim SAG has not been utilized in the case of Table 1 for data with respect to an EIAL TxPIC 10, meaning that the modulator PL wavelength is the same for each channel. The positive detuning amounts in the last column are the values resulting from the laser emission wavelengths in the first column and the laser active region wavelength, which is 1490 nm for all channels in this example. Note that the span of the laser detuned offset is from 40 nm to 47.2 nm, the same as the laser-modulator detuning.

The positive detuning range in Table 1 is within the operation window of the modulators where they provide good performance, such as, for example, in terms of low BER and high extinction ratio, and low on-state insertion loss (IL).

TABLE 1

| Channel Number | Laser Emission Wavelength (nm) | Modulator Active Region Wavelength (nm) | Laser-Modulator Detuning (nm) | Laser Detuned Offset (nm) |
| --- | --- | --- | --- | --- |
| 1 | 1530.0 | 1490 | 40.0 | 40.0 |
| 2 | 1530.8 | 1490 | 40.8 | 40.8 |
| 3 | 1531.6 | 1490 | 41.6 | 41.6 |
| 4 | 1532.4 | 1490 | 42.4 | 42.4 |
| 5 | 1533.2 | 1490 | 43.2 | 43.2 |
| 6 | 1534.0 | 1490 | 44.0 | 44.0 |
| 7 | 1534.8 | 1490 | 44.8 | 44.8 |
| 8 | 1535.6 | 1490 | 45.6 | 45.6 |
| 9 | 1536.4 | 1490 | 46.4 | 46.4 |
| 10 | 1537.2 | 1490 | 47.2 | 47.2 |

Table 2, below, illustrates what the application of trim SAG can do within the confines of a narrow operation window. A portion of the modulator array can be fabricated by employing trim SAG as illustrated in Table 2 wherein trim SAG is employed to shift the modulator active region wavelength for signal channel Nos. 6 to 10. Thus, the modulator active region wavelength is 1490 nm for channel Nos. 1 to 5 but is changed to 1494 nm for channel Nos. 6 to 10 with the aid of trim SAG masking techniques. The laser active region wavelength is the same across all channels, as in the case of Table 1, and is 1490 nm. Thus, the laser-modulator detuning will be reduced for channel Nos. 6 to 10. In this manner, laser-modulator detuning can be confined to a more narrow range, such as, about 40 nm to about 43.2 nm, as seen in the fourth column of Table 2, instead of about 40 nm to about 47.2 nm, as seen in the fourth column of Table 1. As the laser active region wavelength is unchanged, the laser detuned offset remains from about 40 nm to about 47.2 nm, as seen in the last column of Table 2. The application of trim SAG to the modulators in a TxPIC, as illustrated in Table 2, is the easiest approach from the standpoint of control in not affecting the laser emission wavelength.

TABLE 2

| Channel Number | Laser Emission Wavelength (nm) | Modulator Active Region Wavelength (nm) | Laser-Modulator Detuning (nm) | Laser Detuned Offset (nm) |
| --- | --- | --- | --- | --- |
| 1 | 1530.0 | 1490 | 40.0 | 40.0 |
| 2 | 1530.8 | 1490 | 40.8 | 40.8 |
| 3 | 1531.6 | 1490 | 41.6 | 41.6 |
| 4 | 1532.4 | 1490 | 42.4 | 42.4 |
| 5 | 1533.2 | 1490 | 43.2 | 43.2 |
| 6 | 1534.0 | 1494 | 44.0 | 44.0 |
| 7 | 1534.8 | 1494 | 40.8 | 44.8 |
| 8 | 1535.6 | 1494 | 41.6 | 45.6 |
| 9 | 1536.4 | 1494 | 42.4 | 46.4 |
| 10 | 1537.2 | 1494 | 43.2 | 47.2 |

In Table 3, below, illustrates the application of trim SAG down the entire channels of the modulator array except for the first channel No. 1. There is no application of trim SAG to the laser region having a laser active region wavelength of 1490 nm. The amount of change in the modulator active region wavelength due to the application of trim SAG changes is 0.8 nm per channel, although the value need not, necessarily, be uniform across the channels. This value may vary monotonically in value to reduce the laser-modulator detuning. Note that laser-modulator detuning remains in the range of some 40 nm while the modulator active region wavelength in respective active regions varies from about 1490.0 nm to about 1497.2 nm with a 0.8 nm spacing so that the laser-modulator detuning remains in the range of 40 nm, which allows good or acceptable modulator performance across the entire 10-channel array.

TABLE 3

| Channel Number | Laser Emission Wavelength (nm) | Modulator Active Region Wavelength (nm) | Laser-Modulator Detuning (nm) | Laser-Detuned Offset (nm) |
| --- | --- | --- | --- | --- |
| 1 | 1530.0 | 1490.0 | 40 | 40.0 |
| 2 | 1530.8 | 1490.8 | 40 | 40.8 |
| 3 | 1531.6 | 1491.6 | 40 | 41.6 |
| 4 | 1532.4 | 1492.4 | 40 | 42.4 |
| 5 | 1533.2 | 1493.2 | 40 | 43.2 |
| 6 | 1534.0 | 1494.0 | 40 | 44.0 |
| 7 | 1534.8 | 1494.8 | 40 | 44.8 |
| 8 | 1535.6 | 1495.6 | 40 | 45.6 |
| 9 | 1536.4 | 1496.4 | 40 | 46.4 |
| 10 | 1537.2 | 1497.2 | 40 | 47.2 |

Thus, in summary, the use of SAG to trim part of or all of the modulator active regions of the modulators is applied to reduce the detuning range across the array to some extent to be well within the operation window. The extent of this window is a function of BER and power performance uniformity requirements. Thus, by utilizing trim SAG for at least some of the array of modulators in the PIC, a narrowing of the laser-modulator detuning across the array is achieved, resulting in improved modulator BER/power performance and/or uniformity. Also, it should be noted that the laser and modulator performance are not necessarily governed by the same operation window because their operations are very different. So, in cases where at least some of the laser active region wavelengths and at least some of the modulator active region wavelengths are trimmed via SAG, the amounts of applied trimming within the trim SAG range of offsets may be different for lasers and modulators. Alternatively, there may be certain designs wherein only the laser active regions are varied via trim SAG.

It is also within the scope of this invention that, instead of deploying trim SAG to reduce the laser detuned offset or laser-modulator detuning across the array, the formation of a butt-joint between the laser and modulator in some or all of the channels may be accomplished by a selective etchback through the active region of at least some of the TxPIC laser sources or modulators followed by a regrowth of new active region having a different bandgap and, therefore, active region wavelength. Also, it is within the scope of this invention to change the active region bandgap by impurity induced disordering (IID) for at least some of the TxPIC laser sources and/or modulators to selectively vary their active region wavelength.

An important requirement in the operation of some DWDM systems is power setting of the respective laser sources in an optical transmitter. This becomes a little trickier to accomplish when the laser sources are integrated as a laser source array comprising at least two channels in the same PIC. There are two operation approaches for dealing with power setting through either power leveling and power tilting the output power across the channels of the PIC. In power leveling, the power output from the signal channels is substantially made equal across the channels or at least uniform within an acceptable limit, such as within 0.5 dB of the desired power output level to be achieved for a particular TxPIC configuration. Power skew across the array can be compensated for with the incorporation of power changing elements (PCEs) where the power is varied over time. One way that this can be done is by changing the operating point (such as bias point higher or lower) of the element. Note that by varying the channel-to-channel design of a PCE, variation in the range of adjustable operating bias can be realized from channel-to-channel. In addition, the insertion loss of active or passive elements may be varied by varying its channel-to-channel design to partially or fully compensate for the systematic bias in an EIAL PIC. This may include, but not limited to, changing the length, width or absorption of a PCE from channel-to-channel. In laser source elements, the bias point would be made higher to achieve more channel power. In modulator elements, the bias point would be made deeper to achieve less channel power. In SOA elements, more forward bias would be made higher to achieve more power. In VOA elements, more negative bias would be made higher to achieve less power. In a modulator element, there are certain ranges of bias that will achieve a better BER and it is not always a deeper bias. Furthermore, either a change in the DC bias or to the peak-to-peak voltage swing of the modulator may result in a power change.

In power tilting, the output power is varied in a monotonic or non-monotonic manner across the PIC channels. If the goal is to operate all the laser sources at a constant bias current, for an EIAL TxPIC, there is going to result a power tilt or skew across the laser array due to variations in the laser gain and/or active region absorption arising from the variation in detuning across the EIAL channels. Therefore, something will have to be done to compensate for differences in output power levels across the modulated sources. On the other hand, if the laser sources are operated at constant power across an EIAL array, there will be a bias current skew across the modulated source outputs which changes the offset emission wavelengths of the laser sources from what they would normally be set for their wavelengths approximating a standardized grid for laser sources with identical and constant chirp in their grating period from channel-to-channel. In this case, it is required to operate wavelength tuning elements to compensate for the emission wavelength change or make changes in the beginning by employing a variable chirping the wavelength setting of the gratings across the laser sources.

Such current thresholds and fundamentally desired emission wavelengths of the laser sources and their stabilization may be minimized during PIC fabrication through adjustment of the laser grating strength (duty cycle) adjustments, laser source length and/or width adjustments, changes in the spatial distance between the active region and the grating layer, and adjustments to the bandgap of the active region of the laser sources.

In one approach, in order to achieve power leveling across an EIAL TxPIC array of modulated sources as well as maintain proper operating wavelengths of the laser sources, different bias currents are applied and maintained across the respective PIC laser sources so that desired laser source emission wavelengths and power setting is achieved and maintained across the laser source array. In particular, the bias set point of the laser sources are initially established to set the laser emission wavelength and power of the respective laser sources across the PIC. Then the laser source bias current may be individually adjusted over the life of the PIC laser sources to maintain their emission wavelengths or the bias current may be kept constant and power adjusted across the array using PCE or MFE elements in the channels. Further, wavelength tuning elements may be utilized to provide further refine adjustment to the desired laser emission wavelength of the laser sources as described elsewhere in this disclosure.

As described previously, in an EIAL PIC array, variation in the laser detuned offset and or laser-modulator detuning across the array will result in a skew of power and/or BER across the array. In some cases, especially in the case of power, this skew may be fortuitous and may fully or partially compensate for a skew in the optical transmission system or optical receiver (external to the EIAL PIC). In other cases, it is desirable to partially or fully compensate for the power or BER skew across the channels. Note that this compensation may take the form of either leveling (wherein all channels are set to an equal power and/or BER within a given tolerance) or setting (wherein a systematic channel-to-channel skew is established in power and/or BER).

The compensation of the inherent EIAL power and/or BER skew can be generally accomplished by variations in element bias from channel-to-channel, by variations in element design from channel to channel, or both, in the EIAL channels of the TxPIC. For example, the power may be compensated for by varying the laser bias, modulator bias (DC or swing voltage), or bias of a PCE (e.g., voltage variation for a VOA or current variation for an SOA). Examples of varying the design of elements across EIAL channels to effect a power and/or BER skew include, but are not limited to: varying the length and width of an electro-optic element, varying the optical confinement of the mode in that element, and varying the loss in that element. Note that employment of electronic signal processing (ESP), such as through pre-bias, equalization, electronic dispersion compensation (EDC) or FEC, may also be utilized to compensate for some of the systematic bias variations in power and/or BER in the EIAL channels of a Tx PIC.

There are several ways to achieve power setting across a modulated source array without requiring off-chip amplification. To understand power setting, reference is made to FIG. 12 which illustrates the LI curves for a plurality of signal channels, $\lambda_{L,1}$ to $\lambda_{L,N}$, across the integrated array of modulated sources on an EIAL TxPIC chip 10 where a singular active region is employed across the entire PIC. To be noted is that the operational current, $I_{OP1}$, for the first channel 1 has the longest laser emission wavelength ($\lambda_{L,1}$) on the wavelength grid of the EIAL TxPIC chip, provides the lowest power, highest threshold current, the lowest gain, the lowest slope efficiency, the lowest slope efficiency of the array and the most positively detuned of the laser array. On the other hand, the operational current, $I_{OPN}$, for the last EIAL channel N has the shortest laser emission wavelength ($\lambda_{L,N}$) on the wavelength grid of the PIC chip, is the least positively detuned laser source of the array, and has the lowest power, lowest threshold current, the highest gain and the highest slope efficiency of the array. If one picks the operating current for lasers 1 and N for example, along dotted line 100, the power $P_N$ of channel N is greater than the power $P_1$ of channel 1. However, it turns out that the insertion loss (IL) of channel 1 is less than the insertion loss (IL) of channel N due principally to variations in laser-modulator detuning between channels. Thus, there is some "natural" balancing of power but not sufficiently complete. The variation in power across the modulated source array is still too much. Thus, there must be an adjustment of power output from the modulated sources in order to meet the requirement of some WDM or DWDM systems where the output power of the combined signal channels must be substantially equal or pre-set, such as, for example, within 0.5 dB across the array, as previously indicated. One approach to achieve such power setting is based on the premise that insertion loss (IL) is opposite to power variation at the laser source in the case of an external modulator configuration as is the case here. As just indicated above, it happens that the channel with the most power will also have the highest insertion loss and the channel with the least power will have the lowest insertion loss so that there is a somewhat fortuitous balancing of laser source power with EAM insertion loss although not sufficient. It should be noted that bias current can be adjusted to optimize laser source emission wavelength and power setting achieved with the aid of adjustable gain and/or loss elements in each signal channel.

It is evident, therefore, from FIG. 12 that power setting must be carried out in a multiple signal channel EIAL TxPIC due to the differences in gain and insertion loss (IL) among the signal channels resulting from the EIAL application or design, as illustrated by way of example along the line 100 of that figure. A first approach for PIC power setting is to adjust the laser source power as well as its wavelength by adjusting the laser bias current for each channel. Since wavelength and power cannot be raised independently, it is desirable to also use additional means of tuning the laser emission wavelength, including by means of temperature control of the respective laser sources 12, such as by integrated local heating elements or micro-TECs, one for each laser source. Other wavelength tuning elements include adding multiple sections to the laser and varying the current in each section (including, phase tuning, which is the provision of a phase section in a DFB or DBR laser), the use of coolers, including TECs, to tune the wavelength grid or individual laser sources of the PIC, and stress tuning such as through external device stress employing bi-metals or bi-metal contacts, or possible combinations of any of the foregoing mentioned tuning elements. Thus, wavelength tuning of each laser source can be accomplished by changes in temperature, voltage and current, or bandgap.

As a second approach for PIC power setting, the fabricated length of the respective EAMs or other lossy elements positioned in the channels can be varied or chirped across the EAM array since a variation in device length is proportional to its insertion loss (IL). For the device of FIG. 12, the IL in channel N is the largest while the IL in channel 1 is smallest. The variation in the length of such elements would start with channel 1 with monotonically decreasing EAM length across the array to channel N. The EAM length variation can be done continuously across the array or in steps across the array, e.g., every other EAM or very two EAMs, etc. Also, the amount of length variation to be provided in this manner also depends on other compensating approaches to achieve the desired setting. It is possible with this approach, for example, to achieve approximately 1 dB to 2 dB in power setting across the modulator array.

A third approach for PIC setting is to introduce a power setting element comprising a fixed insertion loss element or component in at least some channels following the modulator in each or some of optical signal channels on the TxPIC so that the power can be equalized or tilted across the array. This element may be an integrated fixed-length lossy region of high index and of predetermined length adjacent to the waveguide core between the EAM and the output waveguide of the PIC. Alternatively, it can be a fixed-length lossy region comprising a predetermined length of the waveguide core of a channel which region is highly absorbing and positioned being between the EAM and its output waveguide to an on-chip optical combiner. While varying the length of such a fixed-lossy region, also the bandgap of the region can be changed to vary the insertion loss of the region, i.e., provide the region with smaller bandgap material, which would provide a longer active region wavelength (PL wavelength) compared to operating wavelength and, therefore, be absorbent of the signal wavelength. Thus, in summary, the bandgap of such an element can be changed to be a longer active region wavelength or the length of the element can be made longer without affecting its bandgap. Any bandgap modifying technique (e.g., but not limited to, epitaxial regrowth, SAG, trim SAG, IID, and implantation) may be employed during fabrication to change the bandgap of this region and thereby modify the channel absorption. The longer the length of such an element in an optical signal channel of the TxPIC, the more introduced IL in a channel. Thus, the fixed element, in any case, would be made longer in length for longer wavelength EIAL channels, e.g. channel N, channel N–1, Channel N–2, etc., which possess less positive detuning applied. Thus, there are several variations that can be applied to achieve desired amount of IL for each channel on the TxPIC.

A fourth approach for PIC power setting is the positioning of a PCE 35, such as a variable optical attenuator (VOA), in some or all of the EIAL optical signal channels between a respective EA modulator 14 and its waveguide to the input of the on-chip optical combiner such as AWG 20. As shown in FIG. 13, in TxPIC 10$x$, a PCE 35, such as a VOA, is shown positioned in each channel 1 to 10 between laser source 12 and EAM 14. EIAL laser sources 12 can be initially set to operate at higher power levels to permit the channel with the lowest gain and highest current threshold, i.e., channel 1 with $\lambda_{L,1}$ as illustrated in FIG. 12, which also has the most positively detuned emission wavelength, to be set at a desired power level. VOAs 35 may then be adjusted to initially lower the power of these other channels so that power or tilt is achieved across the channel array. In this example, all the laser sources may be operated at the highest end of their output rating range. As laser sources 12 ages, their power levels will gradually reduce. The VOAs may, then, be periodically adjusted by auto feedback and control circuitry to reduce their attenuation in order to increase the channel power level and maintain power equalization across the laser source array. The predetermined fabricated length and/or bias of VOAs 35 may also be adjusted across the EAM array to achieve a preferred power setting.

It should be noted that the positioning of VOAs 35 between laser sources 12 and EAMs 14 provides a means by which EAMs 14 are prevented from ever being driven into saturation due to, for example, too high of an output power from laser sources 12 driving the modulators into saturation. So, VOAs 35 can also provide attenuation to prevent such saturation from occurring. However, too much attenuation of the light before the modulator may result in insufficient power and/or BER characteristics. Thus, there should be a balance struck between preventing saturation and low light power to the modulator.

It should be also noted that VOAs 35 may also be positioned in each channel between EAM 14 and its output waveguides 18 to AWG 20. Also, VOAs 35 may also periodically function as an MFE such as functioning as a monitoring photodetector for monitoring laser output power during calibration and testing or periodically during field testing as well as functioning during non-monitoring time periods as an attenuator for its associated laser source to provide a predetermined power output which equalizes its power level with other channel power levels across all channels over the modulated source array of TxPIC 10X. Another function which may be implemented relative power equalizing elements 35 is that a different low frequency modulated tag signal or tone signal may be applied to each element 35 for each channel. These low frequency channel signals are well below the high GHz optical signal modulation levels and are different for each signal channel. They may function as a channel identification tag for each channel and/or may be used in connection with wavelength locking as taught in U.S. patent application Ser. No. 10/267,330, supra.

A fifth approach for PIC power setting is the deployment of PCEs 17 comprising optical semiconductor amplifiers (SOAs) or combination SOA/VOAs across part or across the entire modulated source array between EAMs 14 and its waveguide to the input of the on-chip optical combiner, such as AWG 20 as illustrated in FIG. 14 for TxPIC 10Y. The biasing of amplitude varying element (AVE) 17 can be adjusted across the array to render the power output of the respective channels substantially equal to the channel with the highest power being generally generated from channel N in an EIAL TxPIC as previously indicated in FIG. 12. The key factor, however, is not to run SOAs 17 into saturation which can easily occur since the carriers are not clamped to any particular wavelength. This approach has the advantage over previous approaches in that in the previous approaches, what is accomplished is only additional insertion loss (IL) is introduced into the respective optical signal channels so that the maximum power achieved relative to power setting across the channel array is no more than that of the worst channel in terms of highest power. In the case of the embodiment of FIG. 14, however, power can be equalized or set across the entire array, even with more power provided to the best channel in terms of power output, depending, however, on the amount of gain that can be provided by PCEs 17. Thus, ideally, the addition of SOAs or SOAs/VOAs as PCEs 17 may improve the performance of the signal channels as well as extending the operation window of the TxPIC. The disadvantage in employing SOAs 17, however, is that these devices are forward biased devices so that the on-chip power budget for TxPIC chip 10Y is increased. Further, they provide added complication in terms of reliability, i.e., with the addition of another set of electro-optic elements to the TxPIC chip increasing the amount of fabricated elements. Also, they have an effect of distorting to a small extent the modulated signal waveform to which they apply gain. This may result in a transmission impairment or benefit, such as in terms of BER, depending on the details of the PIC design, PIC bias, and/or the optical transmission link characteristics.

As an alternative to the foregoing fifth approach is the use of PCEs 17 in the form of a SOA/VOA or ZOA which has the advantage of being operated either as a SOA (positive bias) and a VOA (negative bias) depending on the power level desired to be achieved in each channel across the modulated source array.

A sixth approach for PIC power setting may be the use of combination amplitude changing elements in a signal channel where one is a power adjusting element and the other is a fixed loss element. However, from the standpoint of space and compactness to provide for a smaller PIC chip size, the deployment of only PCEs across the channel array, as illustrated in FIG. 13, is likely the most preferred option.

A seventh approach for PIC power setting is to change the length (and/or width) of the laser source and/or chirp of the laser source gratings. In this case, the grating of each laser source 12 can be chirped as well as the active region length and/or width of each laser source can be varied across the laser source array to produce laser sources that operate at desired wavelengths and with a constant or predetermined grid spacing, operate at a power level across the array that is substantially constant and uniform or tilted or otherwise varying in a predetermined fashion. The laser source gratings are adjusted across the array in a non-uniform, chirp-like fashion to adjust the power uniformity (via $\kappa L$) as well as to maintain constant grid spacing between channels. Thus, changing the laser source length, to achieve uniformity in laser source output, requires calculating a change in the grating period of each respective source and its operating current to achieve and maintain a desired wavelength operation for each laser along a desired PIC wavelength grid.

While the invention has been described in conjunction with several specific embodiments, it is evident to those skilled in the art that many further alternatives, modifications and variations will be apparent in light of the foregoing description. For example, the dopant conductivity types can be reversed relative to all of the FIG. 2A to FIG. 2D embodiments. Also, the techniques disclosed in regard to the deployment of EIAL can be applied to other applications, such as mentioned in the last paragraph of the SUMMARY OF INVENTION, involving different photonic integrated circuit designs involving, for example, one of the aforementioned two different situations set forth in the first paragraph of the SUMMARY OF THE INVENTION, as distinguished from the design of the TxPIC disclosed in this disclosure. Thus, the invention described herein is intended to embrace all such alternatives, modifications, applications and variations as may fall within the spirit and scope of the appended claims.

What is claimed is:
1. A method comprising the steps of:
   forming a plurality modulated sources, each including a laser source and an external modulator, wherein the laser source of each of the plurality of modulated sources provides a unique laser emission and each of the plurality of modulated sources constitutes a corresponding one of a plurality of signal channels with an extended identical active layer (EIAL) such that each of the plurality of modulated sources has an identical active region wavelength,
   the EIAL constitutes a portion of said each laser source, the laser emission wavelength of said each laser source is positively detuned from the identical active region wavelength,
   wherein the laser emission wavelength of said each of the plurality of modulated sources has a corresponding positively detuned offset, which is different from one another, such that the laser emission wavelength of each of the plurality of modulated sources is greater than the identical active region wavelength of a respective one of the plurality of modulated sources.

2. The method claim 1, comprising the further step of providing the extended identical active layer (EIAL) with at least one active layer containing an aluminum containing Group III-V compound.

3. The method of claim 2 wherein the provided aluminum-containing Group IIIV compound is contains AlInGaAs, AlInGaAsP or AlInGaAsN.

4. The method of claim 1, further comprises the step of providing the extended identical active layer (EIAL) with AlInGaAs, InGaAsP, AlInGaAsP, AlInGaAsN, AlInAsN, InGaP, InGaAs, InAsP or InGaAsNSb or combinations thereof.

5. The method of claim 1, comprising the further step of providing groups of at least some of the signal channels to have at least two different extended identical active layers (EIALs).

6. The method of claim 1, comprising the further step of providing further tuning of at least some of the laser sources to have a laser emission wavelength substantially on a standardized wavelength grid.

7. The method of claim 1, comprising the further step of further tuning the emission wavelength of at least some of the laser sources.

8. The method of claim 1, comprising the further step of utilizing trim selective area growth (trim SAG) to expand an operation window of the modulated sources.

9. The method of claim 8, comprising the further step of applying trim SAG across at least some of the modulators of the modulated sources to reduce a range of laser modulator detuning.

10. The method of claim 8, comprising the further step of applying trim SAG to one or more of the laser sources.

11. The method of claim 1, comprising the further step of varying the active region wavelength in at least some of the laser sources or modulators or both by utilizing trim selective area growth (trim SAG).

12. The method of claim 11 wherein in the active region wavelength variation induced by trim SAG is in a range of about 1 nm to about 20 nm.

13. The method of claim 1, comprising the further step of providing at least one additional element in the signal channels.

14. The method of claim 1, comprising the further step of setting output power in each of the signal channels so that an appropriate power setting is achieved.

15. The method of claim 14 wherein the appropriate power setting is achieving power output leveling across the signal channels.

16. The method of claim 14 wherein the appropriate power setting is achieving power output tilt across the signal channels.

17. The method of claim 1, the laser sources have a total array spectrum span of about 0 nm to about 30 nm or less across the signal channels with EIAL.

18. The method of claim 17 wherein the preferred total array spectrum span is 0 nm to 15 nm.

19. The method of claim 1 wherein an amount of the detuning is in a range of about 20 nm to about 70 nm.

20. The method of claim 19 wherein the amount of the detuning is in a range of about 25 nm to about 50 nm.

21. The method of claim 1 wherein a systematic bias variation occurs in the signal outputs across the signal channels.

22. The method of claim 21, comprising the further steps of:
   providing at least one power changing element (PCE) in each of the signal channels affected by the variation; and
   adjusting a power setting of the power changing elements (PCEs) to compensate for at least for some of the variation.

23. The method of claim 21, comprising the further step of changing an operating bias of the laser source or the modulator or both in at least some of the signal channels affected by the variation.

24. The method of claim 21, comprising the further step of changing a design of the laser source or the modulator or both in at least some of the signal channels affected by the variation.

25. The method of claim 1, comprising the further step of deploying electronic signal processing (ESP) in an optical transmission link to which the semiconductor transmitter photonic integrated circuit (TxPIC) provides a plurality of channel signals.

26. The method of claim 1, comprising the further steps of:
   providing each the laser sources with a grating to set the emission wavelength of the laser source; and
   providing in the laser source grating of each of the laser sources with a grating component which stabilizes the laser source from back reflections.

27. The method of claim 26 wherein the component comprises chirping the laser source grating.

28. The method of claim 26 wherein the component comprises a complex-coupled grating.

29. The method of claim 26 wherein the component comprises a phase shift formed in the grating.

30. A method of providing multiple signal channels in the same photonic integrated circuit on a single semiconductor chip comprising the steps of:
providing a modulated source in each signal channel, each modulated source comprising a laser source having a different laser emission wavelength and an external modulator;
extending an active region of the chip to include all of the signal channels to form an extended identical active layer (EIAL) so that the multiple laser sources and modulators share the EIAL; and
detuning the laser emission wavelength in each laser source within the EIAL from the laser active region wavelength;
providing an arrayed waveguide grating that is coupled to each of the modulators,
wherein the laser emission wavelength of said each modulated source has a corresponding positively detuned offset, which is different from one another, such that the laser emission wavelength of said each modulated source is greater than an identical active region wavelength of a respective one of the modulated sources.

31. The method of claim 30, comprising the further step of detuning the laser emission wavelength in at least some of the laser sources within the EIAL from the modulator active region wavelength.

32. The method of claim 30, comprising the further steps of:
providing the laser sources to have a laser spectrum span within an acceptable operation window; and
providing the modulators to have a laser-modulator tuning range within the acceptable operation window.

33. The method of claim 32 wherein the laser spectrum span is within the range of about 0 nm to about 30 nm.

34. The method of claim 32 wherein the laser-modulator detuning range is about 20 nm to about 70 nm.

35. A method of providing an optical circuit on a single semiconductor chip, the method comprising:
providing a first modulated source in the optical circuit, the first modulated source including a first laser and a first modulator, the first laser configured to supply first light having a first wavelength;
providing a second modulated source in the optical circuit, the second modulated source including a second laser and a second modulator, the second laser configured to supply second light at a second wavelength;
providing an active region such that one of the first laser, the second laser, the first modulator, and the second modulator includes a first portion of the active region, and another one of the first laser, the second laser, the first modulator, and the second modulator includes a second portion of the active region, the first and second portions of the active region forming an extended identical active layer (EIAL),
wherein a laser emission wavelength of each said first and second modulated sources has a corresponding detuned offset, which is different from one another, such that laser emission wavelength of each said first and second modulated sources is greater than an active region wavelength of a respective one of the first and second modulated sources.

36. The method of claim 35, wherein the first laser includes the first portion of the active region and the first modulator including an associated modulator active region wavelength, the method further including detuning the first wavelength of the first laser from the modulator active region wavelength.

37. The method of claim 35, wherein the first and second lasers include the first portion of the active region and the first and second modulators includes the second portion of the active region, the method further including:
configuring the first and second lasers such that a difference of the first wavelength of the first light and the second wavelength of the second light is within an operation window;
configuring the first modulator such that a difference of the first wavelength of the first light and a first modulator active region wavelength associated with the first modulator is within the operation window; and
configuring the second modulator such that a difference of the second wavelength of the second light and a second modulator active region wavelength associated with the second modulator is within the operation window.

38. The method of claim 37 wherein the difference of the first wavelength of the first light and the second wavelength of the second light is within a range of about 0 nm to about 30 nm.

39. The method of claim 37 wherein each of the difference of the first wavelength of the first light and the first modulator active region wavelength associated with the first modulator, and the difference of the second wavelength of the second light and the second modulator active region wavelength associated with the second modulator laser-modulator detuning range, is within a range of about 20 nm to about 70 nm.

40. The method of claim 35 wherein one of the first and second lasers includes the first portion of the active region and one of the first and second modulators includes the second portion of the active region.

41. The method of claim 35 wherein one of the first laser and first modulator includes the first portion of the active region and one of the second laser and second modulator includes the second portion of the active region.

42. The method of claim 35 wherein the first laser includes the first portion of the active region and the first modulator includes the second portion of the active regiOn.

43. The method of claim 42 wherein the method including spectrally spacing each of the first wavelength of the first light and the second wavelength of the second light from the respective active region wavelength of the first and second modulated sources.

44. The method of claim 35 wherein the first laser includes the first portion of the active region and the second laser includes the second portion of the active region.

45. The method of claim 44 wherein the active region has an associated active region wavelength, the method including spectrally spacing one of the first wavelength of the first light and the second wavelength of the second light from the active region wavelength.

46. The method of claim 35 wherein the second laser includes the first portion of the active region and the second modulator includes the second portion of the active region.

47. The method of claim 46 wherein the active region has an associated active region wavelength, the method including spectrally spacing one of the first wavelength of the first light and the second wavelength of the second light from the active region wavelength.

48. The method of claim 35 wherein the first modulator includes the first portion of the active region and the second modulator includes the second portion of the active regiOn.

49. The method of claim 48 wherein the active region has an associated active region wavelength, the method including spectrally spacing one of the first wavelength and the second wavelength from the active region wavelength.

50. The method of claim 35 wherein the active region is a first active region, the first laser and the first modulator including the first active region, the method including providing a second active region such that the second laser and the second modulator includes the second active region of the semiconductor chip.

51. The method of claim 50 wherein the first active region has an associated first active region wavelength and the second active region has an associated second active region wavelength, the method including spectrally spacing one of the first wavelength of the first light and the second wavelength of the second light from both of the first and second active region wavelengths.

52. The method of claim 35 wherein the active region includes a sub-layer which is an aluminum-containing Group III-V compound.

53. The method of claim 52 wherein the aluminum-containing Group III-V compound contains AlInGaAs, AlInAsN, or AlInGaAsN.

54. The method of claim 35 wherein the active region contains AlInGaAs, InGaAsP, AlInGaAsP, InGaP, InGaAs, InAsP, or InGaAsNSb, or combinations thereof.

* * * * *